(12) United States Patent
Kaba et al.

(10) Patent No.: US 10,192,771 B2
(45) Date of Patent: Jan. 29, 2019

(54) SUBSTRATE HOLDING/ROTATING DEVICE, SUBSTRATE PROCESSING APPARATUS INCLUDING THE SAME, AND SUBSTRATE PROCESSING METHOD

(71) Applicant: SCREEN Holdings Co., Ltd., Kyoto (JP)

(72) Inventors: Hiromichi Kaba, Kyoto (JP); Akihiko Taki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/270,530

(22) Filed: Sep. 20, 2016

(65) Prior Publication Data

US 2017/0092532 A1    Mar. 30, 2017

(30) Foreign Application Priority Data

Sep. 29, 2015 (JP) ................... 2015-192155
Feb. 19, 2016 (JP) ................... 2016-030154

(51) Int. Cl.
*H01L 21/687* (2006.01)
*H01L 21/67* (2006.01)
*B08B 11/02* (2006.01)

(52) U.S. Cl.
CPC ........ *H01L 21/68742* (2013.01); *B08B 11/02* (2013.01); *H01L 21/67028* (2013.01); *H01L 21/67051* (2013.01); *H01L 21/68728* (2013.01)

(58) Field of Classification Search
None
See application file for complete search history.

(56) References Cited

U.S. PATENT DOCUMENTS

| | | | |
|---|---|---|---|
| 2008/0127888 A1* | 6/2008 | Kim ................... | H01L 21/68728 118/52 |
| 2010/0126539 A1 | 5/2010 | Lee et al. ....................... | 134/157 |
| 2010/0206454 A1* | 8/2010 | Maeda .............. | H01L 21/67092 156/60 |
| 2011/0253181 A1 | 10/2011 | Obweger et al. ............. | 134/157 |
| 2011/0304107 A1 | 12/2011 | Obweger et al. ............... | 279/60 |
| 2013/0152971 A1 | 6/2013 | Kato ............................... | 134/21 |
| 2015/0279721 A1 | 10/2015 | Kikumoto et al. | |
| 2016/0096205 A1 | 4/2016 | Kato | |

FOREIGN PATENT DOCUMENTS

| | | |
|---|---|---|
| JP | H09-107023 A | 4/1997 |
| JP | 2009-290038 | 12/2009 |
| JP | 2014-212338 | 11/2014 |
| JP | 2015-002328 | 1/2015 |
| JP | 2015-188008 | 10/2015 |
| JP | 2016-046360 | 4/2016 |
| KR | 10-2008-0023859 A | 3/2008 |

\* cited by examiner

*Primary Examiner* — Michael E Barr
*Assistant Examiner* — Cristi J Tate-Sims
(74) *Attorney, Agent, or Firm* — Ostrolenk Faber LLP

(57) ABSTRACT

A substrate holding/rotating device includes an urging unit, urging support portions of movable pins to either an open position or a hold position, first and second driving magnets, mounted in correspondence to respective movable pins of respective first and second movable pin groups and having mutually opposite magnetic pole directions, a first moving magnet, for urging the support portions of the first movable pin group to the other of either the open position or the hold position, and a second moving magnet, for urging the support portions of the second movable pin group to the other of either the open position or the hold position.

17 Claims, 44 Drawing Sheets

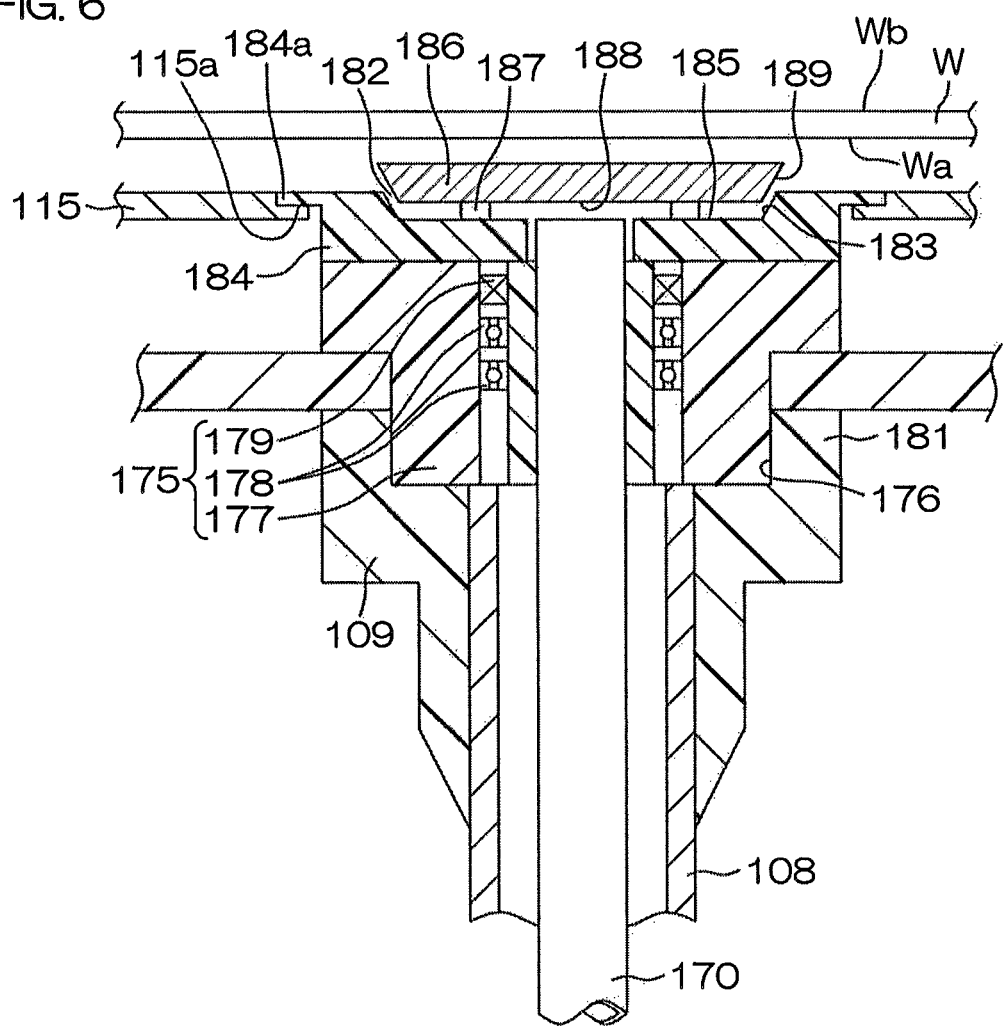

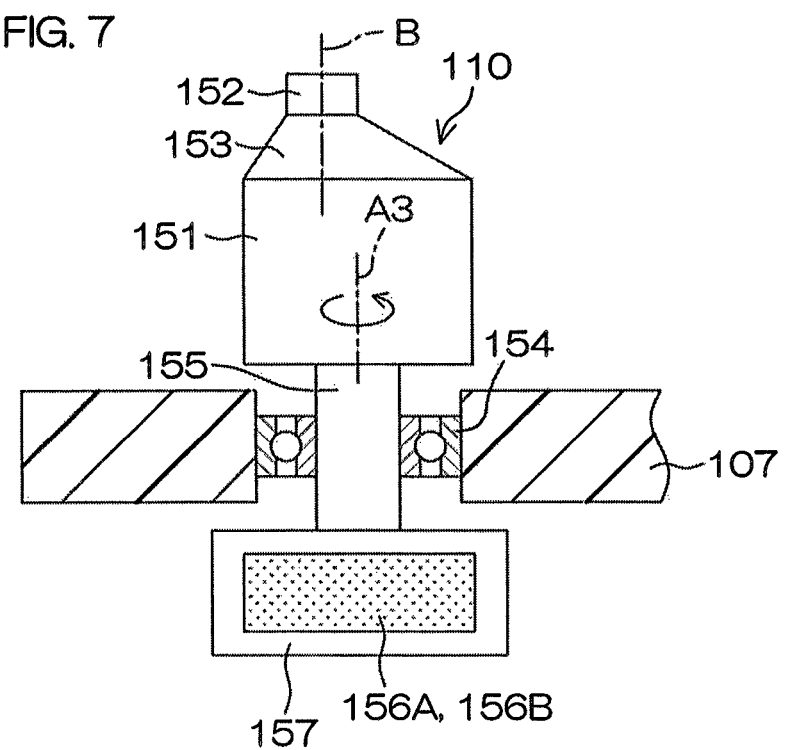

FIG. 8A HOLD POSITION
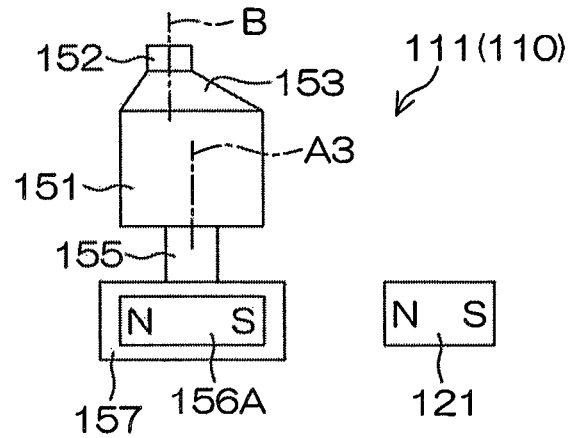
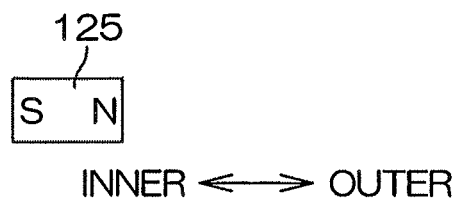
INNER ⟷ OUTER
FIG. 8B OPEN POSITION
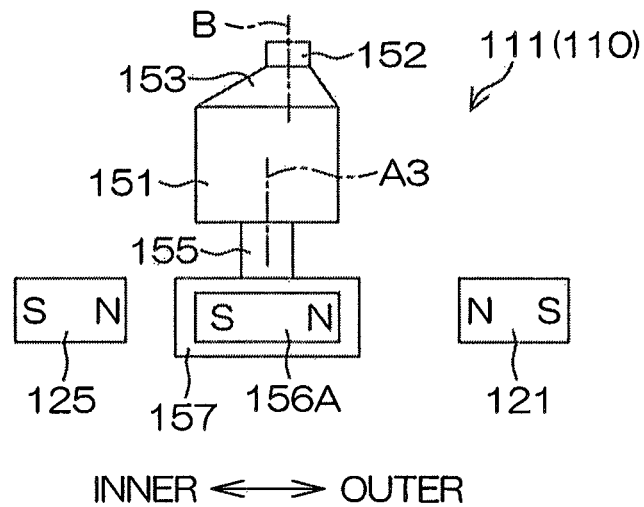
INNER ⟷ OUTER FIG. 9A HOLD POSITION
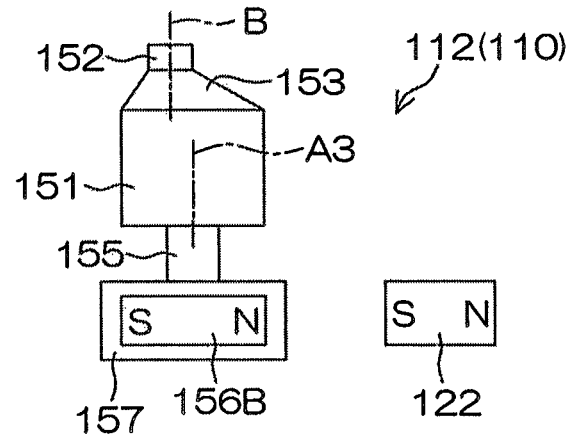
FIG. 9B OPEN POSITION
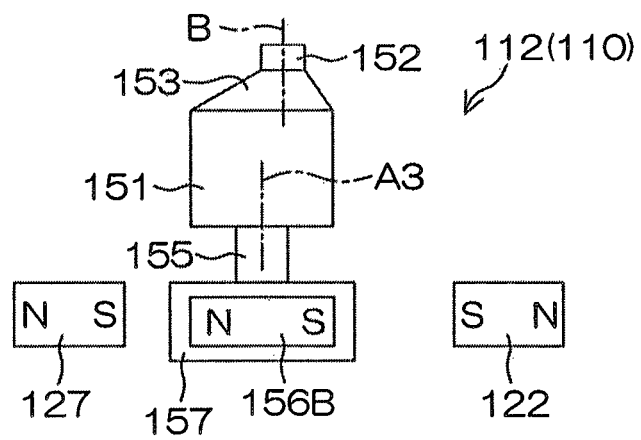

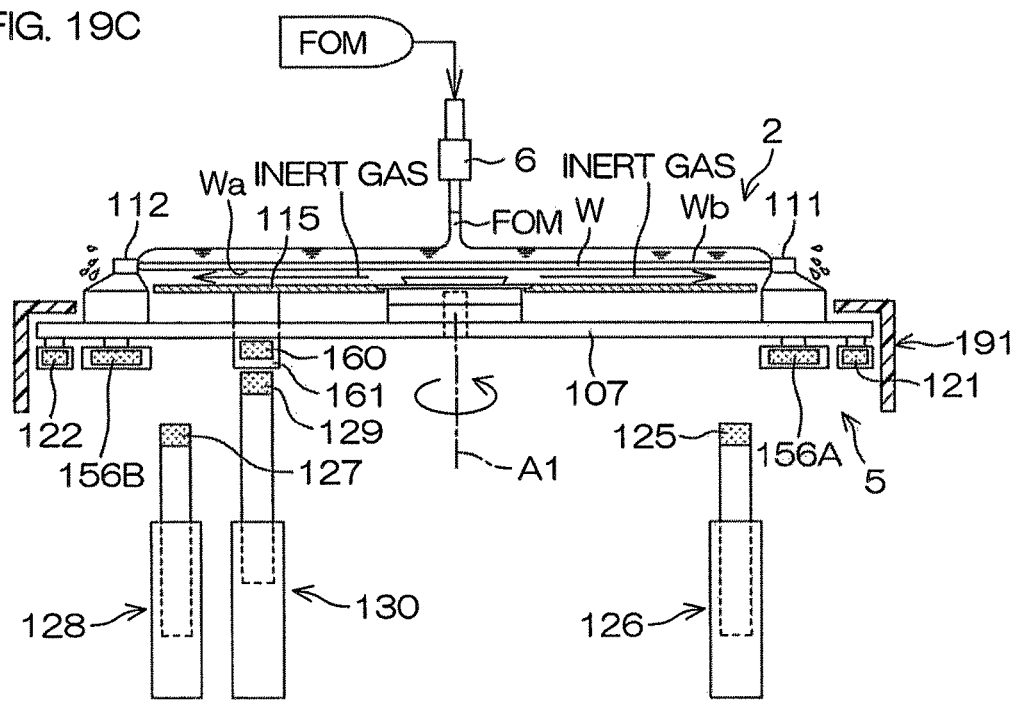
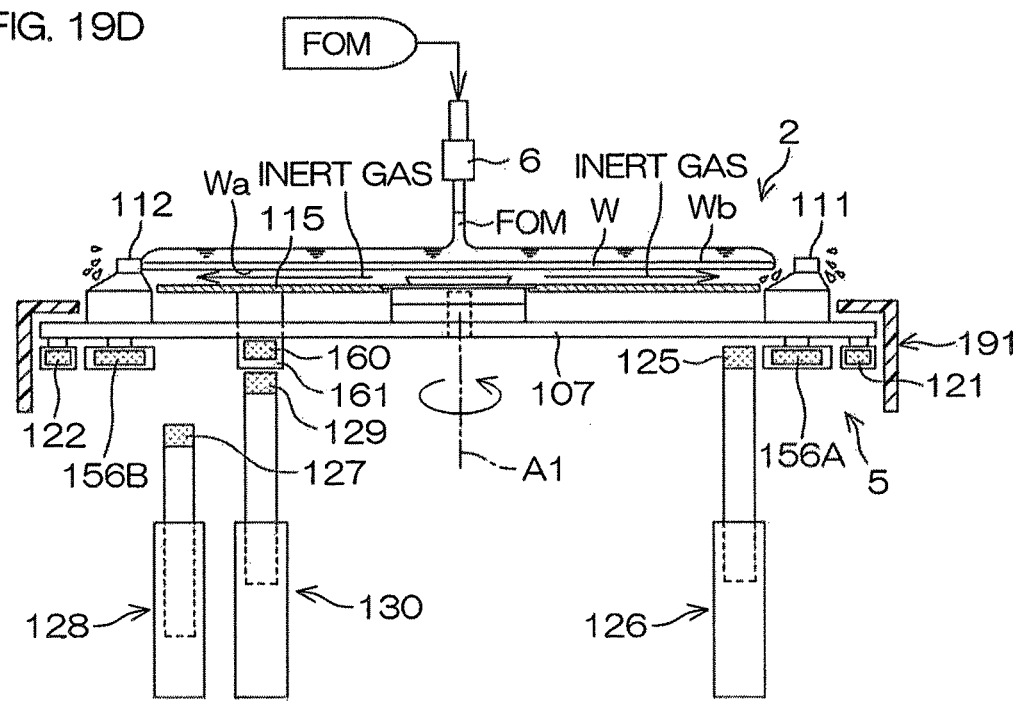

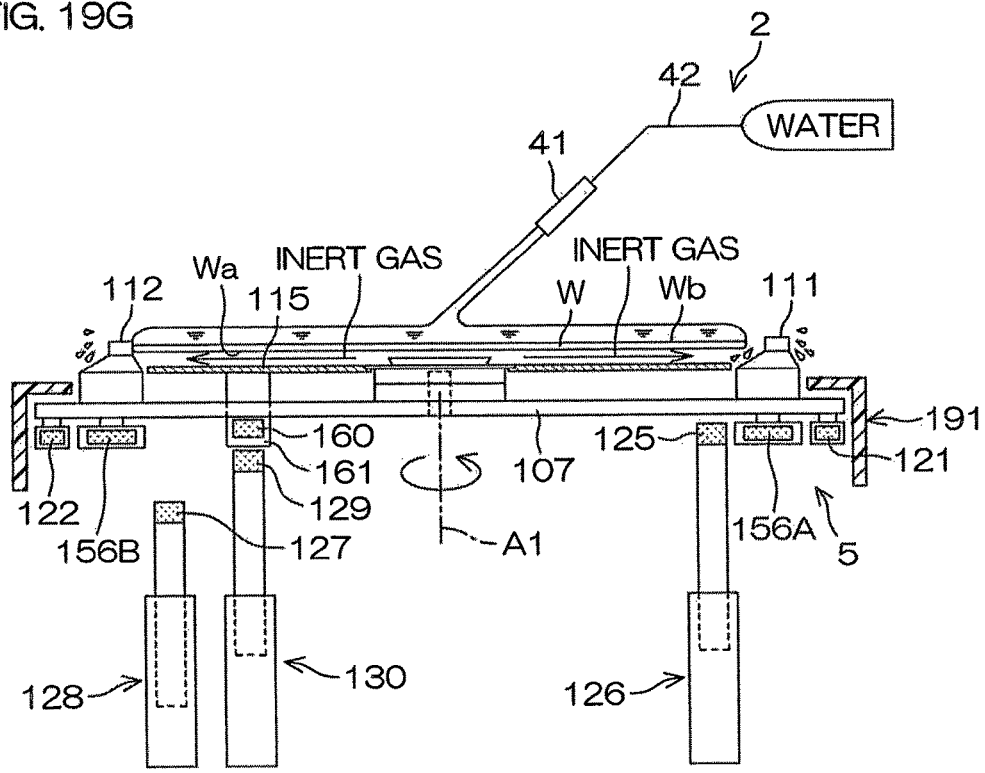

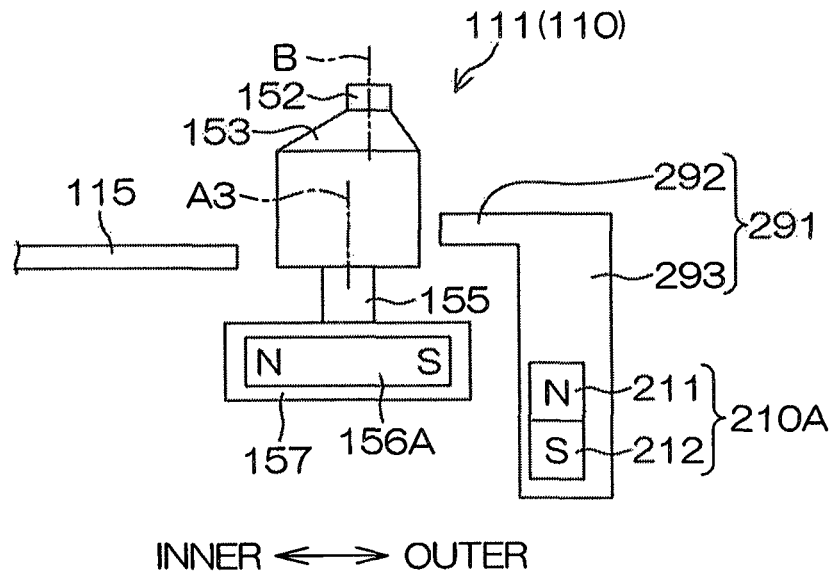
FIG. 24A OPEN POSITION
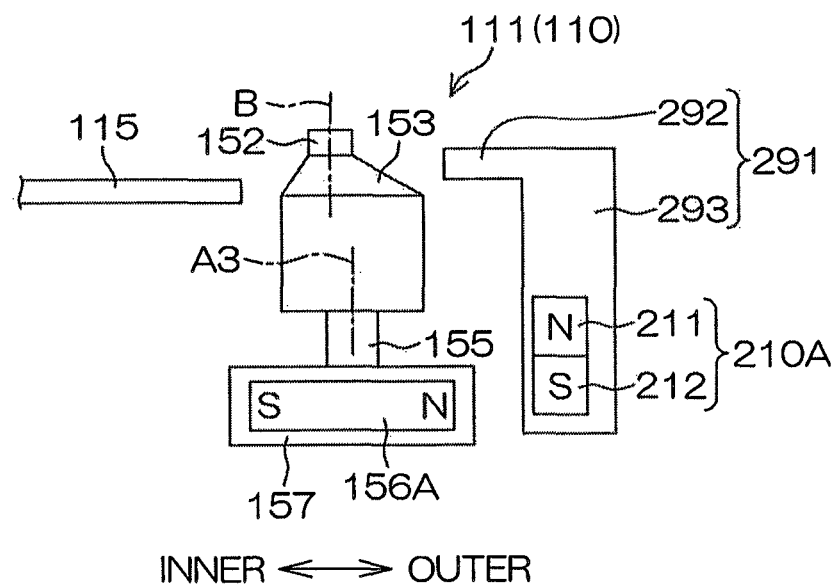
FIG. 24B HOLD POSITION

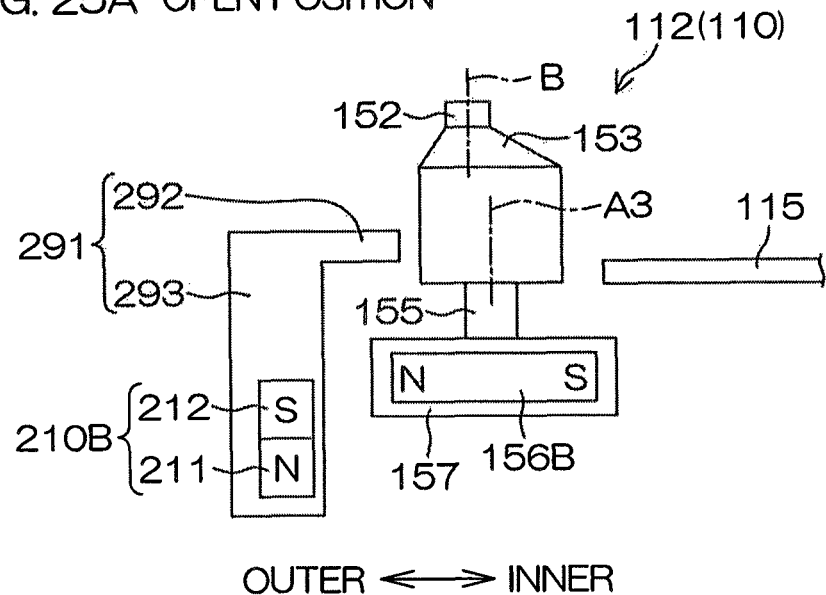
FIG. 25A OPEN POSITION
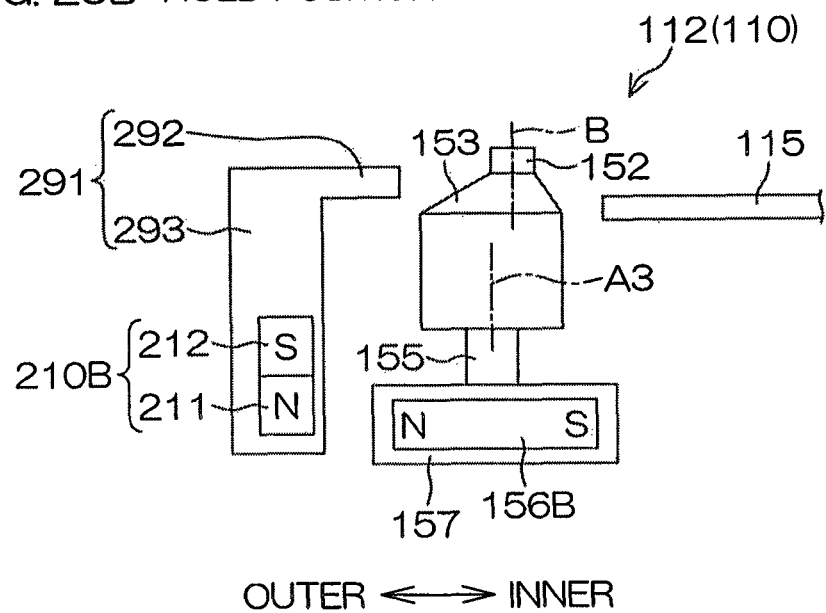
FIG. 25B HOLD POSITION

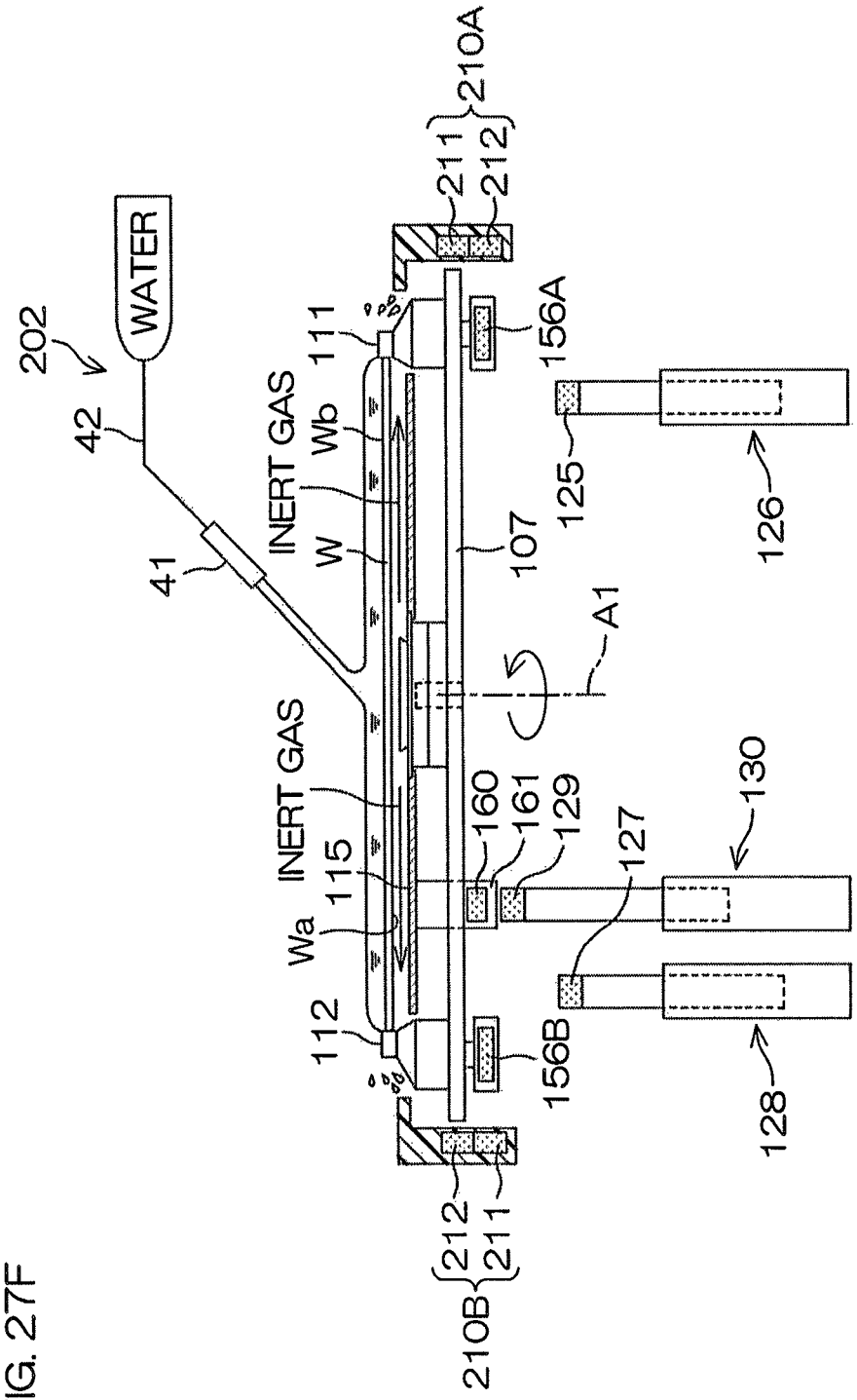

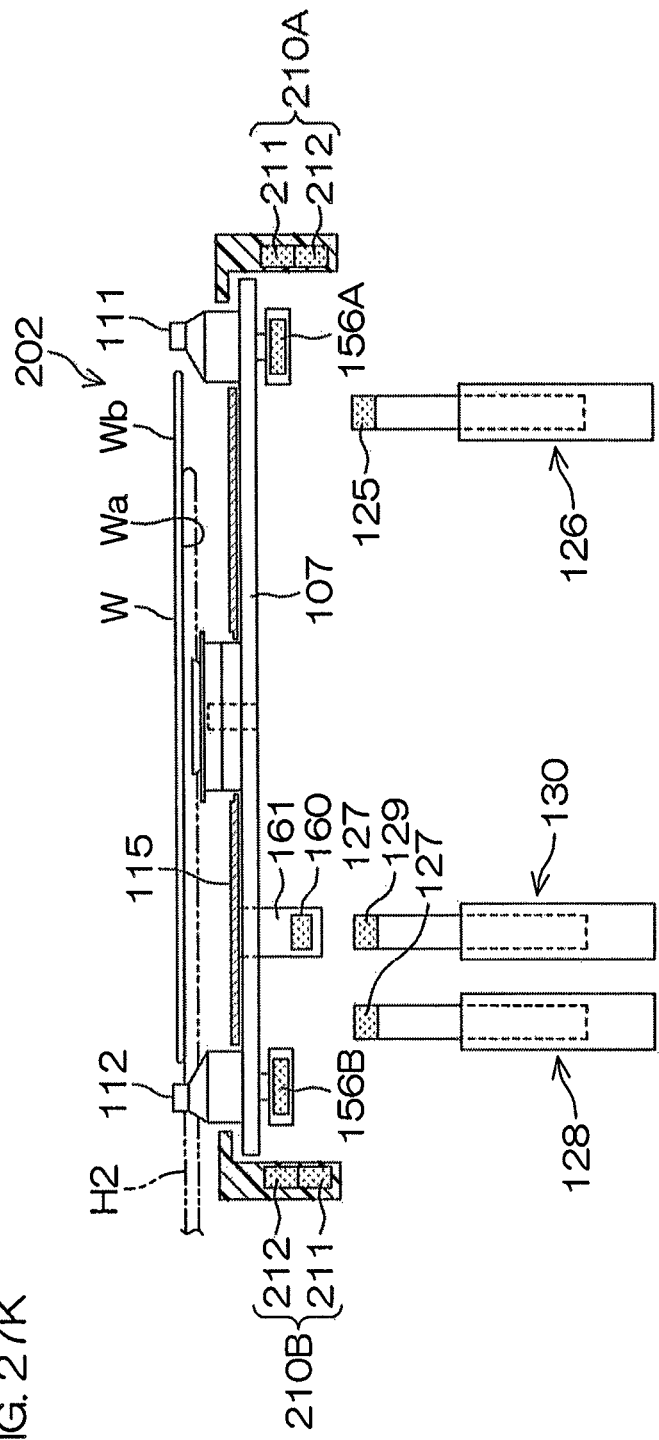

SUBSTRATE HOLDING/ROTATING DEVICE, SUBSTRATE PROCESSING APPARATUS INCLUDING THE SAME, AND SUBSTRATE PROCESSING METHOD

BACKGROUND OF THE INVENTION

1. Field of the Invention

The present invention relates to a substrate holding/rotating device, a substrate processing apparatus including the same, and a substrate processing method. Examples of substrates to be held or substrates to be processed include semiconductor wafers, substrate for liquid crystal display devices, substrate for plasma displays, substrates for FEDs (field emission displays), substrates for optical disks, substrates for magnetic disks, substrates for magnet-optical disks, substrates for photomasks, ceramic substrates, substrates for solar cells.

2. Description of Related Art

US2013/0152971 A1 discloses a rotating type substrate holding/rotating device that includes a rotary table rotatable around a rotational axis aligned with a vertical direction, a rotation driving unit that rotates the rotary table around the rotational axis, and a plurality (for example, four) of holding pins disposed on the rotary table and horizontally positioning a substrate across a prescribed interval from a front surface of the rotary table.

The plurality of holding pins include fixed pins that are immovable with respect to the rotary table and movable pins that are movable with respect to the rotary table. Each movable pin has a contacting portion arranged to be rotatable around a rotational axis coaxial to a central axis of the movable pin and arranged to contact a peripheral end edge of the substrate. By rotation of the contacting portion, the contacting portion is displaced between an open position that is far apart from the rotational axis and a hold position that has approached the rotational axis. A pin driving magnet is coupled to a rotating shaft of the contacting portion.

Switching between opening and closing of the movable pins is performed using an elevated/lowered magnet disposed below the rotary table (magnet switching type). A magnet elevating/lowering unit is coupled to the elevated/lowered magnet. When the elevated/lowered magnet is at a prescribed lower position, the elevated/lowered magnet does not face the pin driving magnets and an external force, which urges the movable pins to the hold position, does not act on the movable pins. Therefore, when the elevated/lowered magnet is at the lower position, the movable pins are held at the open position. On the other hand, when the elevated/lowered magnet is at a prescribed upper position, the movable pins are held at the hold position by a magnetic attractive force between the elevated/lowered magnet and the pin driving magnets.

The substrate holding/rotating device is installed in a single substrate processing type apparatus that processes substrates one at a time and a processing liquid (cleaning chemical liquid) is supplied from a processing liquid nozzle to an upper surface of a substrate being rotated by the holding/rotating device. The processing liquid supplied to the upper surface of the substrate receives a centrifugal force due to rotation of the substrate and flows toward a peripheral edge portion of the substrate. The entirety of the upper surface of substrate and a peripheral end surface of the substrate is thereby liquid-processed. Also, depending on the type of substrate processing, a peripheral edge portion of a lower surface of the substrate may also be desired to be liquid-processed.

SUMMARY OF THE INVENTION

However, with the arrangement described in US2013/0152971 A1, the substrate is contact-supported by the plurality (for example, four) of holding pins throughout the liquid processing and therefore there is a possibility that the processing liquid will not flow around the positions of contact of the holding pins at the plurality of locations along the peripheral end surface of the substrate and uncleaned portions may remain at the peripheral edge portion of the substrate (the peripheral end surface of the substrate and the peripheral edge portion of the lower surface of the substrate). Although the peripheral edge portion of the substrate can be cleaned without any uncleaned portions remaining by changing the contact support positions of the substrate while the substrate is being rotated, to realize such change of contact support positions, just a portion of the holding pins, among the plurality of holding pins provided on the rotary table that is being rotated, must be opened selectively during the processing of the substrate. However, with the magnet switching type substrate holding/rotating device described in Patent Document 1, the elevated/lowered magnet for switching between opening and closing of the movable pins is arranged to be non-rotating and it is therefore not possible to selectively open just a portion of the holding pins among the plurality of holding pins provided on the rotary table that is being rotated. If for instance in Patent Document 1, the elevated/lowered magnet is disposed at the lower position to put both of two movable pins in open states during rotation of the rotary table, the substrate may become disengaged from the rotary table that is in the rotating state.

Therefore an object of the present invention is to provide a magnet switching type substrate holding/rotating device capable of supporting and rotating a substrate satisfactorily and capable of changing positions of contact support of the substrate by movable pins during rotation of the substrate.

Also, another object of the present invention is to provide a substrate processing apparatus and a substrate processing method by which a peripheral edge portion of a substrate can be processed satisfactorily without any unprocessed portions remaining.

The present invention provides a substrate holding/rotating device including a rotary table, a rotation driving unit, rotating the rotary table around a rotational axis aligned with a vertical direction, and a plurality of movable pins, arranged to support the substrate horizontally, with each movable pin having a support portion, arranged to be movable between an open position that is far apart from the rotational axis and a hold position that has approached the rotational axis, and being arranged to rotate around the rotational axis together with the rotary table, and where the plurality of movable pins include a first movable pin group, including at least three movable pins, and a second movable pin group, provided apart from the first movable pin group and including at least three movable pins, and where an urging unit, urging the support portion of each movable pin to one of either of the open position and the hold position, first driving magnets, mounted in correspondence to the respective movable pins of the first movable pin group and having mutually equal magnetic pole directions with respect to a direction orthogonal to an axis aligned with the rotational axis, second driving magnets, mounted in correspondence to the respective movable pins of the second movable pin group and having magnetic pole directions opposite those of the first driving magnets with respect to the direction orthogonal to the axis aligned with the rotational axis, a first moving magnet, arranged in a non-rotating state, having a magnetic pole direction such as to apply a repulsive force or an attractive force in relation to the first driving magnets with respect to the direction orthogonal to the axis aligned with the rotational axis, and, by the repulsive force or the attractive force, urging the support portions of the first movable pin group to the other of either of the open position and the hold position, a second moving magnet, arranged in a non-rotating state, having a magnetic pole direction such as to apply a repulsive force or an attractive force in relation to the second driving magnets with respect to the direction orthogonal to the axis aligned with the rotational axis, and, by the repulsive force or the attractive force, urging the support portions of the second movable pin group to the other of either of the open position and the hold position, a first relative movement unit, making the first moving magnet and the rotary table move relatively between a first position, at which the first moving magnet applies the repulsive force or the attractive force in relation to the first driving magnets, and a second position, at which the first moving magnet does not apply the repulsive force or the attractive force in relation to the first driving magnets, and a second relative movement unit, making the second moving magnet and the rotary table move relatively between a third position, at which the second moving magnet applies the repulsive force or the attractive force in relation to the second driving magnets, and a fourth position, at which the second moving magnet does not apply the repulsive force or the attractive force in relation to the second driving magnets, independently of the relative movement of the first moving magnet and the rotary table, are further included.

With the present arrangement, the rotary table is provided with the plurality of movable pins and each movable pin has the support portion arranged to be movable between the open position and the hold position. The support portion of each movable pin is urged to one of either of the open position and the hold position by the urging unit.

The plurality of movable pins include the first movable pin group and the second movable pin group. The magnetic pole directions of the first driving magnets mounted in correspondence to the first movable pin group are mutually equal with respect to a radial direction of the rotary table, and the magnetic pole directions of the second driving magnets mounted in correspondence to the second movable pin group are opposite the magnetic pole directions of the first driving magnets and are mutually equal with respect to the radial direction of the rotary table.

Also, the first moving magnet, having the magnetic pole direction such as to apply the repulsive force or the attractive force in relation to the first driving magnets, is arranged in the non-rotating state. The relative position of the first moving magnet and the rotary table is moved relatively, by the first relative movement unit, between the first position, at which the first moving magnet applies the repulsive force or the attractive force in relation to the first driving magnets, and the second position, at which the first moving magnet does not apply the repulsive force or the attractive force in relation to the first driving magnets.

Further, the second moving magnet, having the magnetic pole direction such as to apply the repulsive force or the attractive force in relation to the second driving magnets, is arranged in the non-rotating state. The relative position of the second moving magnet and the rotary table is moved relatively, by the second relative movement unit, between the third position, at which the second moving magnet applies the repulsive force or the attractive force in relation to the second driving magnets, and the fourth position, at which the second moving magnet does not apply the repulsive force or the attractive force in relation to the second driving magnets.

By disposing the first moving magnet at the first position and disposing the second moving magnet at the fourth position in a rotating state of the rotary table, the repulsive force or the attractive force from the moving magnet (first moving magnet) is applied to just the first driving magnets that are the driving magnets corresponding to the first movable pin group. By the repulsive force or the attractive force, the support portions of the first movable pin group are urged, against the urging force of the urging unit, to the other of either of the open position and the hold position. In this state, the support portions of the first movable pin group are urged to the other of either of the open position and the hold position, and the support portions of the second movable pin group are urged to the one of either of the open position and the hold position. That is, the substrate is supported by at least three movable pins included in the movable pin group (one of either of the first and second movable pin groups) with which the support portions are urged to the hold position.

On the other hand, by disposing the first moving magnet at the second position and disposing the second moving magnet at the third position in the rotating state of the rotary table, the repulsive force or the attractive force from the moving magnet (second moving magnet) is applied to just the second driving magnets that are the driving magnets corresponding to the second movable pin group. By the repulsive force or the attractive force, the support portions of the second movable pin group are urged, against the urging force of the urging unit, to the other of either of the open position and the hold position. In this state, the support portions of the first movable pin group are urged to the one of either of the open position and the hold position, and the support portions of the second movable pin group are urged to the other of either of the open position and the hold position. That is, the substrate is supported by at least three movable pins included in the movable pin group (the other of either of the first and second movable pin groups) with which the support portions are urged to the hold position.

By thus relatively moving the relative position of the first moving magnet and the rotary table and the relative position of the second moving magnet and the rotary table respectively in the rotating state of the substrate, transition can be performed between a state in which the substrate is supported by the first movable pin group that includes not less than three movable pins and a state in which the substrate is supported by the second movable pin group that includes not less than three movable pins.

By the above, a magnet switching type substrate holding/rotating device can be provided that is capable of supporting and rotating a substrate satisfactorily and capable of changing positions of contact support of the substrate by movable pins during rotation of the substrate.

In the preferred embodiment of the present invention, each of the first and second moving magnets forms, in a state where the first or second moving magnet is at the first or third position and the rotary table is in the rotating state, a magnetic field generation region of circular annular shape, which is coaxial to the rotational axis and through which the respective movable pins, rotating in accordance with the rotation of the rotary table, can pass.

With the present arrangement, each of the magnetic field generation region formed by the first moving magnet and the magnetic field generation region formed by the second moving magnet has a circular annular shape and therefore, in the rotating state of the rotary table, the driving magnets (the first driving magnets and the second driving magnets) corresponding to all movable pins pass through a magnetic field generation region at the same time. Therefore, in a state where the first moving magnet is disposed at the first position, a repulsive force or an attractive force can be applied in relation to the first driving magnets corresponding to all movable pins included in the first movable pin group. Also, in a state where the second moving magnet is disposed at the third position, a repulsive force or an attractive force can be applied in relation to the second driving magnets corresponding to all movable pins included in the second movable pin group.

Also, pluralities of mutually the same number of the first and second moving magnets respectively may be provided and the plurality of first moving magnets and the plurality of second moving magnets may be disposed alternately with respect to a circumferential direction of the rotary table and so as to form a circular annular shape coaxial to the rotational axis as a whole in plan view.

With the present arrangement, the plurality of first moving magnets and the plurality of second moving magnets are disposed alternately with respect to the circumferential direction of the rotary table. Also, the plurality of first moving magnets and the plurality of second moving magnets are disposed to form the circular annular shape coaxial to the rotational axis as a whole. In this case, in regard to each individual type of moving magnet (the first moving magnets or the second moving magnets), the moving magnets are disposed intermittently on a circumference coaxial to the rotational axis and in the circumferential direction of the rotary table. Depending on the rotation speed of the rotary table and/or depending on a circumferential direction length of each moving magnet, the magnetic field generation regions can be arranged to be of circular annular shapes in this case as well.

The first movable pin group may include movable pins of the same number as the second movable pin group, the first and second movable pin groups may, with respect to the circumferential direction of the rotary table, be disposed alternately and so that the plurality of movable pins included in each movable pin group are disposed at equal intervals, and the first and second moving magnets may respectively be disposed to be of the same number as the number of the movable pins included in the respective movable pin groups and at equal intervals in the circumferential direction of the rotary table.

With the present arrangement, the first and second movable pin groups are disposed alternately with respect to the circumferential direction of the rotary table and the plurality of movable pins included in each movable pin group are arranged at equal intervals, and therefore in each of the state in which the substrate is supported by the first movable pin group of not less than three movable pins and the state in which the substrate is supported by the second movable pin group of not less than three movable pins, the substrate can be supported satisfactorily by each movable pin group.

Also, the first and second moving magnets are respectively disposed to be of the same number as the number of the movable pins included in the respective movable pin groups and at equal intervals in the circumferential direction of the rotary table, and therefore the first and second moving magnets can respectively apply a repulsive force or an attractive force in relation to the driving magnets corresponding to the first and second movable pin groups even in the non-rotating state of the rotary table.

The first moving magnet and the second moving magnet may be disposed in a double circular annular shape in plan view that is coaxial to the rotational axis.

With the present arrangement, the magnetic field generation regions can be arranged to be of annular shapes reliably in the rotating state of the rotary table because the first moving magnet of circular annular shape and the second moving magnet of circular annular shape are used.

Also, the urging unit may further include a first urging magnet, arranged to urge the support portions of the first movable pin group to the one of either of the open position and the hold position by applying a repulsive force or an attractive force in relation to the first driving magnet, and a second urging magnet, arranged to urge the support portions of the second movable pin group to the one of either of the open position and the hold position by applying a repulsive force or an attractive force in relation to the second driving magnet.

With the present arrangement, the support portions of the respective movable pins are urged to one of either of the open position and the hold position by the first urging magnet and the second urging magnet. An arrangement that urges the support portions of the respective movable pins to one of either of the open position and the hold position can thereby be realized easily.

The first and second urging magnets may be arranged to be incapable of relative movement with respect to the rotary table.

With the present arrangement, the support portions of the respective movable pins can be urged constantly to one of either of the open position and the hold position.

A protective disk, which is disposed between the rotary table and a position of substrate holding by the plurality of movable pins, is capable of relative up/down movement with respect to the rotary table between a lower position and an approach position approaching a lower surface of the substrate held higher than the lower position by the holding member, and is mounted to the rotary table so as to rotate around the rotational axis together with the rotary table, may further be included, and the first and second urging magnets may be arranged to be capable of up/down movement together with the protective disk.

With the present arrangement, the first and second urging magnets can be moved up and down by moving the protective disk up and down. The first and second urging magnets thus do not have to be arranged separately in addition to an elevating/lowering unit arranged to move the protective disk up and down and simplification of device arrangement and cost reduction can thereby be achieved.

The one of either of the open position and the hold position may be the hold position and the other of either of the open position and the hold position may be the open position.

With the present arrangement, the support portions of the respective movable pins are urged to the hold position by the urging unit. By disposing the first moving magnet at the first position and disposing the second moving magnet at the fourth position in the rotating state of the rotary table, the repulsive force or the attractive force from the moving magnet (first moving magnet) is applied just to the first driving magnets that are the driving magnets corresponding to the first movable pin group. By the repulsive force or the attractive force, the support portions of the first movable pin group are urged to the open position against the urging force due to the urging unit. In this state, the support portions of the first movable pin group are urged to the open position and the support portions of the second movable pin group are urged to the hold position. That is, the substrate is supported by at least three movable pins included in the second movable pin group.

On the other hand, by disposing the first moving magnet at the second position and disposing the second moving magnet at the third position in the rotating state of the rotary table, the repulsive force or the attractive force from the moving magnet (second moving magnet) is applied just to the second driving magnets that are the driving magnets corresponding to the second movable pin group. By the repulsive force or the attractive force, the support portions of the second movable pin group are urged to the open position against the urging force due to the urging unit. In this state, the support portions of the first movable pin group are urged to the hold position and the support portions of the second movable pin group are urged to the open position. That is, the substrate is supported by at least three movable pins included in the first movable pin group.

A protective disk, which is disposed between the rotary table and a position of substrate holding by the plurality of movable pins, is capable of relative up/down movement with respect to the rotary table between a lower position and an approach position approaching a lower surface of the substrate held higher than the lower position by the holding member, and is mounted to the rotary table so as to rotate around the rotational axis together with the rotary table, a first levitating magnet, mounted to the protective disk, a second levitating magnet, arranged in a non-rotating state and applying a repulsive force to the first levitating magnet, and a third relative movement unit, which makes the second levitating magnet and the rotary table move relatively to change a distance between the first levitating magnet and the second levitating magnet independently of each of the relative movement of the first moving magnet and the rotary table and the relative movement of the second moving magnet and the rotary table, may further be provided.

With the present arrangement, the relative movement of the second levitating magnet and the rotary table is performed independently of each of the relative movement of the first moving magnet and the rotary table and the relative movement of the second moving magnet and the rotary table. A first moving magnet and rotary table relative movement operation and a second moving magnet and rotary table relative movement operation can thereby be performed regardless of an up/down position of the protective disk.

The present invention provides a substrate processing apparatus including the substrate holding/rotating device and a processing liquid supplying unit supplying a processing liquid to a major surface of a substrate held by the substrate holding/rotating device.

With the present arrangement, the processing liquid is supplied from the processing liquid supplying unit to a major surface of the substrate. The processing liquid supplied to the major surface of the substrate receives a centrifugal force due to rotation of the substrate and flows toward a peripheral edge portion of the substrate. The peripheral edge portion of the substrate is thereby liquid-processed by the processing liquid. With the present invention, it is possible to change positions of contact support of the substrate by the movable pins during rotation of the substrate. The peripheral edge portion of the substrate can thus be processed satisfactorily without any unprocessed portions remaining.

The preferred embodiment of the present invention further includes a controller controlling the rotation driving unit, the processing liquid supplying unit, the first relative movement unit, and the second relative movement unit. In this case, the controller may execute a rotary table rotating step of making the rotary table rotate around the rotational axis, a processing liquid supplying step of supplying the processing liquid to the substrate rotating in accordance with the rotation of the rotary table, a first magnet disposing step of disposing the relative position of the first moving magnet and the rotary table at the first position and disposing the relative position of the second moving magnet and the rotary table at the fourth position in parallel to the rotary table rotating step and the processing liquid supplying step, and a second magnet disposing step of disposing the relative position of the second moving magnet and the rotary table at the third position and disposing the relative position of the first moving magnet and the rotary table at the second position during non-execution of the first magnet disposing step in parallel to the rotary table rotating step and the processing liquid supplying step.

With the present arrangement, the processing liquid is supplied to the major surface of the substrate in the rotating state. The processing liquid supplied to the major surface of the substrate receives the centrifugal force due to rotation of the substrate and flows toward the peripheral edge portion of the substrate. The peripheral edge portion of the substrate is thereby liquid-processed by the processing liquid.

Also, in parallel to the rotation of the rotary table and the supplying of the processing liquid, the relative position of the first moving magnet and the rotary table is disposed at the first position and the relative position of the second moving magnet and the rotary table is disposed at the fourth position (first magnet disposing step). The substrate is thereby supported by at least three movable pins included in the movable pin group (one of either of the first and second movable pin groups) with which the support portions are urged to the hold position.

Further, in parallel to the rotation of the rotary table and the supplying of the processing liquid, the relative position of the first moving magnet and the rotary table is disposed at the second position and the relative position of the second moving magnet and the rotary table is disposed at the third position (second magnet disposing step). The substrate is thereby supported by at least three movable pins included in the movable pin group (the other of either of the first and second movable pin groups) with which the support portions are urged to the hold position.

It is therefore possible to change the positions of contact support of the substrate by the movable pins in the processing liquid supplying step of supplying the processing liquid to the major surface of the substrate while rotating the substrate. The processing liquid can thus be supplied to an entirety of the peripheral edge portion of the substrate and the peripheral edge portion of the substrate can thereby be processed satisfactorily without any unprocessed portions remaining.

The present invention provides a substrate processing method executed in a substrate processing apparatus, including a substrate holding/rotating device, including a rotary table, a rotation driving unit, rotating the rotary table around a rotational axis aligned with a vertical direction, and a plurality of movable pins, arranged to support the substrate horizontally, with each movable pin having a support portion, arranged to be movable between an open position that is far apart from the rotational axis and a hold position that has approached the rotational axis, and being arranged to rotate around the rotational axis together with the rotary table, and where the plurality of movable pins include a first movable pin group, including at least three movable pins, and a second movable pin group, provided apart from the first movable pin group and including at least three movable pins, and where an urging unit, urging the support portion of each movable pin to one of either of the open position and the hold position, first driving magnets, mounted in correspondence to the respective movable pins of the first movable pin group and having mutually equal magnetic pole directions with respect to a direction orthogonal to an axis aligned with the rotational axis, second driving magnets, mounted in correspondence to the respective movable pins of the second movable pin group and having magnetic pole directions opposite those of the first driving magnets with respect to the direction orthogonal to the axis aligned with the rotational axis, a first moving magnet, arranged in a non-rotating state, having a magnetic pole direction such as to apply a repulsive force or an attractive force in relation to the first driving magnets with respect to the direction orthogonal to the axis aligned with the rotational axis, and, by the repulsive force or the attractive force, urging the support portions of the first movable pin group to the other of either of the open position and the hold position, a second moving magnet, arranged in a non-rotating state, having a magnetic pole direction such as to apply a repulsive force or an attractive force in relation to the second driving magnets with respect to the direction orthogonal to the axis aligned with the rotational axis, and, by the repulsive force or the attractive force, urging the support portions of the second movable pin group to the other of either of the open position and the hold position, a first relative movement unit, making the first moving magnet and the rotary table move relatively between a first position, at which the first moving magnet applies the repulsive force or the attractive force in relation to the first driving magnets, and a second position, at which the first moving magnet does not apply the repulsive force or the attractive force in relation to the first driving magnets, and a second relative movement unit, making the second moving magnet and the rotary table move relatively between a third position, at which the second moving magnet applies the repulsive force or the attractive force in relation to the second driving magnets, and a fourth position, at which the second moving magnet does not apply the repulsive force or the attractive force in relation to the second driving magnets, independently of the relative movement of the first moving magnet and the rotary table, are further included, and a processing liquid supplying unit supplying a processing liquid to the substrate held by the substrate holding/rotating device, and being a substrate processing method controller includes a rotary table rotating step of making the rotary table rotate around the rotational axis, a processing liquid supplying step of supplying the processing liquid to the substrate rotating in accordance with the rotation of the rotary table, a first magnet disposing step of disposing the relative position of the first moving magnet and the rotary table at the first position and disposing the relative position of the second moving magnet and the rotary table at the fourth position in parallel to the rotary table rotating step and the processing liquid supplying step, and a second magnet disposing step of disposing the relative position of the second moving magnet and the rotary table at the third position and disposing the relative position of the first moving magnet and the rotary table at the second position during non-execution of the first magnet disposing step in parallel to the rotary table rotating step and the processing liquid supplying step.

With the present method, the processing liquid is supplied to a major surface of the substrate in the rotating state. The processing liquid supplied to the major surface of the substrate receives a centrifugal force due to rotation of the substrate and flows toward a peripheral edge portion of the substrate. The peripheral edge portion of the substrate is thereby liquid-processed by the processing liquid.

Also, in parallel to the rotation of the rotary table and the supplying of the processing liquid, the relative position of the first moving magnet and the rotary table is disposed at the first position and the relative position of the second moving magnet and the rotary table is disposed at the fourth position (first magnet disposing step). The substrate is thereby supported by at least three movable pins included in the movable pin group (one of either of the first and second movable pin groups) with which the support portions are urged to the hold position.

Further, in parallel to the rotation of the rotary table and the supplying of the processing liquid, the relative position of the first moving magnet and the rotary table is disposed at the second position and the relative position of the second moving magnet and the rotary table is disposed at the third position (second magnet disposing step). The substrate is thereby supported by at least three movable pins included in the movable pin group (the other of either of the first and second movable pin groups) with which the support portions are urged to the hold position.

Positions of contact support of the substrate by the movable pins can therefore be changed in the processing liquid supplying step of supplying the processing liquid to the major surface of the substrate while rotating the substrate. The processing liquid can thus be supplied to an entirety of the peripheral edge portion of the substrate and the peripheral edge portion of the substrate can thereby be processed satisfactorily without any unprocessed portions remaining.

The aforementioned or other objects, features, and effects of the present invention will be clarified by the following description of preferred embodiments with reference to the accompanying drawings.

BRIEF DESCRIPTION OF THE DRAWINGS

FIG. 6 is an enlarged sectional view showing a portion of the arrangement of FIG. 5 in enlarged manner.

FIG. 7 is an enlarged sectional view of the arrangement in a vicinity of a movable pin included in the spin chuck.

FIGS. 8A and 8B are schematic views of states of a movable pin, included in a first movable pin group, in accordance with elevating/lowering operations of a first opening permanent magnet.

FIGS. 9A and 9B are schematic views of states of a movable pin, included in a second movable pin group, in accordance with elevating/lowering operations of a second opening permanent magnet.

FIGS. 24A and 24B are schematic views of states of a movable pin, included in the first movable pin group, in accordance with elevating/lowering operations of a protective disk.

FIGS. 25A and 25B are schematic views of states of a movable pin, included in the second movable pin group, in accordance with the elevating/lowering operations of the protective disk.

FIGS. 27A to 27K are illustrative diagrams for describing the example of the processing liquid processing executed by the substrate processing apparatus.

DETAILED DESCRIPTION OF PREFERRED EMBODIMENTS

Figure 1:
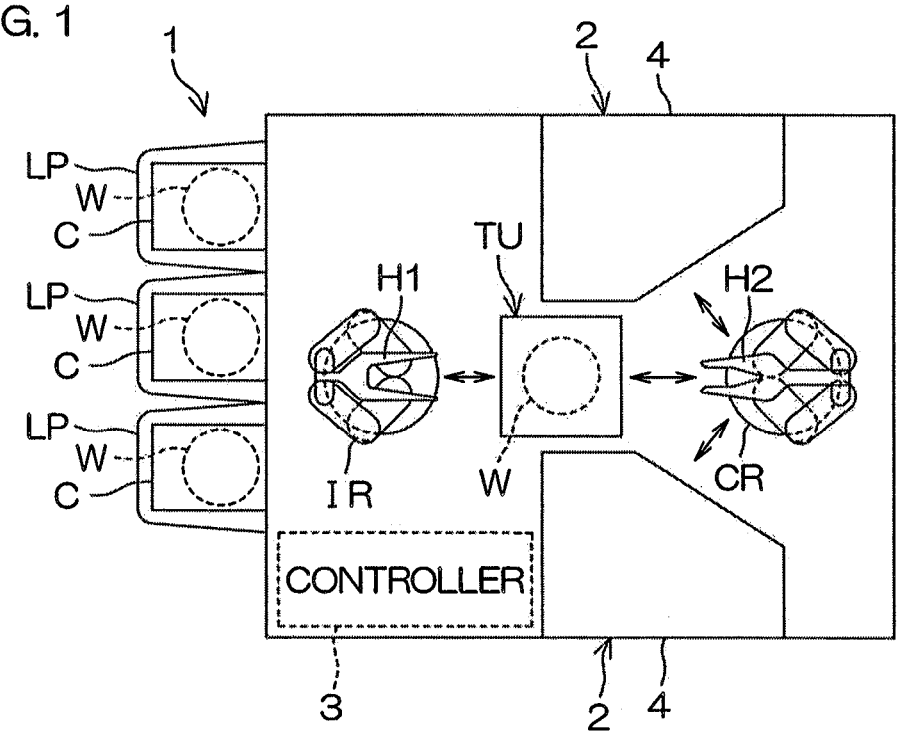
FIG. 1 is an illustrative plan view for describing a layout of an interior of a substrate processing apparatus according to a first preferred embodiment of the present invention.

FIG. 1 is an illustrative plan view for describing a layout of an interior of a substrate processing apparatus 1 according to a first preferred embodiment of the present invention.

The substrate processing apparatus 1 is a single substrate processing type apparatus that processes disk-shaped substrates W, constituted of semiconductor wafers (semiconductor substrates), one at a time by a processing liquid or a processing gas. The substrate processing apparatus 1 includes load ports LP that hold a plurality of carriers C, a turnover unit TU that performs up/down turnover of the orientation of the substrate W, and a plurality of processing units 2 that process the substrates W. The load ports LP and the processing units 2 are disposed across an interval in a horizontal direction. The turnover unit TU is disposed on a transfer path of the substrates W that are transferred between the load ports LP and the processing units 2.

As shown in FIG. 1, the substrate processing apparatus 1 further includes an indexer robot IR disposed between the load ports LP and the turnover unit TU, a center robot CR disposed between the turnover unit TU and the processing units 2, and a controller 3 controlling operations of devices and opening/closing of valves included in the substrate processing apparatus 1. The indexer robot IR transfers a plurality of substrates W one by one from the carriers C held by the load ports LP to the turnover unit TU and transfers a plurality of substrates W one by one from the turnover unit TU to the carriers C held by the load ports LP. Similarly, the center robot CR transfers a plurality of substrates W one by one from the turnover unit TU to the processing units 2 and transfers a plurality of substrates W one by one from the processing units 2 to the turnover unit TU. The center robot CR further transfers substrates W among a plurality of processing units 2.

The indexer robot IR includes a hand H1 that holds a substrate W horizontally. The indexer robot IR moves the hand H1 horizontally. Further, the indexer robot IR elevates and lowers the hand H1 and rotates the hand H1 around a vertical axis. Similarly, the center robot CR includes a hand H2 that holds a substrate W horizontally. The center robot CR moves the hand H2 horizontally. Further, the center robot CR elevates and lowers the hand H2 and rotates the hand H2 around a vertical axis.

A substrate W is housed in a carrier C in a state where a front surface Wa of the substrate W that is a device forming surface is faced upward (upward facing orientation). The controller 3 makes the substrate W be transferred by the indexer robot IR in the state where the front surface Wa (see FIG. 2, etc.) is faced upward from the carrier C to the turnover unit TU. The controller 3 then makes the substrate W be turned over by the turnover unit TU. A rear surface Wb (see FIG. 2, etc.) of the substrate W is thereby faced upward. Thereafter, the controller 3 makes the substrate W be transferred by the center robot CR in the state where the rear surface Wb is faced upward from the turnover unit TU to a processing unit 2. The controller 3 then makes the rear surface Wb of the substrate W be processed by the processing unit 2.

After the rear surface Wb of the substrate W has been processed, the controller 3 makes the substrate W be transferred by the center robot CR in the state where the rear surface Wb is faced upward from the processing unit 2 to the turnover unit TU. The controller 3 then makes the substrate W be turned over by the turnover unit TU. The front surface Wa of the substrate W is thereby faced upward. Thereafter, the controller 3 makes the substrate W be transferred by the indexer robot IR in the state where the front surface Wa is faced upward from the turnover unit TU to a carrier C. The processed substrate W is thereby housed in the carrier C. The controller 3 makes the indexer robot IR, etc., execute this series of operations repeatedly to make a plurality of substrates W be processed one by one.

Figure 2:
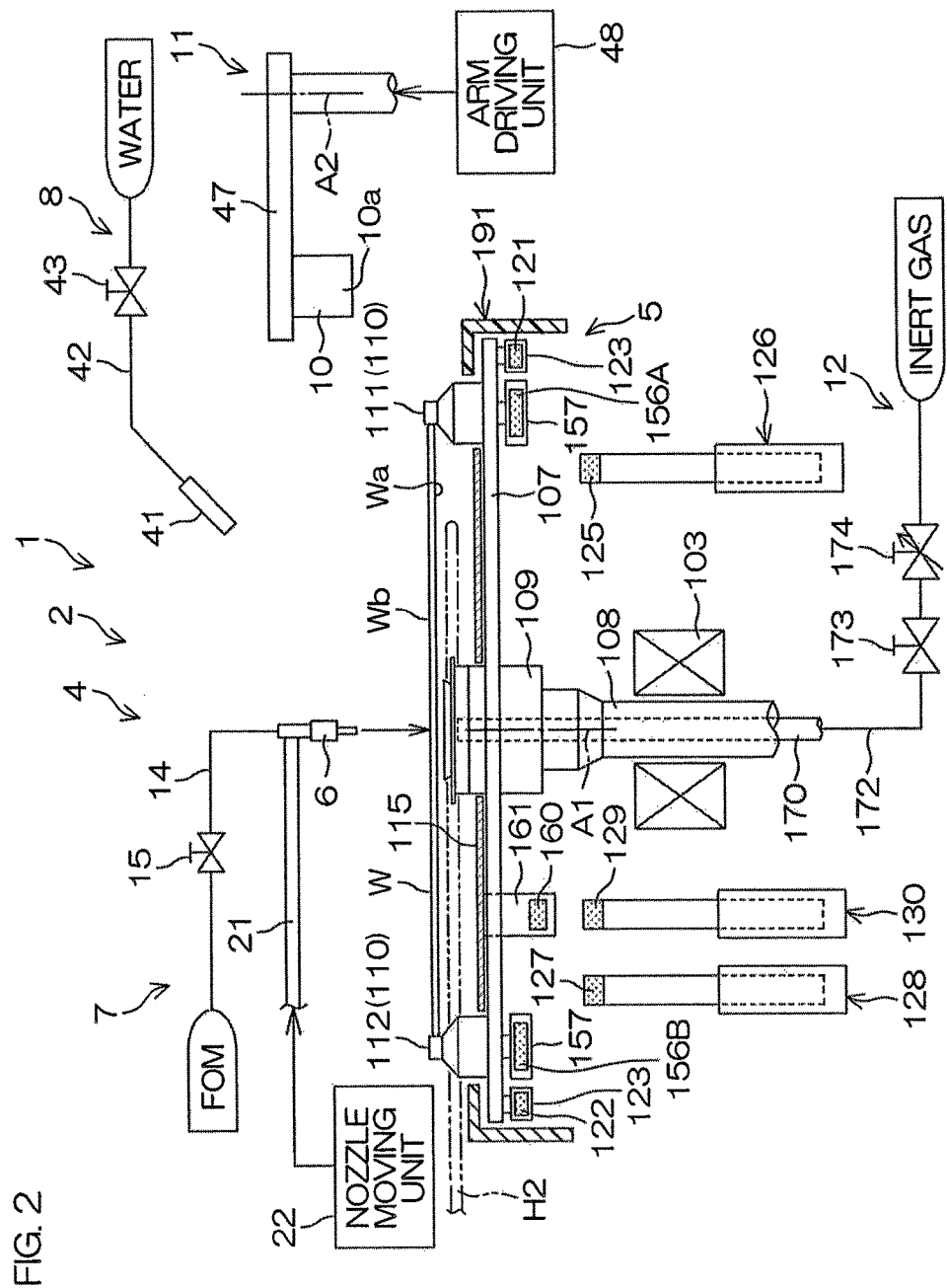
FIG. 2 is an illustrative sectional view for describing an arrangement example of a processing unit included in the substrate processing apparatus.
Figure 3:
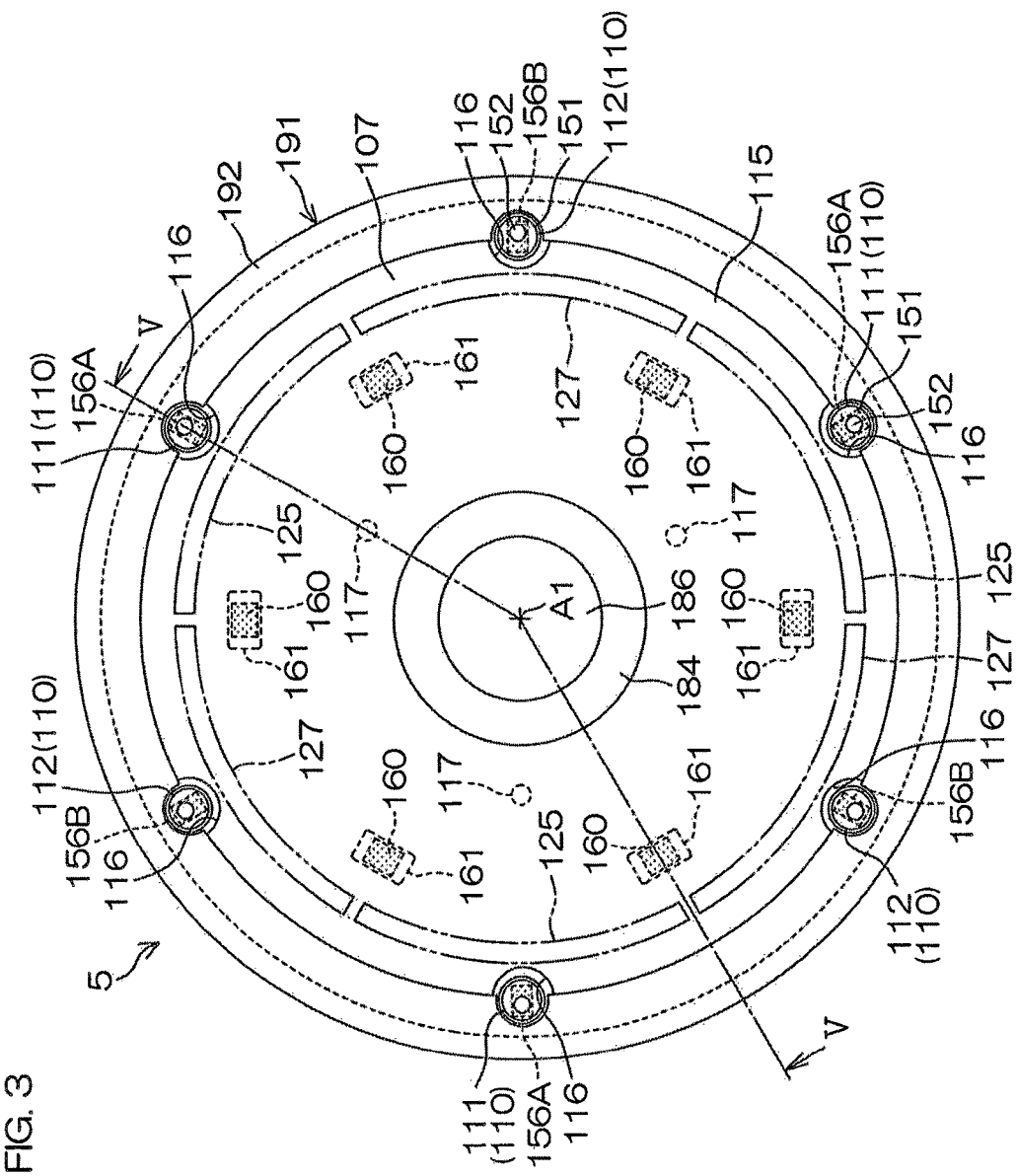
FIG. 3 is a plan view for describing a more specific arrangement of a spin chuck included in the substrate processing apparatus.
Figure 4:
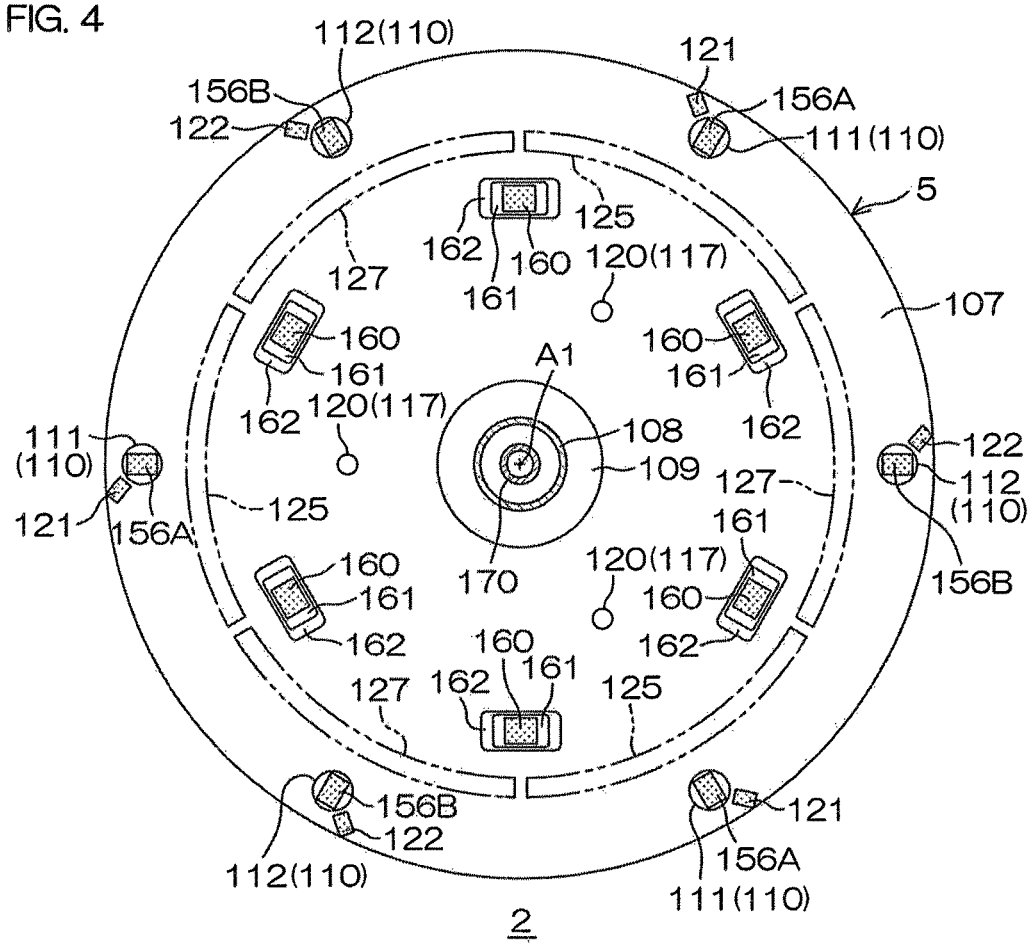
FIG. 4 is a bottom view of the arrangement of FIG. 3.
Figure 5:
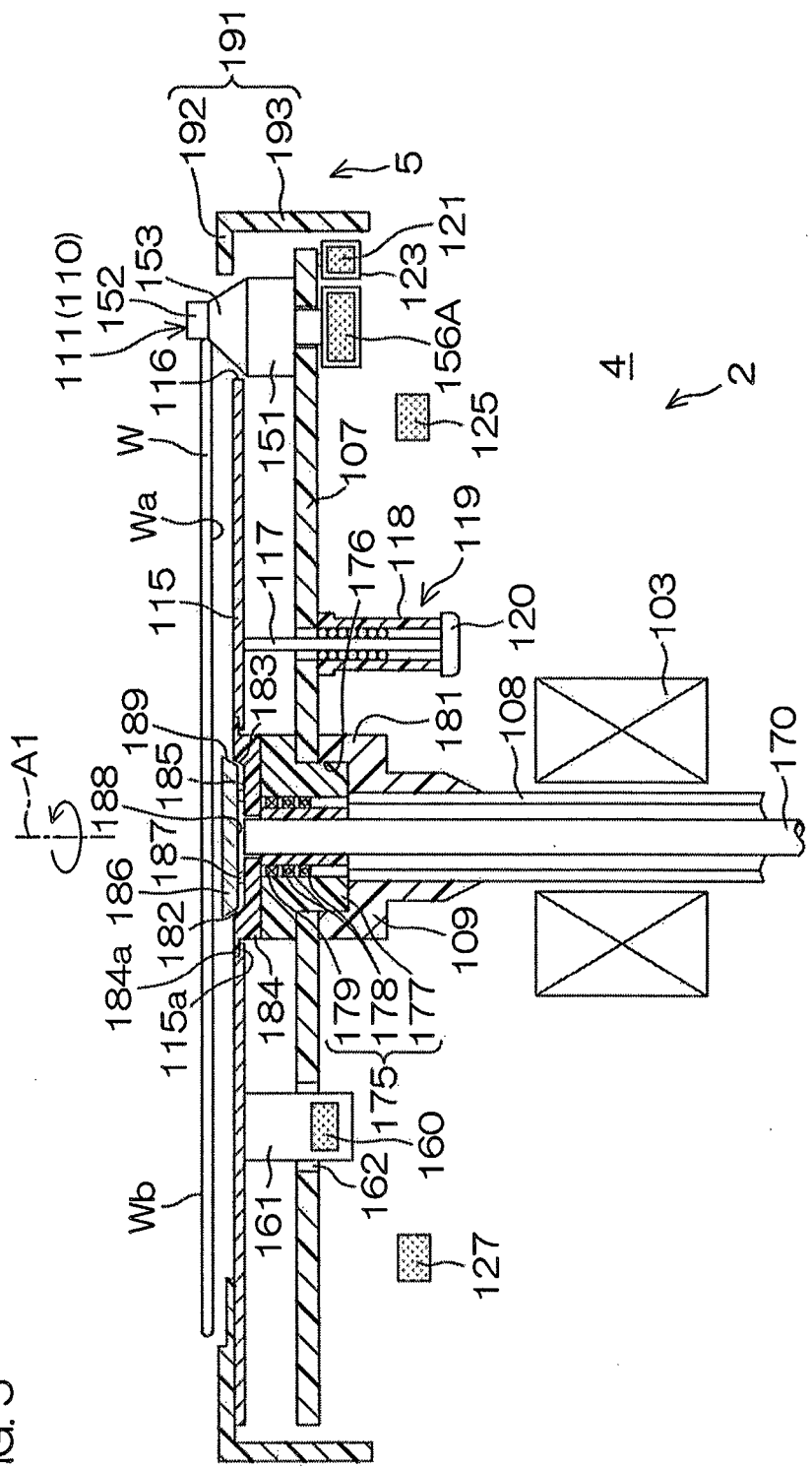
FIG. 5 is a sectional view taken along section line V-V of FIG. 3.

FIG. 2 is an illustrative sectional view for describing an arrangement example of a processing unit 2 included in the substrate processing apparatus 1. FIG. 3 is a plan view for describing a more specific arrangement of a spin chuck 5 included in the substrate processing apparatus 1. FIG. 4 is a bottom view of the arrangement of FIG. 3. FIG. 5 is a sectional view taken along section line V-V of FIG. 3. FIG. 6 is an enlarged sectional view showing a portion of the arrangement of FIG. 5 in enlarged manner. FIG. 7 is an enlarged sectional view of the arrangement in a vicinity of a movable pin 110 included in the spin chuck 5.

As shown in FIG. 2, each processing unit 2 includes a box-shaped processing chamber 4 having an internal space, a spin chuck (substrate holding/rotating device) 5 holding a single substrate W in a horizontal orientation inside the processing chamber 4 and rotating the substrate W around a vertical rotational axis A1 passing through a center of the substrate W, a chemical liquid supplying unit (processing liquid supplying unit) 7 arranged to supply an ozone-containing hydrofluoric acid solution (hereinafter referred to as "FOM") as an example of a chemical liquid (processing liquid) toward an upper surface (rear surface (one major surface) Wb) of the substrate W held by the spin chuck 5, a water supplying unit (processing liquid supplying unit) 8 arranged to supply water as a rinse liquid (processing liquid) to the upper surface of the substrate W held by the spin chuck 5, a cleaning brush 10 arranged to contact the upper surface of the substrate W and scrub clean the upper surface, a cleaning brush driving unit 11 arranged to drive the cleaning brush 10, a protective gas supplying unit 12 arranged to supply an inert gas as a protective gas to a lower surface (front surface (other major surface) Wa) of the substrate W held by the spin chuck 5, and a cylindrical processing cup (not shown) surrounding the spin chuck 5.

As shown in FIG. 2, the processing chamber 4 includes a box-shaped partition wall (not shown), an FFU (fan filter unit, not shown) as a blower unit delivering clean air from an upper portion of the partition wall into an interior of the partition wall (corresponding to an interior of the processing chamber 4), and an exhaust device (not shown) expelling gas inside the processing chamber 4 from a lower portion of the partition wall. A down flow (downward flow) is formed inside the processing chamber 4 by the FFU and the exhaust device.

As shown in FIG. 2, the spin chuck 5 includes a rotary table 107 rotatable around a rotational axis A1 aligned with a vertical direction. A rotational shaft 108 is coupled via a boss 109 to a lower surface of a rotation center of the rotary table 107. The rotational shaft 108 is a hollow shaft, extends along the vertical direction, and is arranged to receive a driving force from a rotation driving unit 103 to rotate around the rotational axis A1. The rotation driving unit 103 may, for example, be an electric motor having the rotational shaft 108 as a drive shaft.

As shown in FIG. 2, the spin chuck 5 further includes a plurality (six, in the present preferred embodiment) of movable pins 110 that are provided across substantially equal intervals along a circumferential direction at a peripheral edge portion of an upper surface of the rotary table 107. The respective movable pins 110 are arranged to hold the substrate W horizontally at an upper substrate holding height across a fixed interval from the rotary table 107 that has a substantially horizontal upper surface. That is, the holding pins included in the spin chuck 5 are all movable pins 110.

The rotary table 107 is formed to a disk shape along a horizontal plane and is coupled to the boss 109 coupled to the rotational shaft 108.

As shown in FIG. 3, the respective movable pins 110 are disposed at equal intervals along the circumferential direction at the peripheral edge portion of the upper surface of the rotary table 107. With the six movable pins 110, each set of three movable pins 110 that are not mutually adjacent is configured as a single group with which magnetic pole directions of corresponding driving permanent magnets 156A or 156B are the same. In other words, the six movable pins 110 include three movable pins 110 included in a first movable pin group 111 and three movable pins 110 included in a second movable pin group 112. The magnetic pole direction of each of the first driving permanent magnets 156A, corresponding to the three movable pins 110 included in the first movable pin group 111, and the magnetic pole direction of each of the second driving permanent magnets 156B, corresponding to the three movable pins 110 included in the second movable pin group 112, differ mutually with respect to a direction orthogonal to a rotational axis A3. The movable pins 110 included in the first movable pin group 111 and the movable pins 110 included in the second movable pin group 112 are disposed alternately with respect to the circumferential direction of the rotary table 107. In regard to the first movable pin group 111, the three movable pins 110 are disposed at equal intervals (120° intervals). Also, in regard to the second movable pin group 112, the three movable pins 110 are disposed at equal intervals (120° intervals).

Each movable pin 110 includes a lower shaft portion 151, coupled to the rotary table 107, and an upper shaft portion (support portion) 152, formed integral to an upper end of the lower shaft portion 151, and the lower shaft portion 151 and the upper shaft portion 152 are respectively formed to circular columnar shapes. The upper shaft portion 152 is arranged to be eccentric from a central axis of the lower shaft portion 151. A front surface connecting between the upper end of the lower shaft portion 151 and a lower end of the upper shaft portion 152 forms a tapered surface 153 descending from the upper shaft portion 152 to a peripheral surface of the lower shaft portion 151.

As shown in FIG. 7, each movable pin 110 is coupled to the rotary table 107 so that the lower shaft portion 151 is rotatable around the rotational axis A3 coaxial to a central axis thereof. More specifically, a support shaft 155, supported via a bearing 154 with respect to the rotary table 107, is provided at a lower end portion of the lower shaft portion 151. A magnet holding member 157, holding a driving permanent magnet (first or second driving magnet) 156A or 156B, is coupled to a lower end of the support shaft 155. The driving permanent magnet 156A or 156B is, for example, disposed with the magnetic pole direction directed in a direction orthogonal to the rotational axis A3 of the movable pin 110. The first driving permanent magnets 156A are driving permanent magnets corresponding to the movable pins 110 included in the first movable pin group 111. The second driving permanent magnets 156B are driving permanent magnets corresponding to the movable pins 110 included in the second movable pin group 112. The first driving permanent magnets 156A and the second driving permanent magnets 156B are arranged to have mutually oppositely directed but equal magnetic pole directions with respect to the direction orthogonal to the rotational axis A3 (direction orthogonal to an axis aligned with the rotational axis) in a state where an external force is not applied to the movable pins 110 corresponding to the driving permanent magnets 156A and 156B. The first driving permanent magnets 156A and the second driving permanent magnets 156B are disposed alternately with respect to the circumferential direction of the rotary table 107.

The rotary table 107 is provided with the same number of closing permanent magnets 121 and 122 as the number of movable pins 110. The closing permanent magnets 121 and 122 are provided in one-to-one correspondence with the movable pins 110 and are disposed adjacent the corresponding movable pins 110. As shown in FIG. 3 and FIG. 4, in the present preferred embodiment, each of the closing permanent magnets 121 and 122 is disposed in a periphery of the corresponding movable pin 110 such as to be further biased in a direction away from the rotational axis A1 than a central position of the movable pin 110 in plan view. Each of the closing permanent magnets 121 and 122 is housed in a magnet holding member 123 provided adjacent the corresponding magnet holding member 157.

The plurality of closing permanent magnets 121 and 122 include three first closing permanent magnets (first urging magnets) 121, corresponding to the three movable pins 110 included in the first movable pin group 111, and three second closing permanent magnets (second urging magnets) 122, corresponding to the three movable pins 110 included in the second movable pin group 112. In other words, the first closing permanent magnets 121 correspond to the first driving permanent magnets 156A and the second closing permanent magnets 122 correspond to the second driving permanent magnets 156B. The first closing permanent magnets 121 and the second closing permanent magnets 122 are disposed alternately with respect to the circumferential direction of the rotary table 107. The first closing permanent magnets 121 and the second closing permanent magnets 122 are arranged to be incapable of being elevated or lowered with respect to the rotary table 107.

As mentioned above, the first driving permanent magnets 156A and the second driving permanent magnets 156B are arranged to have mutually oppositely directed but equal magnetic pole directions with respect to the direction orthogonal to the rotational axis A3. Each of the first closing permanent magnets 121 and the second closing permanent magnets 122 is arranged to apply a magnetic force to the corresponding driving permanent magnet 156A or 156B to urge the upper shaft portion 152 of the corresponding movable pin 110 to a hold position. Therefore, the first closing permanent magnets 121 and the second closing permanent magnets 122 are also arranged to have mutually oppositely directed but equal magnetic pole directions with respect to the direction orthogonal to the rotational axis A3.

Each first driving permanent magnet 156A receives an attractive magnetic force from a first closing permanent magnet 121 and moves the upper shaft portion 152 to the hold position that has approached the rotational axis A1. That is, the upper shaft portions 152 of each movable pin 110 included in the first movable pin group 111 is urged to the hold position by the attractive magnetic force of the first closing permanent magnet 121.

Each second driving permanent magnet 156B receives an attractive magnetic force from a second closing permanent magnet 122 and moves the upper shaft portion 152 to the hold position that has approached the rotational axis A1. That is, the upper shaft portion 152 of each movable pins 110 included in the second movable pin group 112 is urged to the hold position by the attractive magnetic force of the second closing permanent magnet 122. Therefore, when the driving permanent magnets 156A and 156B do not receive the attractive magnetic force from opening permanent magnets 125 and 127, to be described below, the movable pins 110 are positioned at the open position away from the rotational axis A1.

As shown in FIG. 2, the first opening permanent magnets (first elevated/lowered magnet) 125 and the second opening permanent magnets (second elevated/lowered magnets) 127 are provide below the rotary table 107. The magnetic pole directions of the first opening permanent magnets 125 and the second opening permanent magnets 127 are both directions aligned with an up/down direction but are directed mutually oppositely. If, for example, upper surfaces of the first opening permanent magnets 125 are of an N pole, then upper surfaces of the second opening permanent magnets 127 are of an S pole of opposite polarity.

In the present preferred embodiment, three (the same number as the number of movable pins 110 included in each of the movable pin groups 111 and 112) each of the first opening permanent magnets 125 and the second opening permanent magnets 127 are provided. The three first opening permanent magnets 125 and the three second opening permanent magnets 127 are disposed alternately with respect to the circumferential direction of the rotary table 107 in plan view.

The three first opening permanent magnets 125 constitute arcuate shapes centered at the rotational axis A1 and are mutually disposed at a same height position and at intervals in the circumferential direction of the rotary table 107. The three first opening permanent magnets 125 have mutually equal specifications and are disposed at equal intervals in the circumferential direction on a circumference coaxial to the rotational axis A1. Each of the first opening permanent magnets 125 is disposed along a plane (horizontal plane) orthogonal to the rotational axis A1.

The first opening permanent magnets 125 are formed to a circular annular shape coaxial to the rotational axis A1 and are disposed along the plane (horizontal plane) orthogonal to the rotational axis A1. More specifically, with respect to the rotational axis A1, the first opening permanent magnets 125 are disposed at positions further away than first levitating magnets 160, to be described below, and closer than the driving permanent magnets 156A and 156B.

A circumferential direction length (angle) of each first opening permanent magnet 125 is approximately 60°. The circumferential direction length (angle) of each first opening permanent magnet 125 is set to approximately 60° for the reason of forming a magnetic field generation region 129A (see FIG. 13A) of full circumferential annular shape in an annular region through which pass the driving permanent magnets 156A and 156B that rotate in accordance with the rotation of the rotary table 107 when the substrate W is rotated at a liquid processing speed (of, for example, approximately 500 rpm) as shall be described below.

A first elevating/lowering unit (first relative movement unit) 126, which elevates and lowers the plurality of first opening permanent magnets 125 together, is connected to the first opening permanent magnets 125. The first elevating/lowering unit 126 is of an arrangement that includes, for example, a cylinder arranged to be capable of extending and contracting in the up/down direction and is supported by the cylinder. Also, the first elevating/lowering unit 126 may be arranged using an electric motor. Also, the first elevating/lowering unit 126 may be arranged to elevate/lower each of the first opening permanent magnets 125 individually.

The first opening permanent magnets 125 are magnets arranged to generate an attractive magnetic force in relation to the first driving permanent magnets 156A and urge the upper shaft portion 152 of each movable pin 110, included in the first movable pin group 111, to an open position by the attractive magnetic force. In a state where the first opening permanent magnets 125 are disposed at an upper position (first position, see FIG. 8B and FIG. 19A) where magnetic poles approach the first driving permanent magnets 156A in the up/down direction and the first opening permanent magnets 125 face the first driving permanent magnets 156A in a lateral direction, the magnetic force (attractive magnetic force) acts between the first opening permanent magnets 125 and the first driving permanent magnets 156A.

The three second opening permanent magnets 127 constitute arcuate shapes centered at the rotational axis A1 and are mutually disposed at a same height position and at intervals in the circumferential direction of the rotary table 107. The three second opening permanent magnets 127 have mutually equal specifications and are disposed at equal intervals in the circumferential direction on a circumference coaxial to the rotational axis A1. Each of the second opening permanent magnets 127 is disposed along a plane (horizontal plane) orthogonal to the rotational axis A1.

The second opening permanent magnets 127 are formed to a circular annular shape coaxial to the rotational axis A1 and are disposed along the plane (horizontal plane) orthogonal to the rotational axis A1. More specifically, with respect to the rotational axis A1, the second opening permanent magnets 127 are disposed at positions further away than first levitating magnets 160, to be described below, and closer than the driving permanent magnets 156A and 156B.

A circumferential direction length (angle) of each second opening permanent magnet 127 is approximately 60°. The circumferential direction length (angle) of each second opening permanent magnet 127 is set to approximately 60° for the reason of forming a magnetic field generation region 129B (see FIG. 13B) of full circumferential annular shape in an annular region through which pass the driving permanent magnets 156A and 156B that rotate in accordance with the rotation of the rotary table 107 when the substrate W is rotated at the liquid processing speed (of, for example, approximately 500 rpm) as shall be described below.

A second elevating/lowering unit (second relative movement unit) 128, which elevates and lowers the plurality of second opening permanent magnets 127 together, is connected to the second opening permanent magnets 127. The second elevating/lowering unit 128 is of an arrangement that includes, for example, a cylinder arranged to be capable of extending and contracting in the up/down direction and is supported by the cylinder. Also, the second elevating/lowering unit 128 may be arranged using an electric motor. Also, the second elevating/lowering unit 128 may be arranged to elevate/lower each of the second opening permanent magnets 127 individually.

The second opening permanent magnets 127 are magnets arranged to generate an attractive magnetic force in relation to the second driving permanent magnets 156B and urge the upper shaft portion 152 of each movable pin 110, included in the second movable pin group 112, to an open position by the attractive magnetic force. In a state where the second opening permanent magnets 127 are disposed at an upper position (third position, see FIG. 9B and FIG. 19A) where magnetic poles approach the second driving permanent magnets 156B in the up/down direction and the second opening permanent magnets 127 face the second driving permanent magnets 156B in a lateral direction, the magnetic force (attractive magnetic forces) acts between the second opening permanent magnets 127 and the second driving permanent magnets 156B.

The first opening permanent magnets 125 and the second opening permanent magnets 127 are elevated and lowered using the first elevating/lowering unit 126 and the second elevating/lowering unit 128, respectively. The first opening permanent magnets 125 and the second opening permanent magnets 127 can thus be elevated/lowered independently of each other.

As shown in FIG. 2, the spin chuck 5 further includes a protective disk 115 disposed between the upper surface of the rotary table 107 and the height of substrate holding by the movable pins 110. The protective disk 115 is coupled to the rotary table 107 in a manner enabling up/down movement, and is capable of moving between a lower position close to the upper surface of the rotary table 107 and an approach position approaching, across a minute interval, the lower surface of the substrate W held higher than the lower position by the movable pins 110. The protective disk 115 is a disk-shaped member having a size of slightly larger diameter than the substrate W and has notches 116 formed therein to avoid the movable pins 110 at positions corresponding to the movable pins 110.

The rotational shaft 108 is a hollow shaft and has an inert gas supply pipe 170 inserted through its interior. An inert gas supply passage 172, guiding an inert gas, as an example of a protective gas, from an inert gas supply source, is coupled to a lower end of the inert gas supply pipe 170. An inert gas, such as CDA (clean dry air) or nitrogen gas, etc., can be cited as an example of the inert gas guided by the inert gas supply passage 172. An inert gas valve 173 and an inert gas flow control valve 174 are interposed in the middle of the inert gas supply passage 172. The inert gas valve 173 opens and closes the inert gas supply passage 172. By opening the inert gas valve 173, the inert gas is delivered into the inert gas supply pipe 170. The inert gas is supplied to a space between the protective disk 115 and the lower surface of the substrate W by the arrangement to be described below. The protective gas supplying unit 12 is thus arranged from the inert gas supply pipe 170, the inert gas supply passage 172, the inert gas valve 173, etc.

The protective disk 115 is a substantially disk-shaped member having a size approximately equal to that of the substrate W. At a peripheral edge portion of the protective disk 115, the notches 116 are formed at positions corresponding to the movable pins 110 so as to border the movable pins 110 while securing fixed intervals from outer peripheral surfaces of the movable pins 110. A circular opening, corresponding to the boss 109, is formed in a central region of the protective disk 115.

As shown in FIG. 3 and FIG. 5, guide shafts 117, extending in the vertical direction parallel to the rotational axis A1, are coupled to a lower surface of the protective disk 115 at positions further away from the rotational axis A1 than the boss 109. In the present preferred embodiment, the guide shafts 117 are disposed at three locations at equal intervals in a circumferential direction of the protective disk 115. More specifically, as viewed from the rotational axis A1, the three guide shafts 117 are respectively disposed at angular positions corresponding to every other movable pin 110. The guide shafts 117 are coupled to linear bearings 118 provided at corresponding locations of the rotary table 107 and are capable of moving in the vertical direction, that is, the direction parallel to the rotational axis A1, while being guided by the linear bearings 118. The guide shafts 117 and the linear bearings 118 thus constitute guiding units 119 that guide the protective disk 115 along the up/down direction parallel to the rotational axis A1.

The guide shafts 117 penetrate through the linear bearings 118 and include outwardly projecting flanges 120 at lower ends thereof. By contacting of the flanges 120 with the lower ends of the linear bearings 118, upward movement of the guide shafts 117, that is, upward movement of the protective disk 115 is restricted. That is, the flanges 120 are restricting members that restrict the upward movement of the protective disk 115.

Magnet holding members 161 that hold the first levitating magnets 160 are fixed to the lower surface of the protective disk 115 at positions further outward and further away from the rotational axis A1 than the guide shafts 117 and further inward and closer to the rotational axis A1 than the movable pins 110. In the present preferred embodiment, the first levitating magnets 160 are held in the magnet holding members 161 with magnetic pole directions being directed in the up/down direction. For example, the first levitating magnets 160 may be fixed to the magnet holding members 161 so as to have the S poles at the lower sides and have the N poles at the upper sides. In the present preferred embodiment, the magnet holding members 161 are provided at six locations at equal intervals in the circumferential direction. More specifically, as viewed from the rotational axis A1, each magnet holding member 161 is disposed at an angular position corresponding to being between (in the middle in the present preferred embodiment) mutually adjacent movable pins 110. Further, the three guide shafts 117 are respectively disposed in every other angular region (at a central position of every other angular region in the present preferred embodiment) among six angular regions that are divided (divided equally in the present preferred embodiment) by the six magnet holding members 161 as viewed from the rotational axis A1.

As shown in FIG. 4, penetrating holes 162 are formed at six locations of the rotary table 107 corresponding to the six magnet holding members 161. The respective penetrating holes 162 are formed to enable the corresponding magnet holding members 161 to be respectively inserted through in the vertical direction parallel to the rotational axis A1. When the protective disk 115 is at the lower position, the magnet holding members 161 are inserted through the penetrating holes 162 and project lower than the lower surface of the rotary table 107 and the first levitating magnets 160 are positioned lower than the lower surface of the rotary table 107.

A second levitating magnet 129 arranged to levitate the protective disk 115 is provided below the rotary table 107. The second levitating magnet 129 is formed to a circular annular shape coaxial to the rotational axis A1 and is disposed along a plane (horizontal plane) orthogonal to the rotational axis A1. The second levitating magnet 129 is disposed at a position closer to the rotational axis A1 than the first and second opening permanent magnets 125 and 127. That is, it is positioned further to an inner diameter side than the first and second opening permanent magnets 125 and 127 in plan view. Also, the second levitating magnet 129 is disposed at a position lower than the first levitating magnets 160. In the present preferred embodiment, a magnetic pole direction of the second levitating magnet 129 is aligned with a horizontal direction, that is, a rotation radial direction of the rotary table 107. When the first levitating magnets 160 have the S poles at the lower surfaces, the second levitating magnet 129 is arranged to have the same magnetic pole, that is, the S pole in a ring shape at the inner side in the rotation radial direction.

A third elevating/lowering unit (third relative movement unit) 130 that elevates and lowers the second levitating magnet 129 is coupled to the second levitating magnet 129. The third elevating/lowering unit 130 is of an arrangement that includes, for example, a cylinder arranged to be capable of extending and contracting in the up/down direction and is supported by the cylinder. Also, the third elevating/lowering unit 130 may be arranged using an electric motor.

When the second levitating magnet 129 is at an upper position (see FIG. 19B), a repulsive magnetic force acts between the second levitating magnet 129 and the first levitating magnets 160, and the first levitating magnets 160 receive an upward external force. The protective disk 115 thereby receives an upward force from the magnet holding portions 161 holding the first levitating magnets 160 and is held at the approach position approaching the lower surface of the substrate W.

In the state where the second levitating magnet 129 is disposed at a lower position (see FIG. 19A) separated downward from the upper position, the repulsive magnetic force between the second levitating magnet 129 and the first levitating magnets 160 is small and therefore the protective disk 115 is maintained by its own weight at the lower position close to the upper surface of the rotary table 107.

Therefore when the second levitating magnet 129 is at the lower position, the protective disk 115 is at the lower position close to the upper surface of the rotary table 107 and the movable pins 110 are held at the open position. In this state, the center robot CR that carries in and carries out the substrate W with respect to the spin chuck 5 can make its hand H2 enter into the space between the protective disk 115 and the lower surface of the substrate W.

In the present preferred embodiment, the elevating/lowering unit (third elevating/lowering unit 130) that is dedicated to elevating and lowering the protective disk 115 is provided. Therefore, elevating/lowering operations of the second levitating magnet 129 can be performed independently of each of elevating/lowering operations of the first opening permanent magnets 125 and elevating/lowering operations of the second opening permanent magnets 127. This means that elevating/lowering operations of the first opening permanent magnets 125 and elevating/lowering operations of the second opening permanent magnets 127 can be realized regardless of the up/down position of the protective disk 115.

As shown in enlarged manner in FIG. 6, the boss 109 coupled to the upper end of the rotational shaft 108 holds a bearing unit 175 arranged to support an upper end portion of the inert gas supply pipe 170. The bearing unit 175 includes a spacer 177, fitted and fixed in a recess 176 formed in the boss 109, a bearing 178 disposed between the spacer 177 and the inert gas supply pipe 170, and a magnetic fluid bearing 179 provided similarly but higher than the bearing 178 between the spacer 177 and the inert gas supply pipe 170.

As shown in FIG. 5, the boss 109 integrally has a flange 181 projecting outward along a horizontal plane and the rotary table 107 is coupled to the flange 181. Further, the spacer 177 is fixed to the flange 181 so as to sandwich an inner peripheral edge portion of the rotary table 107, and a cover 184 is coupled to the spacer 177. The cover 184 is formed substantially to a disk shape, has, at its center, an opening arranged to expose an upper end of the inert gas supply pipe 170, and has formed, in its upper surface, a recess 185 with the opening as a bottom surface. The recess 185 has a horizontal bottom surface and an inclined surface 183 of inverted conical surface shape that rises obliquely upward toward the exterior from a peripheral edge of the bottom surface. A flow straightening member 186 is coupled to the bottom surface of the recess 185. The flow straightening member 186 has a plurality (for example, four) of leg portions 187, disposed discretely around the rotational axis A1 at intervals along the circumferential direction, and has a bottom surface 188 disposed, by the leg portions 187 at an interval from the bottom surface of the recess 185. An inclined surface 189 constituted of an inverted conical surface is formed that rises obliquely upward toward the exterior from a peripheral edge of portion the bottom surface 188.

As shown in FIG. 5 and FIG. 6, a flange 184a is formed outwardly at an upper surface outer peripheral edge of the cover 184. The flange 184a is arranged to match a step portion 115a formed at an inner peripheral edge of the protective disk 115. That is, when the protective disk 115 is at the approach position approaching the lower surface of the substrate W, the flange 184*a* and the step portion 115*a* are merged and an upper surface of the cover 184 and an upper surface of the protective disk 115 are positioned within the same plane to form a flat inert gas flow passage.

By such an arrangement, the inert gas flowing out from the upper end of the inert gas supply pipe 170 exits into a space defined by the bottom surface 188 of the flow straightening member 186 inside the recess 185 of the cover 184. The inert gas further blows out in radial directions away from the rotational axis A1 via a radial flow passage 182 defined by the inclined surface 183 of the recess 185 and the inclined surface 189 of the flow straightening member 186. The inert gas forms a gas stream of inert gas in the space between the protective disk 115 and the lower surface of the substrate W held by the movable pins 110 and blows outward in rotation radial directions of the substrate W from the space.

As shown in FIG. 5, a peripheral edge portion of the upper surface of the protective disk 115 and a peripheral end of the protective disk 115 are covered by a circular annular cover 191 of circular annular shape. The circular annular cover 191 includes a circular annular plate portion 192 protruding in horizontal directions and outward in radial directions from a peripheral edge portion of its upper surface, and a circular cylindrical portion 193 extending downward from a peripheral end of the circular annular plate portion 192. An outer periphery of the circular annular plate portion 192 is disposed further outward than a peripheral end of the rotary table 107. The circular annular plate portion 192 and the circular cylindrical portion 193 are formed integrally using, for example, a resin material having chemical resistance. Notches 194, arranged to avoid the movable pins 110, are formed at positions of an inner periphery of the circular annular plate portion 192 corresponding to the movable pins 110. The notches 194 are formed so as to border the movable pins 110 with fixed intervals being secured from the outer peripheral surfaces of the movable pins 110. The circular annular plate portion 192 and the circular cylindrical portion 193 are formed integrally using, for example, a resin material having chemical resistance.

The circular annular plate portion 192 of the circular annular cover 191 has, on its upper surface, a constricting portion 190 (see FIG. 20C) that constricts the flow passage of the inert gas at a peripheral edge portion of the substrate W held by the movable pins 110. By the constricting portion 190, a flow speed of the inert gas flow blowing outward from the space between the circular annular cover 191 and the lower surface of the substrate W is made high, thereby enabling reliable avoidance or suppression of entry of the processing liquid (chemical liquid or rinse liquid) on the upper surface of the substrate W further inward than a peripheral edge portion of the lower surface of the substrate W.

As shown in FIG. 2, the chemical liquid supplying unit 7 includes a chemical liquid nozzle 6 that discharges the FOM (chemical liquid) toward the upper surface of the substrate W, a nozzle arm 21, at a tip portion of which is mounted the chemical nozzle 6, and a nozzle moving unit 22 that moves the nozzle arm 21 to move the chemical liquid nozzle 6.

The chemical liquid nozzle 6 is, for example, a straight nozzle that discharges the FOM in a continuous flow state and is mounted to the nozzle arm 21, for example, in a perpendicular orientation of discharging the FOM in a direction perpendicular to the upper surface of the substrate W. The nozzle arm 21 extends in a horizontal direction and is arranged to be pivotable around a prescribed swinging axis (not shown) extending in the vertical direction at a periphery of the spin chuck 5.

The chemical liquid supplying unit 7 includes a chemical liquid piping 14 that guides the FOM to the chemical liquid nozzle 6 and a chemical liquid valve 15 that opens and closes the chemical liquid piping 14. When the chemical liquid valve 15 is opened, the FOM from an FOM supply source is supplied to the chemical liquid nozzle 6 from the chemical liquid piping 14. The FOM is thereby discharged from the chemical liquid nozzle 6.

The nozzle moving unit 22 turns the nozzle arm 21 around the swinging axis to move the chemical liquid nozzle 6 horizontally along a locus passing through an upper surface central portion of the substrate W in plan view. The nozzle moving unit 22 moves the chemical liquid nozzle 6 horizontally between a processing position, at which the FOM discharged from the chemical liquid nozzle 6 lands on the upper surface of the substrate W, and a home position, at which the chemical liquid nozzle 6 is set at a periphery of the spin chuck 5 in plan view. Further, the nozzle moving unit 22 moves the chemical liquid nozzle 6 horizontally between a central position, at which the FOM discharged from the chemical liquid nozzle 6 lands on the upper surface central portion of the substrate W, and a peripheral edge portion, at which the FOM discharged from the chemical liquid nozzle 6 lands on an upper surface peripheral edge portion of the substrate W. The central position and the peripheral edge position are both processing positions.

The chemical liquid nozzle 6 may be a fixed nozzle that is disposed fixedly with its discharge port directed toward a prescribed position (for example, the central portion) of the upper surface of the substrate W.

As shown in FIG. 2, the water supplying unit 8 includes a water nozzle 41. The water nozzle 41 is, for example, a straight nozzle that discharges liquid in a continuous flow state and is disposed fixedly above the spin chuck 5 with its discharge port directed toward the central portion of the upper surface of the substrate W. A water piping 42, to which water from a water supply source is supplied, is connected to the water nozzle 41. A water valve 43, arranged to switch between supplying and stopping the supplying of water from the water nozzle 41, is interposed at an intermediate portion of the water piping 42. When the water valve 43 is opened, the continuous flow of water supplied from the water piping 42 to the water nozzle 41 is discharged from the discharge port set at a lower end of the water nozzle 41. Also, when the water valve 43 is closed, the supplying of water from the water piping 42 to the water nozzle 41 is stopped. The water is, for example, deionized water (DIW). The water is not restricted to DIW and may be any of carbonated water, electrolyzed ion water, hydrogen water, ozone water, and aqueous hydrochloric acid solution of dilute concentration (for example of approximately 10 ppm to 100 ppm).

The water nozzle 41 does not need to be disposed fixedly with respect to the spin chuck 5 and, for example, a form of a so-called scan nozzle, which is mounted on an arm swingable within a horizontal plane above the spin chuck 5 and with which a landing position of water on the upper surface of the substrate W is scanned by the swinging of the arm, may be adopted instead.

The cleaning brush 10 is, for example, a sponge-like scrubbing member constituted of PVA (polyvinyl alcohol) and has a circular columnar shape. The cleaning brush 10 has a flat-shaped cleaning surface 10*a* at its lower surface. The cleaning surface 10*a* functions as a contacting surface that contacts the upper surface of the substrate W.

The cleaning brush driving unit 11 includes a swinging arm 47, holding the cleaning brush 10 at a tip portion, and an arm driving unit 48, arranged to drive the swinging arm 47. The arm driving unit 48 is arranged to be capable of swinging the swinging arm 47 around a swinging axis A2 that extends in the vertical direction and moving the swinging arm 47 up and down. By this arrangement, the cleaning brush 10 can be moved horizontally between a position above the substrate W and a home position, set at a side of the spin chuck 5, when the substrate W is held and rotated by the spin chuck 5.

Further, the cleaning surface 10a of the cleaning brush 10a can also be pressed against the upper surface (rear surface Wb) of the substrate W and the pressing position of the cleaning brush 10 can be moved (scanned) in a radial direction of the substrate W between the central portion of the substrate W and the peripheral edge portion of the substrate W.

By water (for example, pure water (deionized water)) being supplied from the water nozzle 41 in the process of scrub cleaning, foreign matter on the rear surface Wb of the substrate W is made easy to remove and also, the foreign matter scrubbed off by the cleaning brush 10 can be expelled outside the substrate W.

As mentioned above in reference to FIG. 7, each movable pin 110 has the upper shaft portion 152 at the position eccentric from the rotational axis A2. That is, a central axis B of the upper shaft portion 152 is shifted from the rotational axis A2. Therefore, by rotation of the lower shaft portion 151, the upper shaft portion 152 is displaced between the open position (of the central axis B) that is far apart from the rotational axis A1 (see FIG. 8A and FIG. 9A to be described below) and the hold position of (the central axis B) being closer to the rotational axis A1 (see FIG. 8B and FIG. 9B to be described below). The upper shaft portion 152 of the movable pin 110 is urged to the open position by an elastic pressing force of a spring or other elastic pressing member (not shown). In the state where the movable pin 110 is positioned at the open position, a prescribed gap is formed with respect to a peripheral end surface of the substrate W.

FIGS. 8A and 8B are schematic views of states of a movable pin 110, included in the first movable pin group 111, in accordance with elevating/lowering operations of a first opening permanent magnet 125. FIGS. 9A and 9B are schematic views of states of a movable pin 110, included in the second movable pin group 112, in accordance with elevating/lowering operations of a second opening permanent magnet 127. In FIG. 8A, a state where the first opening permanent magnet 125 is at the lower position (second position) is shown, and in FIG. 8B, a state where the first opening permanent magnet 125 is at the upper position is shown. In FIG. 9A, a state where the second opening permanent magnet 127 is at the lower position is shown, and in FIG. 9B, a state where the second opening permanent magnet 127 is at the upper position is shown.

Even in a state where angular positions of the first opening permanent magnet 125 and a first driving permanent magnet 156A are matched, in the state where the first opening permanent magnet 125 is at the lower position as shown in FIG. 8A, the magnetic force from the first opening permanent magnet 125 does not act on the first driving permanent magnet 156A. Therefore, the movable pin 110, included in the first movable pin group 111, is positioned at the hold position. In this state, the first driving permanent magnet 156A is disposed, for example, so that the N pole is directed inward in a radial direction of the rotary table 107 and the S pole is directed outward in the radial direction of the rotary table 107.

From the state shown in FIG. 8A, the first opening permanent magnet 125 is elevated and disposed at the upper position. By an upper surface of the first opening permanent magnet 125 approaching the first driving permanent magnet 156A, an attractive magnetic force is generated at the first driving permanent magnet 156A and an attractive force is generated between the first driving permanent magnet 156A and the first opening permanent magnet 125. In the state where the first opening permanent magnet 125 is disposed at the upper position, the magnitude of the attractive magnetic force acting on the first driving permanent magnet 156A greatly surpasses the attractive magnetic force (urging force) from the first closing permanent magnet 121 and the upper shaft portion 152 is thereby moved from the hold position that has approached the rotational axis A1 to the open position of being separated from the rotational axis A1 (see FIG. 2). The movable pin 110, included in the first movable pin group 111, is thereby urged to the open position. In this state, the first driving permanent magnet 156A is disposed, for example, so that the S pole is directed inward in the radial direction of the rotary table 107 and the N pole is directed outward in the radial direction of the rotary table 107 as shown in FIG. 8B.

Even in a state where angular positions of the second opening permanent magnet 127 and a second driving permanent magnet 156B are matched, in the state where the second opening permanent magnet 127 is at the lower position (fourth position) as shown in FIG. 9A, the magnetic force from the second opening permanent magnet 127 does not act on the second driving permanent magnet 156B. Therefore, the movable pin 110, included in the second movable pin group 112, is positioned at the hold position. In this state, the second driving permanent magnet 156B is disposed, for example, so that the S pole is directed inward in a radial direction of the rotary table 107 and the N pole is directed outward in the radial direction of the rotary table 107.

From the state shown in FIG. 9A, the second opening permanent magnet 127 is elevated and disposed at the upper position. By an upper surface of the second opening permanent magnet 127 approaching the second driving permanent magnet 156B, an attractive magnetic force is generated at the second driving permanent magnet 156B and an attractive force is generated between the second driving permanent magnet 156B and the second opening permanent magnet 127. In the state where the second opening permanent magnet 127 is disposed at the upper position, the magnitude of the attractive magnetic force acting on the second driving permanent magnet 156B greatly surpasses the attractive magnetic force (urging force) from the second closing permanent magnet 122 and the upper shaft portion 152 is thereby moved from the hold position that has approached the rotational axis A1 to the open position of being separated from the rotational axis A1 (see FIG. 2). The movable pin 110, included in the second movable pin group 112, is thereby urged to the open position. In this state, the second driving permanent magnet 156B is disposed, for example, so that the N pole is directed inward in the radial direction of the rotary table 107 and the S pole is directed outward in the radial direction of the rotary table 107 as shown in FIG. 9B.

Figure 10A:
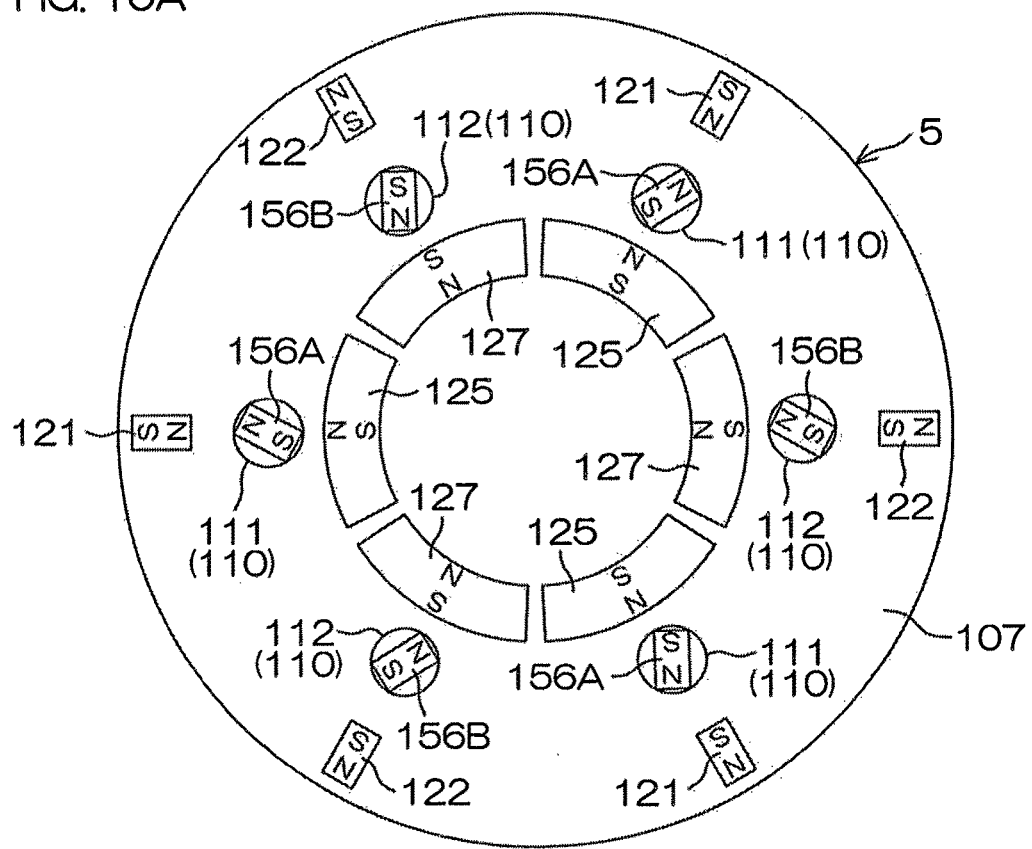
FIGS. 10A and 10B are schematic views of a state of the first movable pin group and the second movable pin group.

FIG. 10A to FIG. 153 are schematic views of states of the first movable pin group 111 and the second movable pin group 112. States of the driving permanent magnets 156A and 156B, and the opening permanent magnets 125 and 127 are shown in FIGS. 10A, 11A, 12A, 13A, 14A, and 15A, and opening/closing circumstances of the respective movable pins 110 are shown in FIGS. 10B, 11B, 12B, 13B, 14B, and 15B.

Figure 10B:
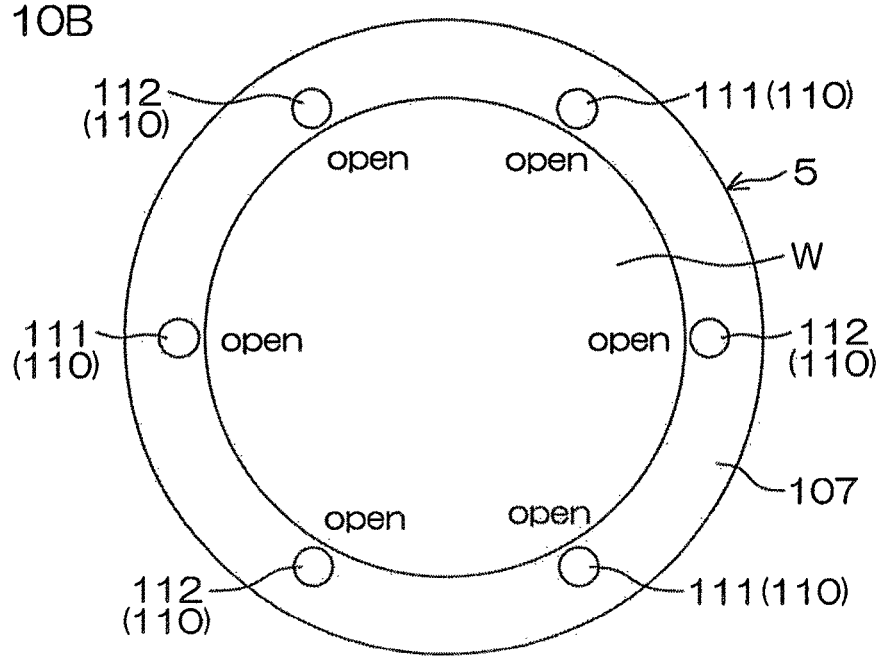
Figure 11A:
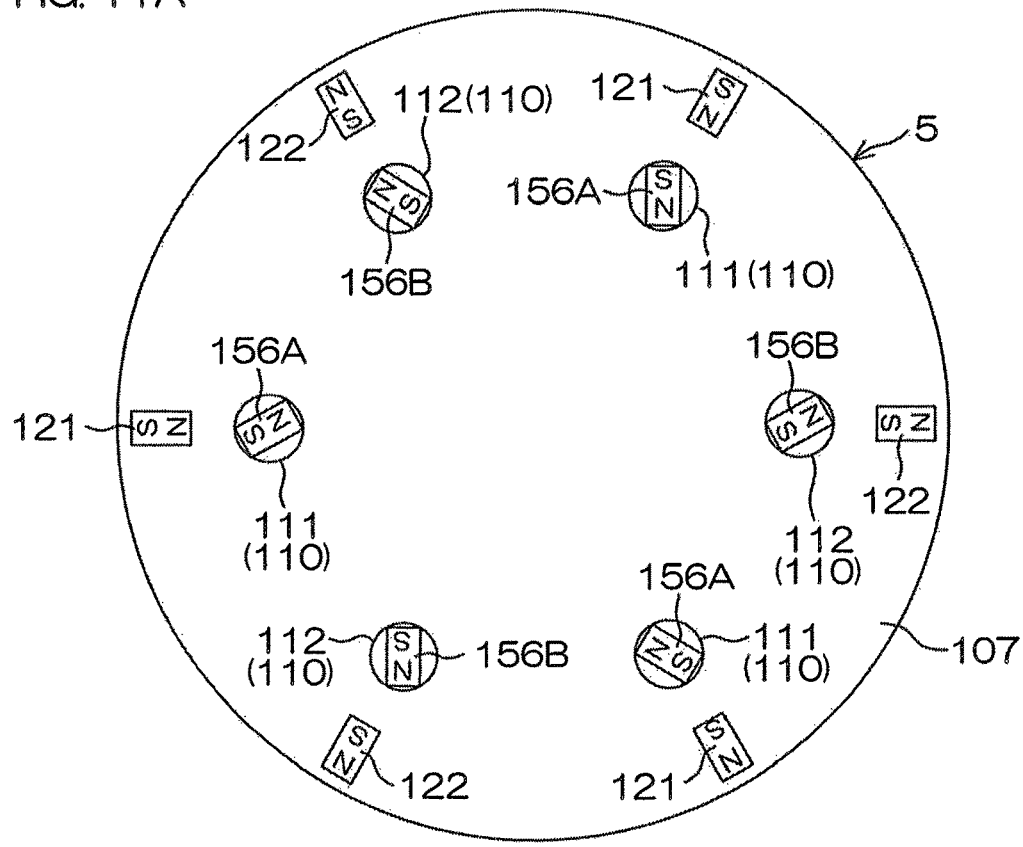
FIGS. 11A and 11B are schematic views of a state of the first movable pin group and the second movable pin group.
Figure 11B:
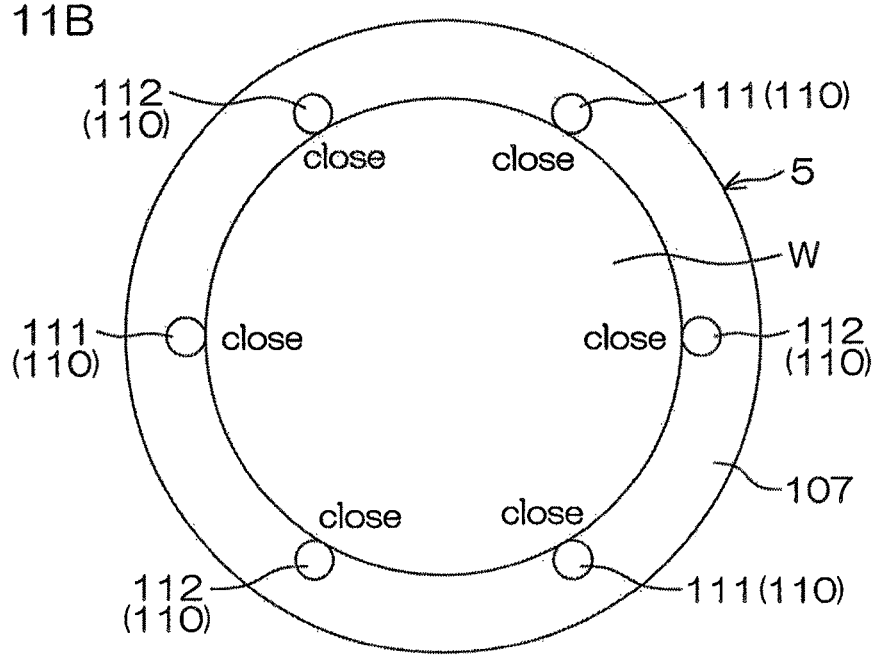
Figure 12A:
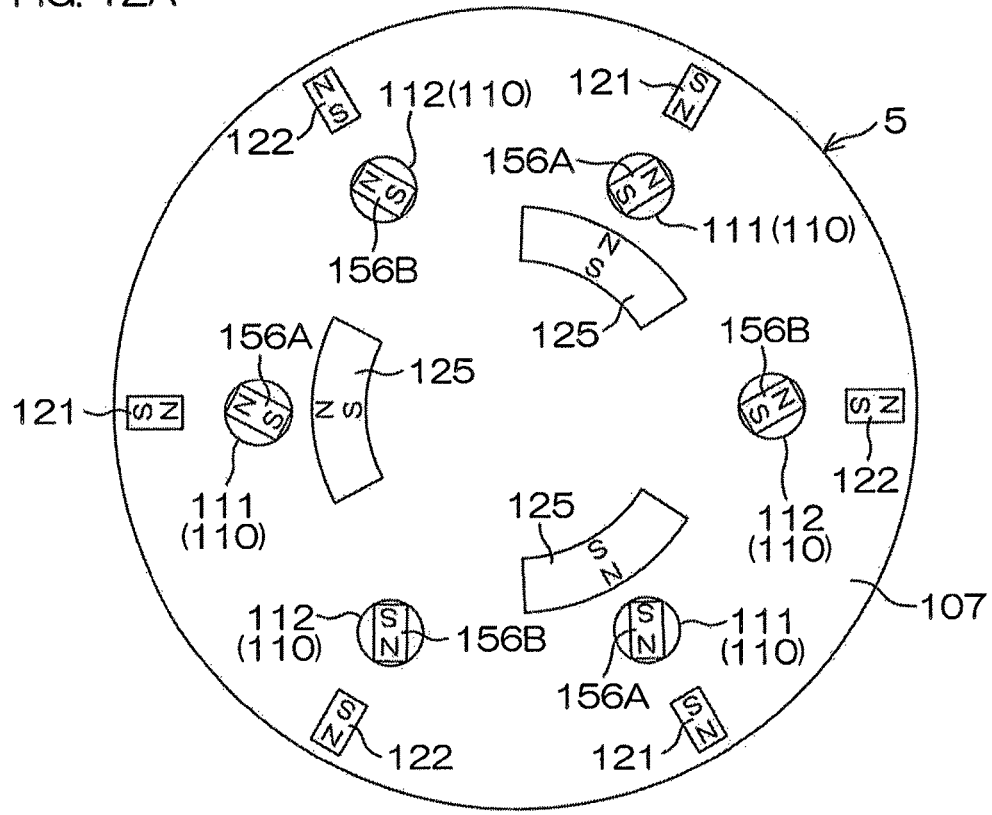
FIGS. 12A and 12B are schematic views of a state of the first movable pin group and the second movable pin group.
Figure 12B:
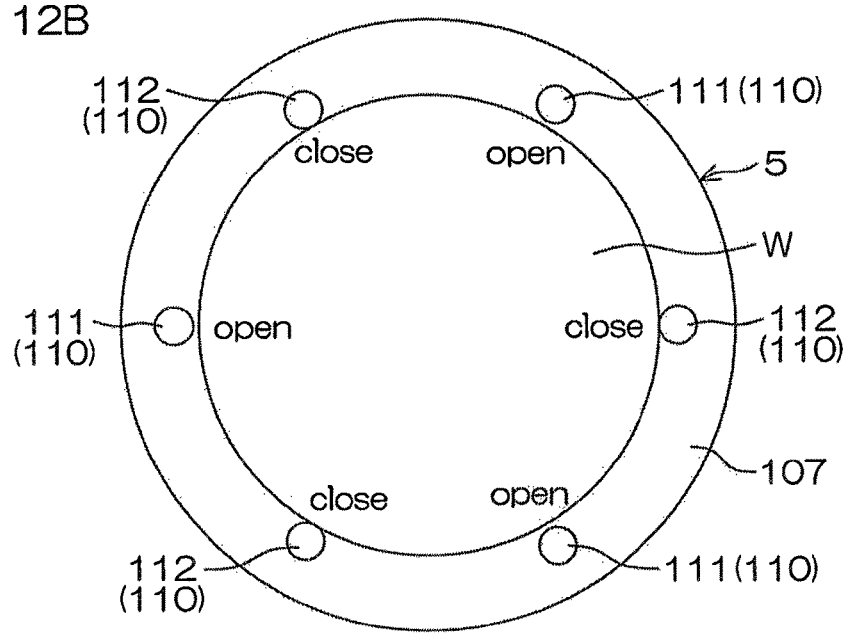
Figure 13A:
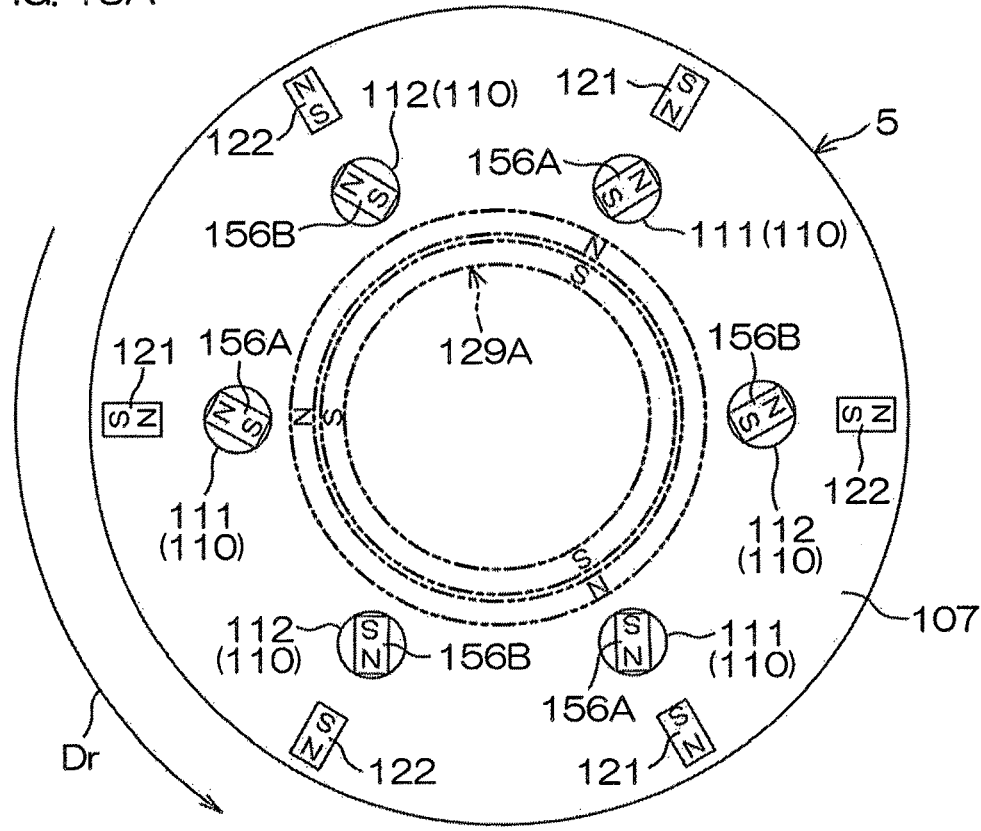
FIGS. 13A and 13B are schematic views of a state of the first movable pin group and the second movable pin group.
Figure 13B:
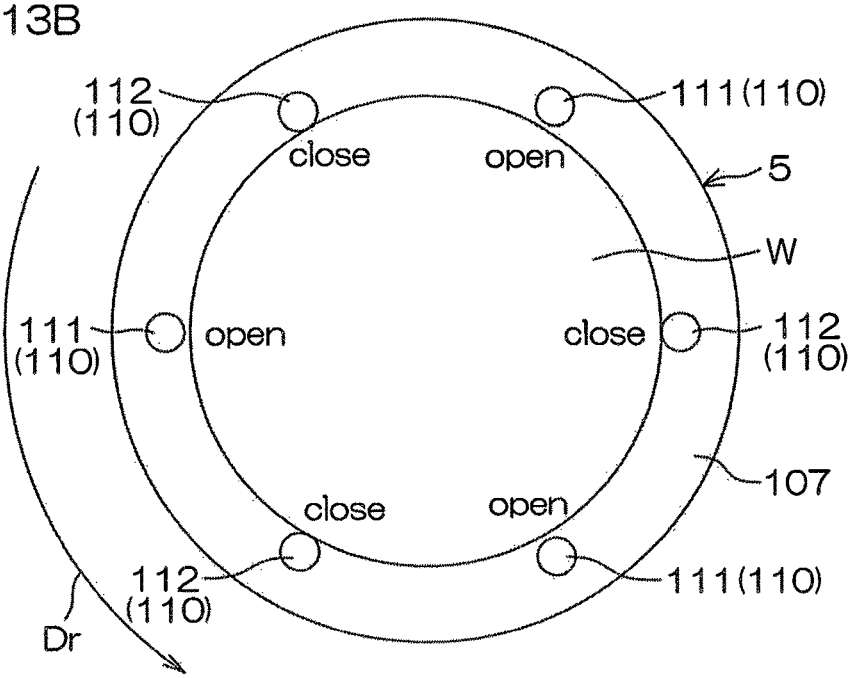
Figure 14A:
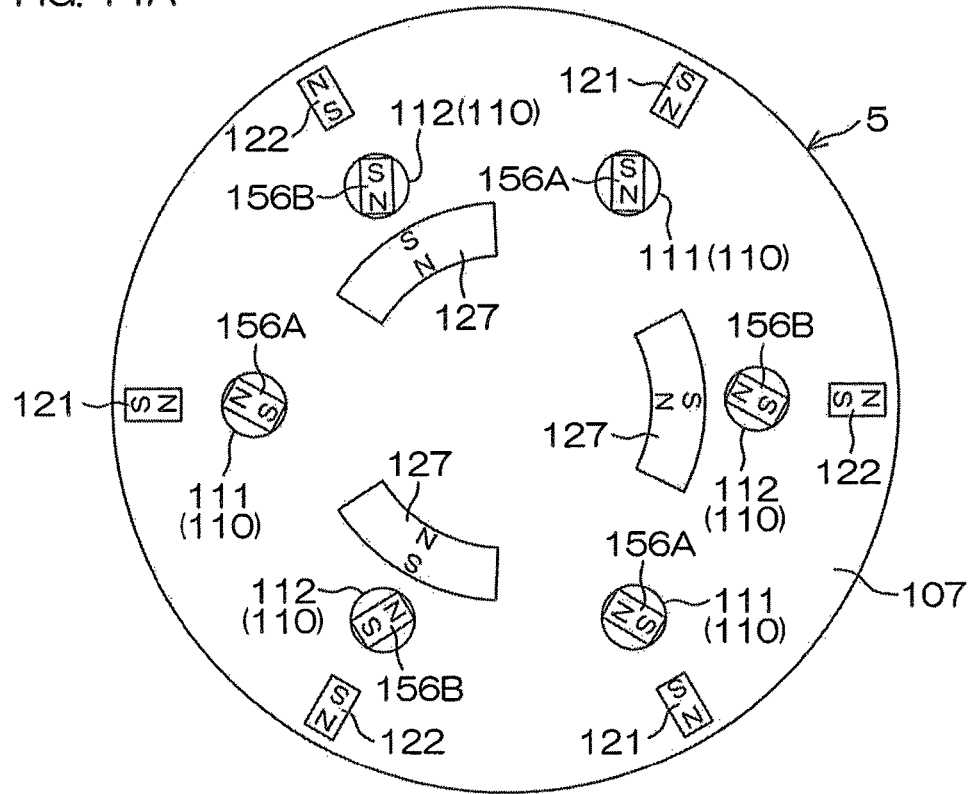
FIGS. 14A and 14B are schematic views of a state of the first movable pin group and the second movable pin group.
Figure 14B:
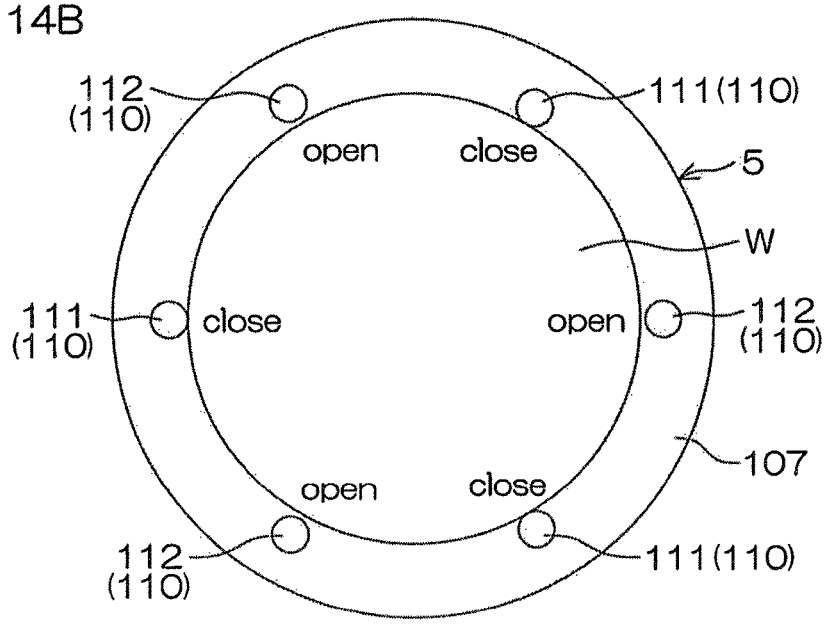
Figure 15A:
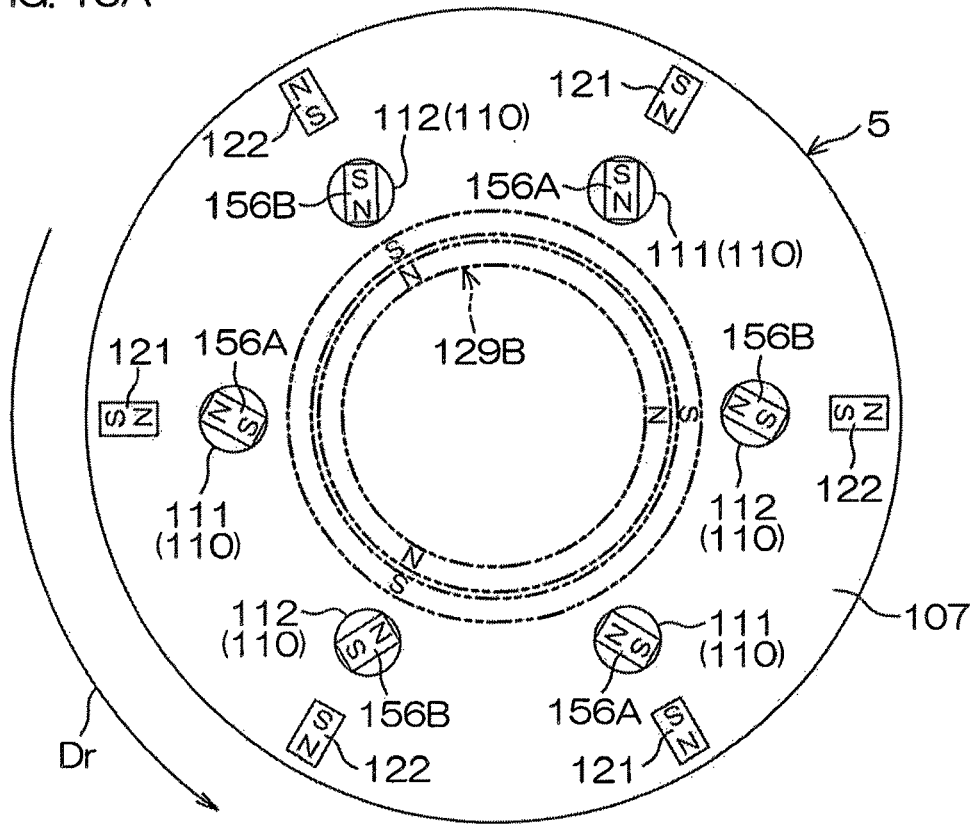
FIGS. 15A and 15B are schematic views of a state of the first movable pin group and the second movable pin group.
Figure 15B:
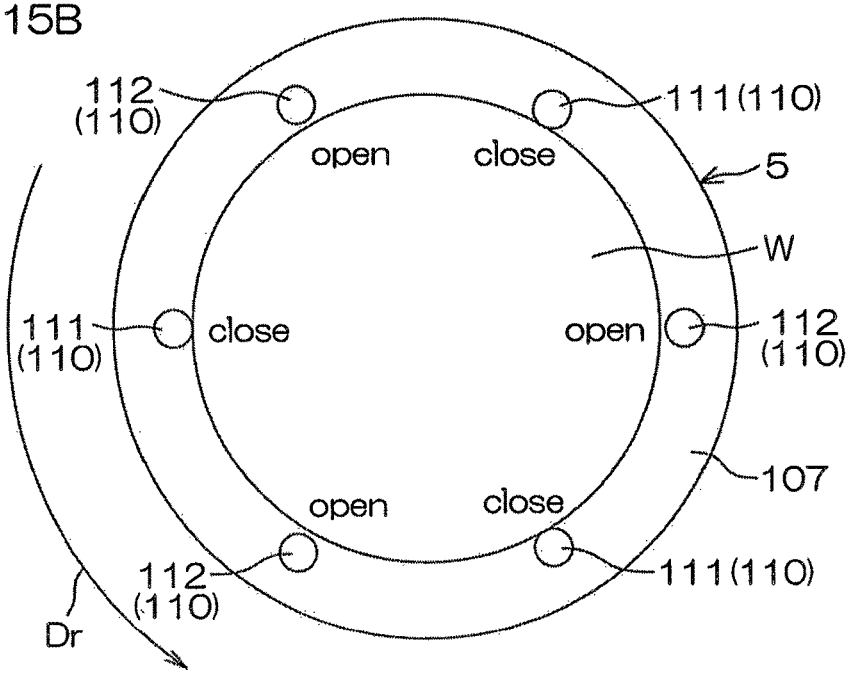

A state where both the first and second opening permanent magnets 125 and 127 are at the upper position is shown in FIGS. 10A and 10B and a state where both the first and second opening permanent magnets 125 and 127 are at the lower position is shown in FIGS. 11A and 11B. States where the first opening permanent magnets 125 are at the upper position and the second opening permanent magnets 127 are at the lower position are shown in FIG. 12A to FIG. 13B, with FIGS. 12A and 12B showing a non-rotating state of the rotary table 107 and FIGS. 13A and 13B showing a rotating state of the rotary table 107. States where the second opening permanent magnets 127 are at the upper position and the first opening permanent magnets 125 are at the lower position are shown in FIG. 14A to FIG. 15B, with FIGS. 14A and 14B showing a non-rotating state of the rotary table 107 and FIGS. 15A and 15B showing a rotating state of the rotary table 107.

The opening permanent magnets 125 and 127 are disposed at equal intervals of 60° in the circumferential direction of the rotary table 107. The movable pins 110 are also disposed at equal intervals of 60°. A facing state, in which the respective first opening permanent magnets 125 and the respective first driving permanent magnets 156A are matched in angular position (face each other) and the respective second opening permanent magnets 127 and the respective second driving permanent magnets 156B are matched in angular position (face each other), can thus be formed as shown in FIGS. 10B, 11B, 12B, 13B, 14B, and 15B.

In a state where both the first and second opening permanent magnets 125 and 127 are disposed at the upper position in the facing state as shown in FIGS. 10A and 10B, both the three movable pins 110 included in the first movable pin group 111 and the three movable pins 110 included in the second movable pin group 112, that is, all of the six movable pins 110 are disposed at the open position (open).

In a state where both the first and second opening permanent magnets 125 and 127 are disposed at the lower position in the facing state as shown in FIGS. 11A and 11B, both the three movable pins 110 included in the first movable pin group ill and the three movable pins 110 included in the second movable pin group 112, that is, all of the six movable pins 110 are disposed at the hold position (close).

In a state where the first opening permanent magnets 125 are disposed at the upper position and the second opening permanent magnets 127 are disposed at the lower position in the facing state as shown in FIGS. 12A and 12B, the three movable pins 110 included in the first movable pin group 111 are disposed at the open position (open) and the three movable pins 110 included in the second movable pin group 112 are disposed at the hold position (close).

A state where the rotary table 107 is rotated from the state of FIGS. 12A and 12B shall now be considered. The rotation speed of the rotary table 107 shall be the liquid processing speed (of, for example, approximately 500 rpm). In the rotating state of the rotary table 107, the magnetic field generation region 129A (see FIG. 13A) is formed in the annular region through which pass the driving permanent magnets 156A and 156B that rotate in accordance with the rotation of the rotary table 107. A circumferential direction length (angle) of the magnetic field generation region 129A becomes longer than a circumferential direction length (angle) of the corresponding first opening permanent magnets 125. The circumferential direction length (angle) of each first opening permanent magnet 125 is 60° and moreover, three first opening permanent magnets 125 are provided in the circumferential direction of the rotary table 107, and therefore when the substrate W is rotated in a rotation direction Dr at the liquid processing speed (of, for example, approximately 500 rpm), the magnetic field generation region 129A (see FIG. 13A) of full circumferential annular shape is formed as shown in FIGS. 13A and 13B in the annular region through which pass the driving permanent magnets 156A and 156B that rotate in accordance with the rotation of the rotary table 107.

The attractive magnetic force from the first opening permanent magnets 125 acts on the first driving permanent magnets 156A regardless of the rotational orientation of the rotary table 107 because the magnetic field generation region 129A (see FIG. 13A) has the full circumferential annular shape. Therefore, in the rotating state of the rotary table 107, the three movable pins 110 included in the first movable pin group 111 are disposed at the open position (open). The three movable pins 110 included in the second movable pin group 112 are, needless to say, disposed at the hold position (close). In this state, the substrate W is supported by the three movable pins 110 included in the second movable pin group 112 and rotates satisfactorily.

In a state where the second opening permanent magnets 127 are disposed at the upper position and the first opening permanent magnets 125 are disposed at the lower position in the facing state as shown in FIGS. 14A and 14B, the three movable pins 110 included in the second movable pin group 112 are disposed at the open position (open) and the three movable pins 110 included in the first movable pin group 111 are disposed at the hold position (close).

A state where the rotary table 107 is rotated from the state of FIGS. 14A and 14B shall now be considered. The rotation speed of the rotary table 107 shall be the liquid processing speed (of, for example, approximately 500 rpm). In the rotating state of the rotary table 107, the magnetic field generation region 129B (see FIG. 15A) is formed in the annular region through which pass the driving permanent magnets 156A and 156B that rotate in accordance with the rotation of the rotary table 107. A circumferential direction length (angle) of the magnetic field generation region 129B becomes longer than a circumferential direction length (angle) of the corresponding second opening permanent magnets 127. The circumferential direction length (angle) of each second opening permanent magnet 127 is 60° and moreover, three second opening permanent magnets 127 are provided in the circumferential direction of the rotary table 107, and therefore when the substrate W is rotated in the rotation direction Dr at the liquid processing speed (of, for example, approximately 500 rpm), the magnetic field generation region 129B (see FIG. 15A) of full circumferential annular shape is formed as shown in FIGS. 15A and 15B in the annular region through which pass the driving permanent magnets 156A and 156B that rotate in accordance with the rotation of the rotary table 107.

The attractive magnetic force from the second opening permanent magnets 127 acts on the second driving permanent magnets 156B regardless of the rotational orientation of the rotary table 107 because the magnetic field generation region 129B (see FIG. 15A) has the full circumferential annular shape. Therefore, in the rotating state of the rotary table 107, the three movable pins 110 included in the second movable pin group 112 are disposed at the open position (open). The three movable pins 110 included in the first movable pin group 111 are, needless to say, disposed at the hold position (close). In this state, the substrate W is supported by the three movable pins 110 included in the first movable pin group 111 and rotates satisfactorily.

By the controller 3 thus controlling the first elevating/lowering unit 126 and the second elevating/lowering unit 128 in the rotating state of the substrate W to switch between the state where the first opening permanent magnets 125 are disposed at the upper position and the second opening permanent magnets 127 are disposed at the lower position (see FIGS. 13A and 13B) and the state where the second opening permanent magnets 127 are disposed at the upper position and the first opening permanent magnets 127 are disposed at the lower position (see FIGS. 15A and 15B), switching between the state where the substrate W is contact-supported by the three movable pins 110 included in the first movable pin group 111 and the state where the substrate W is contact-supported by the three movable pins 110 included in the second movable pin group 112 can be performed.

Figure 16:
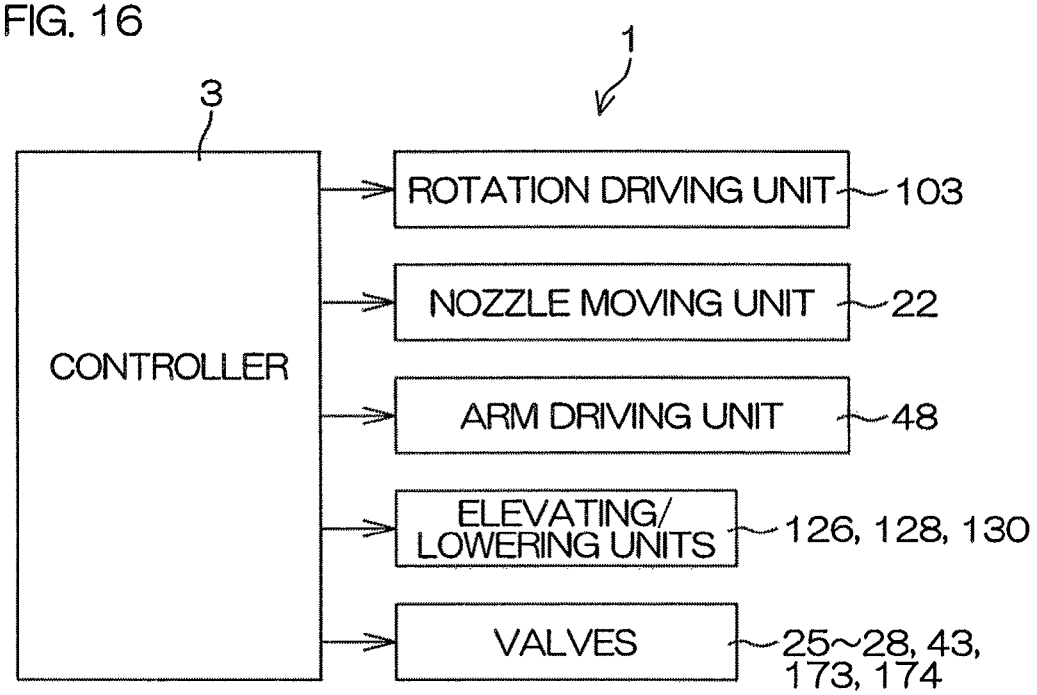
FIG. 16 is a block diagram for describing the electrical arrangement of a main portion of the substrate processing apparatus.

FIG. 16 is a block diagram for describing the electrical arrangement of a main portion of the substrate processing apparatus 1.

The controller 3 controls operations of the rotation driving unit 103, the nozzle moving unit 22, the arm driving unit 48, the first to third elevating/lowering units 126, 128, and 130, etc., in accordance with a program determined in advance. Further, the controller 3 controls opening/closing operations, etc., of the chemical liquid valve 15, the water valve 43, the inert gas valve 173, the inert gas flow control valve 174, etc.

Figure 17:
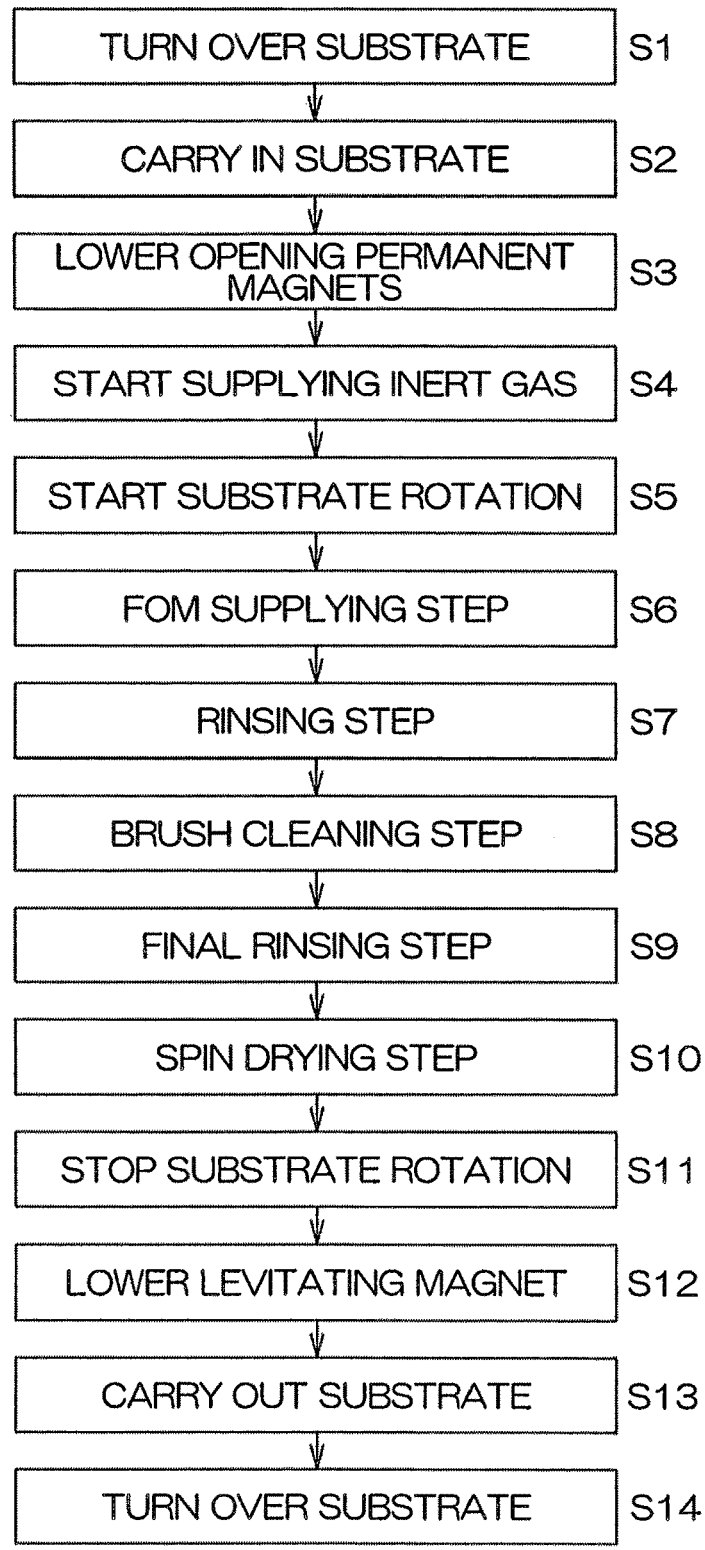
FIG. 17 is a flow diagram for describing an example of a processing liquid processing executed by the substrate processing apparatus.
Figure 18:
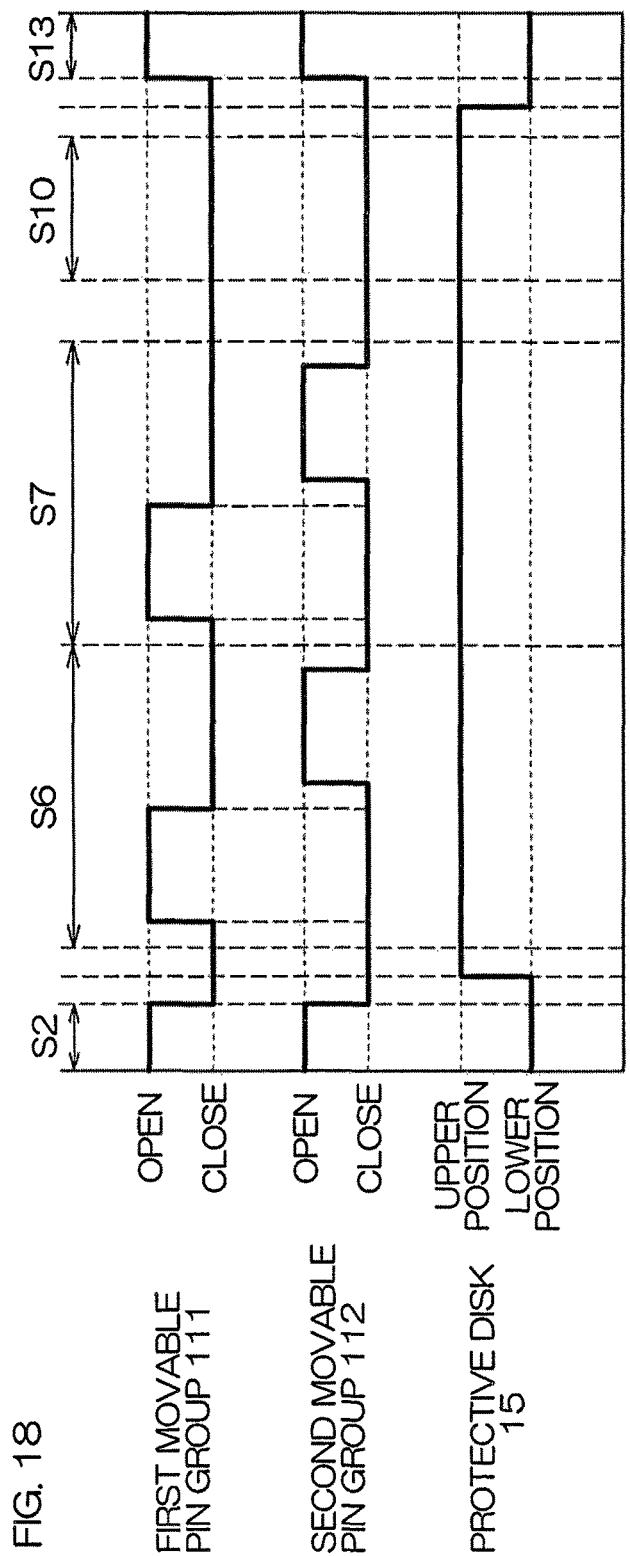
FIG. 18 is a time chart for describing the processing liquid processing.
Figure 19A:
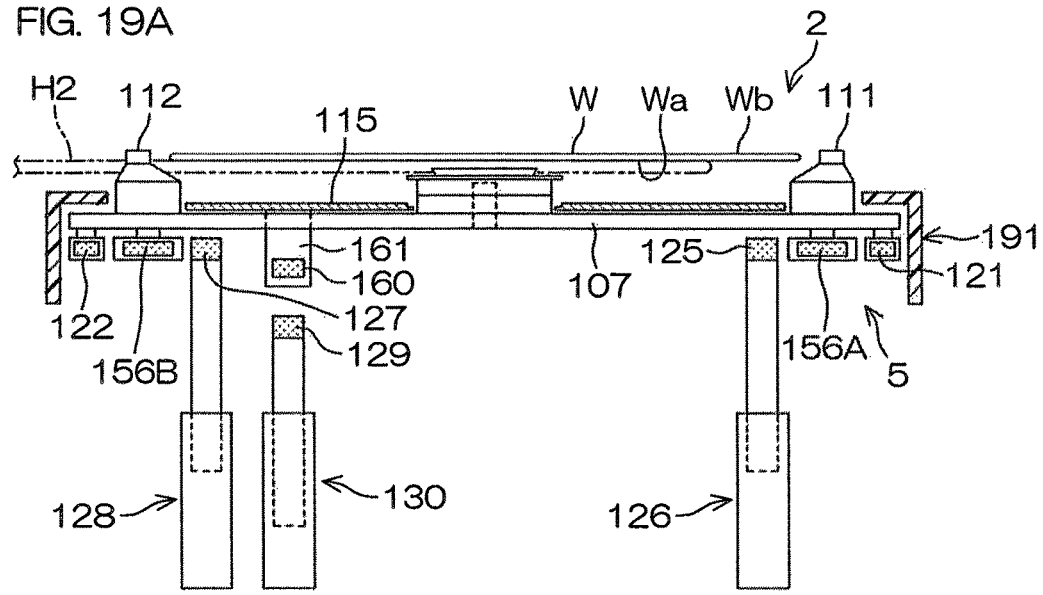
FIGS. 19A to 19K are illustrative diagrams for describing the example of the processing liquid processing.

FIG. 17 is a flow diagram for describing an example of a cleaning processing as a processing liquid processing executed by the processing unit 2. FIG. 18 is a time chart for describing the processing liquid processing. FIGS. 19A to 19K are illustrative diagrams for describing the example of the processing liquid processing. FIGS. 20A and 20B are diagrams of states of flowing around of the processing liquid when a movable pin 110 is at the hold position and when the movable pin 110 is at the open position, respectively. FIG. 20C is a sectional view of flows of the processing liquid and the inert gas at a peripheral edge portion of a substrate W.

The processing liquid processing shall now be described with reference to FIG. 1, FIG. 2 to FIG. 7, FIG. 17, and FIG. 18. Also, FIGS. 19A to 19K and FIGS. 20A to 20C shall be referenced as appropriate.

With the processing unit 2, the object of processing is a substrate (may hereinafter be referred to as an "uncleaned substrate") W after processing, for example, by a preprocessing apparatus, such as an annealing apparatus or film forming apparatus, etc. A circular silicon substrate can be cited as an example of the substrate W. The processing unit 2 cleans, for example, a rear surface Wb (one major surface, non-device-forming surface) at the opposite side of a front surface Wa (other major surface, device forming surface) of the substrate W.

A carrier C housing the uncleaned substrate W is transferred from the preprocessing apparatus to the substrate processing apparatus 1 and placed at a load port LP. The substrate W is housed in the carrier C in a state where the front surface Wa of the substrate W is faced upward. The controller 3 makes the substrate W, in the state where the front surface Wa is faced upward, be transferred by the indexer robot IR from the carrier C to the turnover unit TU. The controller 3 then makes the transferred substrate W be turned over by the turnover unit TU (S1: Turn over substrate). The rear surface Wb of the substrate W is thereby faced upward. Thereafter, by means of the hand H2 of the center robot CR, the controller 3 takes out the substrate W from the turnover unit TU and makes it be carried into the processing unit 2 in a state where the rear surface Wb is faced upward (step S2).

Prior to the carrying-in of the substrate W, the chemical liquid nozzle 6 is retracted to the home position set at the side of the spin chuck 5. The cleaning brush 10 is also retracted to the home position set at the side of the spin chuck 5. A rotation direction orientation of the rotary table 107 is determined so as to form the facing state where the angular positions of the respective first opening permanent magnets 125 and the respective first driving permanent magnets 156A face each other and the angular positions of the respective second opening permanent magnets 127 and the respective second driving permanent magnets 156B face each other. Also, both the first opening permanent magnets 125 and the second opening permanent magnets 127 are disposed at the upper position. The state at this point is as shown in FIGS. 11A and 11B. In this state, both the three movable pins 110 included in the first movable pin group 111 and the three movable pins 110 included in the second movable pin group 112, that is, all of the six movable pins 110 are disposed at the open position.

Also, the second levitating magnet 129 is disposed at the lower position and because the second levitating magnet 129 is therefore separated largely and below from the rotary table 107, the repulsive magnetic force acting between the second levitating magnet 129 and the first levitating magnets 160 is small. Therefore the protective disk 115 is positioned at the lower position of being close to the upper surface of the rotary table 107. A sufficient space enabling the entry of the hand H2 of the center robot CR is thus secured between the height of substrate holding by the movable pins 110 and the upper surface of the protective disk 115.

The hand H2 of the center robot CR transfers the substrate W to above the spin chuck 5 in a state of holding the substrate W at a position higher than the upper ends of the movable pins 110. Thereafter, the hand H2 of the center robot CR is lowered toward the upper surface of the rotary table 107 as shown in FIG. 19A.

Next, the controller 3 controls the first and second elevating/lowering units 126 and 128 to lower the first opening permanent magnets 125 and the second opening permanent magnets 127 toward the lower position and hold these at the lower position (step S3). The state at this point is as shown in FIGS. 10A and 10B. Therefore all of the movable pins 110 are thereby driven from the open position to the hold position and held at the hold position. The substrate W is thereby gripped by the six movable pins 110. The substrate W is held by the spin chuck 5 in the state where its front surface Wa is faced downward and its rear surface Wb is faced upward.

Thereafter, the hand H2 of the center robot CR passes between the movable pins 110 and retracts to the side of the spin chuck 5.

Figure 19B:
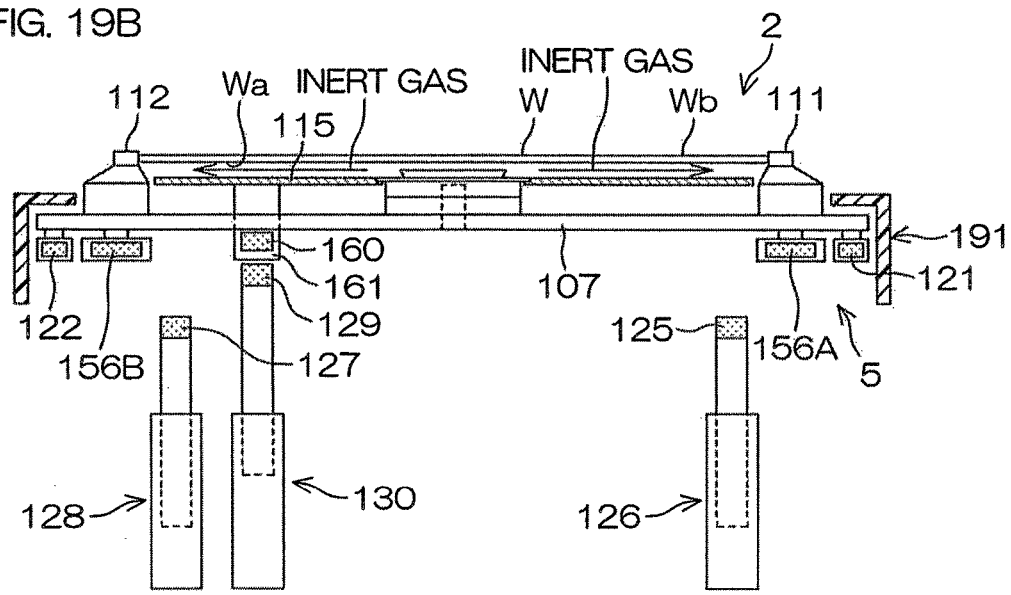
Figure 20A:
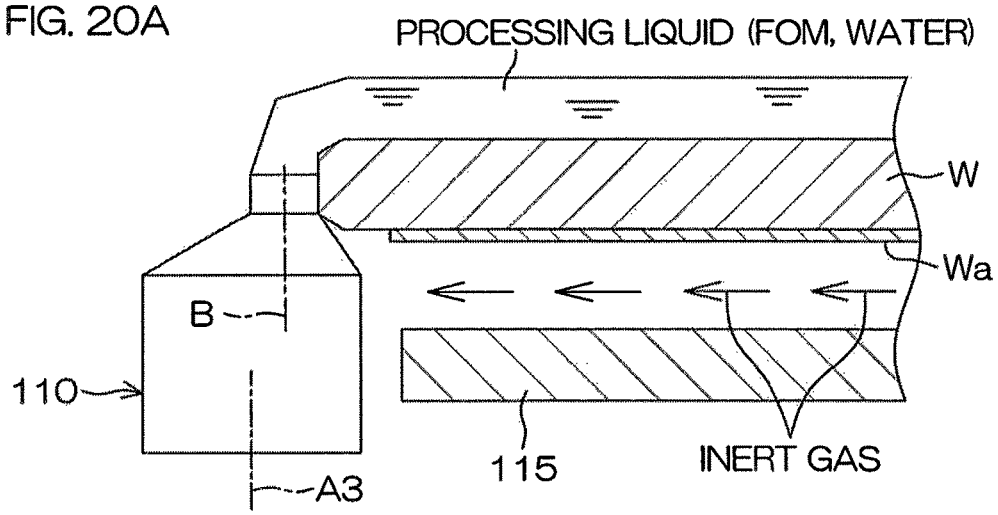
FIGS. 20A and 20B are diagrams of states of flowing around of a processing liquid when a movable pin is at a hold position and when the movable pin is at an open position, respectively.
Figure 20B:
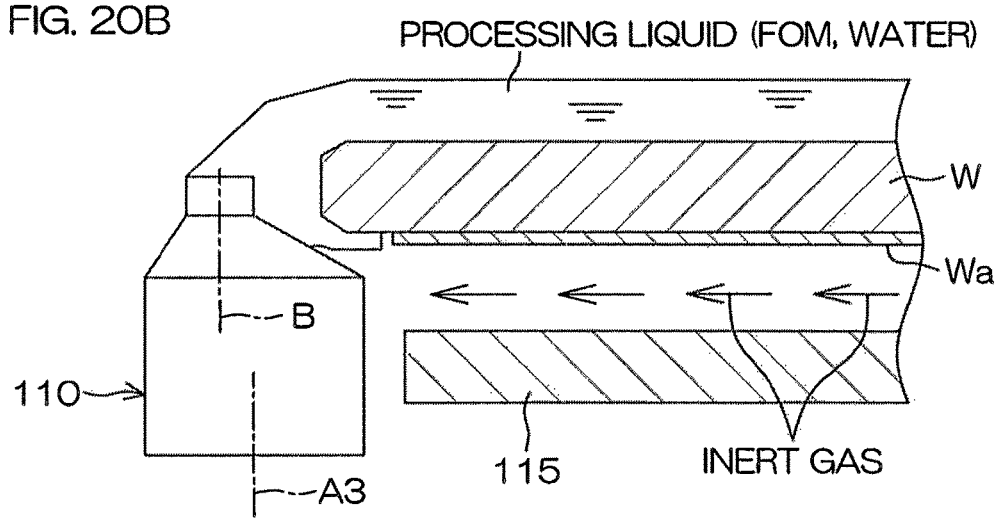
Figure 20C:
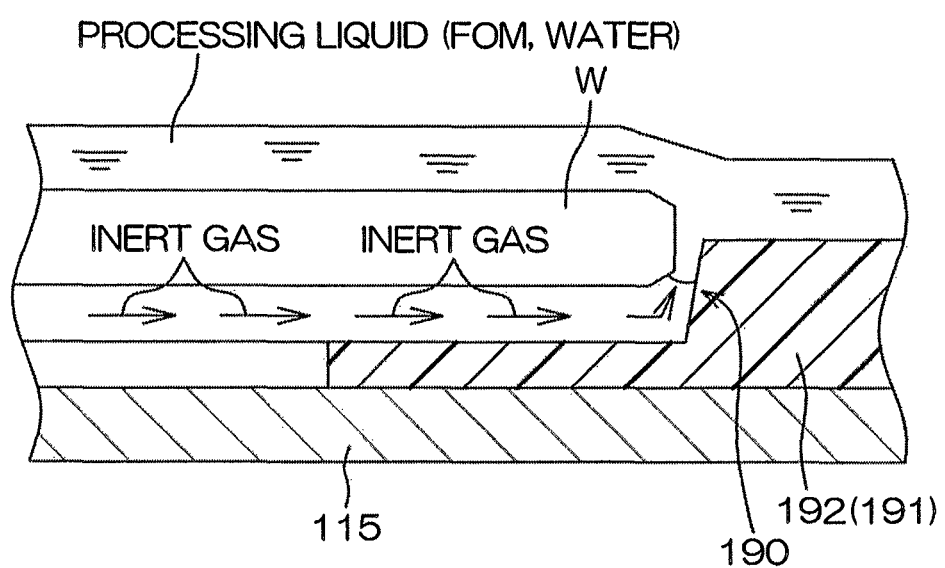
FIG. 20C is a sectional view of flows of the processing liquid and an inert gas at a peripheral edge portion of a substrate.

Also, the controller 3 controls the third elevating/lowering unit 130 to elevate the second levitating magnet 129 toward the upper position as shown in FIG. 19B. The distance between the levitating magnets 129 and 160 is reduced and the repulsive magnetic force acting therebetween increases accordingly. By the repulsive magnetic force, the protective disk 115 is levitated from the upper surface of the rotary table 107 toward the substrate W. When the first opening permanent magnets 125 reach the upper position, the protective disk 115 reaches the approach position of approaching the front surface Wa (lower surface) of the substrate W across a minute interval and the flange 120 formed at the lower end of the guide shaft 117 contacts the linear bearing 118. The protective disk 115 is thereby held at the approach position. In this state, the controller 3 opens the inert gas valve 173 to start supplying the inert gas as shown in FIG. 19B (S4: Start supplying inert gas). The supplied inert gas is discharged from the upper end of the inert gas supply pipe 170 and, by actions of the flow straightening member 186, etc., is blown out in a radial shape centered at the rotational axis A1 toward a narrow space between the protective disk 115 at the approach position and the front surface Wa (lower surface) of the substrate W.

Thereafter, the controller 3 controls the rotation driving unit 103 to start the rotation of the rotary table 107 (rotary table rotating step) and the substrate W is thereby rotated around the rotational axis A1 as shown in FIG. 19C (step S5). The rotation speed of the substrate W is increased to the liquid processing speed (within a range of 300 to 1500 rpm and, for example, 500 rpm) determined in advance and is maintained at the liquid processing speed.

After the rotation speed of the substrate W has reached the liquid processing speed, the controller 3 performs an FOM supplying step of supplying the FOM to the rear surface Wb of the substrate W as shown in FIG. 19C (processing liquid supplying step, step S6). In the FOM supplying step (S6), the controller 3 controls the nozzle moving unit 22 to move the chemical liquid nozzle 6 from the home position to the central position. The chemical liquid nozzle 6 is thereby disposed above the central portion of the substrate W. After the chemical liquid nozzle 6 has been disposed above the substrate W, the controller 3 opens the chemical liquid valve 15 to make the FOM be discharged from the discharge port of the chemical liquid nozzle 6 and land on the central portion of the rear surface Wb of the substrate W. The FOM supplied to the central portion of the rear surface Wb of the substrate W receives a centrifugal force due to the rotation of the substrate W and spreads radially toward the peripheral edge portion of the rear surface Wb of the substrate W. The FOM can thereby be made to spread across an entirety of the rear surface Wb of the substrate W.

In the FOM supplying step (S6), a silicon oxide film is formed on the rear surface Wb of the substrate W, which is a silicon substrate, by an oxidation action of the ozone contained in the FOM. Also, flaws (fragmenting, depressions, etc.) formed on the rear surface Wb of the substrate W are removed by an oxide film etching action of the hydrofluoric acid contained in the FOM, and foreign matter (particles, impurities, peeling of the rear surface Wb of the substrate W, etc.) is also removed from the rear surface Wb of the substrate W.

In the FOM supplying step (S6), the inert gas discharged from the upper end of the inert gas supply pipe 170 is blown out, by actions of the flow straightening member 186, etc., in the radial shape centered at the rotational axis A1 toward the narrow space between the protective disk 115 at the approach position and the front surface Wa (lower surface) of the substrate W. As shown in FIG. 20C, the inert gas is further accelerated by an orifice defined between the constricting portion 190, formed at the circular annular plate portion 192 of the circular annular cover 191 disposed at the peripheral edge portion of the protective disk 115, and the peripheral edge portion of the substrate W to form a high-speed, blowout gas stream at a side of the substrate W. In the present preferred embodiment, the inert gas is supplied, by use of the protective disk 115, to the front surface Wa (lower surface) of the substrate W not to completely prevent the flowing around of the processing liquid (chemical liquid or rinse liquid) to the front surface Wa (lower surface) of the substrate W but to intentionally make the processing liquid flow around just to a peripheral edge region (a minute range of approximately 1.0 mm from the peripheral end of the substrate W) of the front surface Wa (lower surface) of the substrate W to clean the peripheral edge region of the front surface Wa (lower surface). The flow-around amount is controlled precisely by forming the high-speed blowout gas stream. The flow-around amount depends on a supply flow rate of the processing liquid to the upper surface of the substrate W, a supply flow rate of the inert gas to the lower surface of the substrate W, the rotation speed of the substrate W, etc.

Also in the FOM supplying step (S6), the substrate W is supported by three movable pins 110 during execution of the step. Further, switching is performed between the state where the substrate W is contact-supported by the three movable pins 110 included in the first movable pin group 111 and the state where the substrate W is contact-supported by the three movable pins 110 included in the second movable pin group 112.

Specifically, when a prescribed period elapses from the start of discharge of FOM, the controller 3 controls the first elevating/lowering unit 126 to elevate the first opening permanent magnets 125, which were at the lower position until then, toward the upper position and hold these at the upper position as shown in FIG. 19D. The state in which the first opening permanent magnets 125 are disposed at the upper position and the second opening permanent magnets 127 are disposed at the lower position (see FIGS. 13A and 13B) is thereby entered and the three movable pins 110 included in the first movable pin group 111 are disposed at the open position from the hold position up to then. A state is thereby entered in which the substrate W is contact-supported by the three movable pins 110 included in the second movable pin group 112 (first magnet disposing step).

When a prescribed period (of, for example, 10 seconds) elapses from the elevating of the first opening permanent magnets 125, the controller 3 controls the first elevating/lowering unit 126 to lower the first opening permanent magnets 125 toward the lower position and hold these at the lower position as shown in FIG. 19C. The state in which both the first opening permanent magnets 125 and the second opening permanent magnets 127 are disposed at the lower position is thereby entered so that the three movable pins 110 included in the first movable pin group 111 are returned to the open position and a state is thereby entered in which the substrate W is contact-supported by the total of six movable pins 110 again.

Figure 19E:
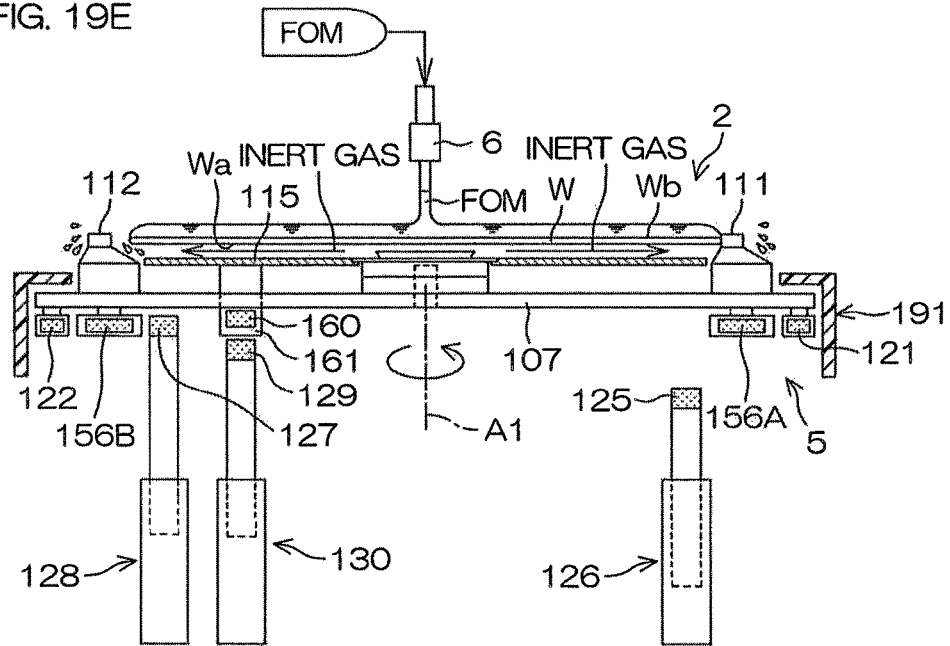

When a prescribed period (of, for example, 3 seconds) elapses from the lowering of the first opening permanent magnets 125, the controller 3 controls the second elevating/lowering unit 128 to elevate the second opening permanent magnets 127, which were at the lower position until then, toward the upper position and hold these at the upper position as shown in FIG. 19E. The state in which the second opening permanent magnets 127 are disposed at the upper position and the first opening permanent magnets 125 are disposed at the lower position (see FIGS. 15A and 15B) is thereby entered and the three movable pins 110 included in the second movable pin group 112 are disposed at the open position from the hold position up to then. A state is thereby entered in which the substrate W is contact-supported by the three movable pins 110 included in the first movable pin group 111 (second magnet disposing step).

When a prescribed period (of, for example, 10 seconds) elapses from the elevating of the second opening permanent magnets 127, the controller 3 controls the second elevating/ lowering unit 128 to lower the second opening permanent magnets 127 toward the lower position and hold these at the lower position. The state in which both the first opening permanent magnets 125 and the second opening permanent magnets 127 are disposed at the lower position is thereby entered so that the three movable pins 110 included in the second movable pin group 112 are returned to the open position and a state is thereby entered in which the substrate W is contact-supported by the total of six movable pins 110 again.

By thus switching between the state where the substrate W is contact-supported by just the first movable pin group 111 and the state where the substrate W is contact-supported by just the second movable pin group 112, the contact-support positions of the movable pins 110 at the peripheral edge portion of the substrate W in the rotating state can be changed in the FOM supplying step (S6).

The flowing around of the FOM at the predetermined support positions (six locations in the circumferential direction) of the movable pins 110 at the substrate W shall now be examined. In the state where a movable pin 110 is positioned at the hold position, the FOM supplied to the upper surface of the substrate W interferes with the upper shaft portion 152 in contact with the peripheral end surface of the substrate Was shown in FIG. 20A. Therefore, in the state where the movable pins 110 are positioned at the hold position at the predetermined support positions (six locations in the circumferential direction), the FOM supplied to the upper surface of the substrate W cannot be made to flow around to the peripheral edge region of the lower surface of the substrate W via the peripheral end surface of the substrate W.

On the other hand, in the state where the movable pin 110 is positioned at the open position, the prescribed gap is formed with respect to the peripheral end surface of the substrate Was shown in FIG. 20B. Via this gap, the FOM supplied to the upper surface of the substrate W can be made to flow around to the peripheral edge region of the lower surface of the substrate W via the peripheral end surface of the substrate W.

When a prescribed period elapses from the start of discharge of FOM, the FOM supplying step (S6) ends. Specifically, the controller 3 closes the chemical liquid valve 15 to stop the discharge of the FOM from the chemical liquid nozzle 6. Also, the controller 3 moves the chemical liquid nozzle 6 from the central position to the home position. The chemical liquid nozzle 6 is thereby retracted from above the substrate W.

Although in the above description of the FOM supplying step (S6), a case where the supporting of the substrate W by just the first movable pin group 111 and the supporting of the substrate W by just the second movable pin group 112 are performed once each was described, the supporting by one of either of the movable pin groups 111 and 112 may be performed a plurality of times in the FOM supplying step (S6).

Following the end of the FOM supplying step (S6), the supplying of water, which is the rinse liquid, to the rear surface Wb of the substrate W (S7: rinsing step, processing liquid supplying step) is started.

Figure 19F:
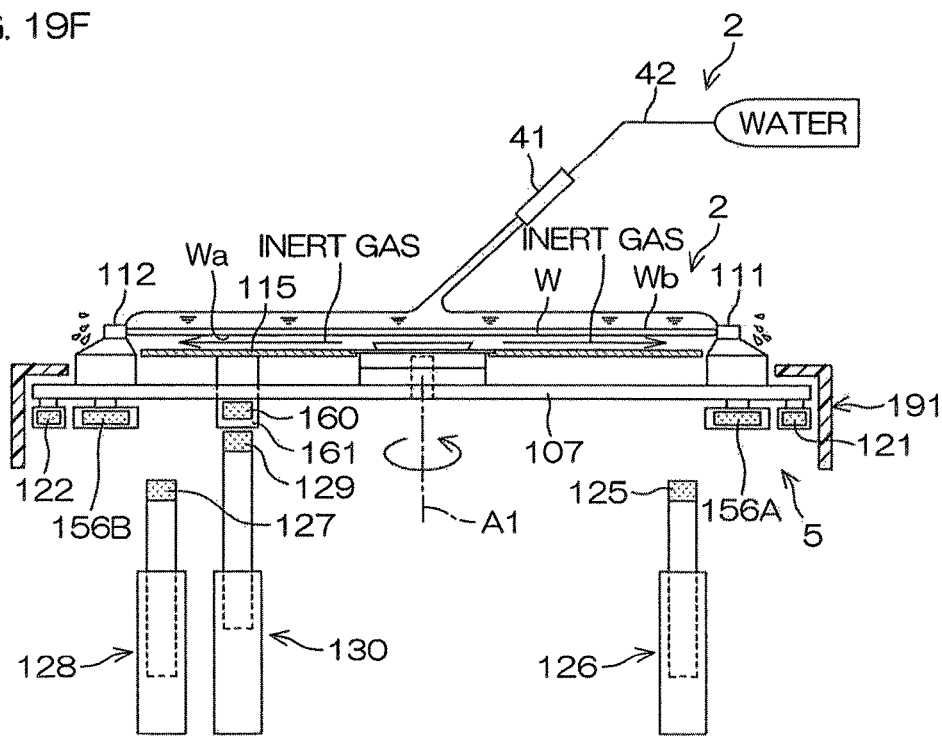

Specifically, the controller 3 opens the water valve 43 to make water be discharged from the water nozzle 41 toward the central portion of the rear surface Wb of the substrate W as shown in FIG. 19F. The water discharged from the water nozzle 41 lands on the central portion of the rear surface Wb of the substrate W that is covered by the FOM. The water that has landed on the central portion of the rear surface Wb of the substrate W receives the centrifugal force due to rotation of the substrate W and flows on the rear surface Wb of the substrate W toward the peripheral edge portion of the substrate W and spreads to the entirety of the rear surface Wb of the substrate W. The FOM on the substrate W is thus washed away outward by the water and expelled to a periphery of the substrate W. The FOM attached to the rear surface Wb of the substrate W is thereby replaced by the water.

Also in the rinsing step (S7), the substrate W is supported by three movable pins 110 during execution of the step. Further, switching is performed between the state where the substrate W is contact-supported by the three movable pins 110 included in the first movable pin group 111 and the state where the substrate W is contact-supported by the three movable pins 110 included in the second movable pin group 112.

Specifically, when a prescribed period elapses from the start of discharge of water, the controller 3 controls the first elevating/lowering unit 126 to elevate the first opening permanent magnets 125, which were at the lower position until then, toward the upper position and hold these at the upper position as shown in FIG. 19G. The state in which the substrate W is contact-supported by the three movable pins 110 included in the second movable pin group 112 is thereby entered (first magnet disposing step).

When a prescribed period (of, for example, 10 seconds) elapses from the elevating of the first opening permanent magnets 125, the controller 3 controls the first elevating/lowering unit 126 to lower the first opening permanent magnets 125 toward the lower position and hold these at the lower position as shown in FIG. 19F. The state in which the substrate W is contact-supported by the total of six movable pins 110 is thereby entered again.

Figure 19H:
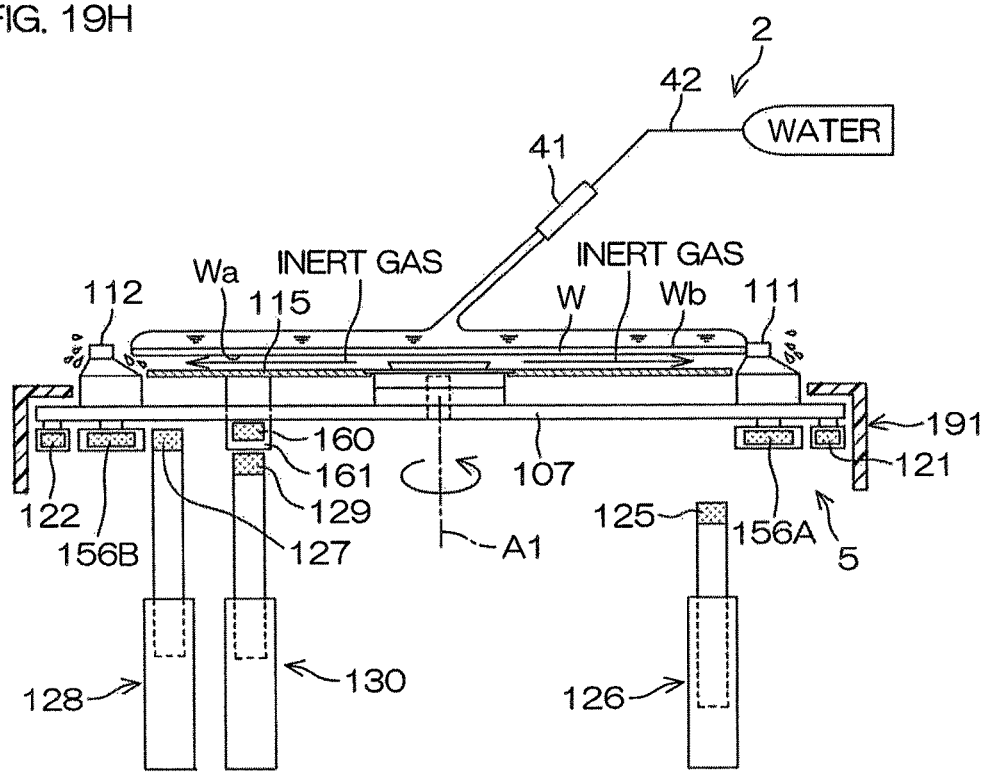
Figure 19:
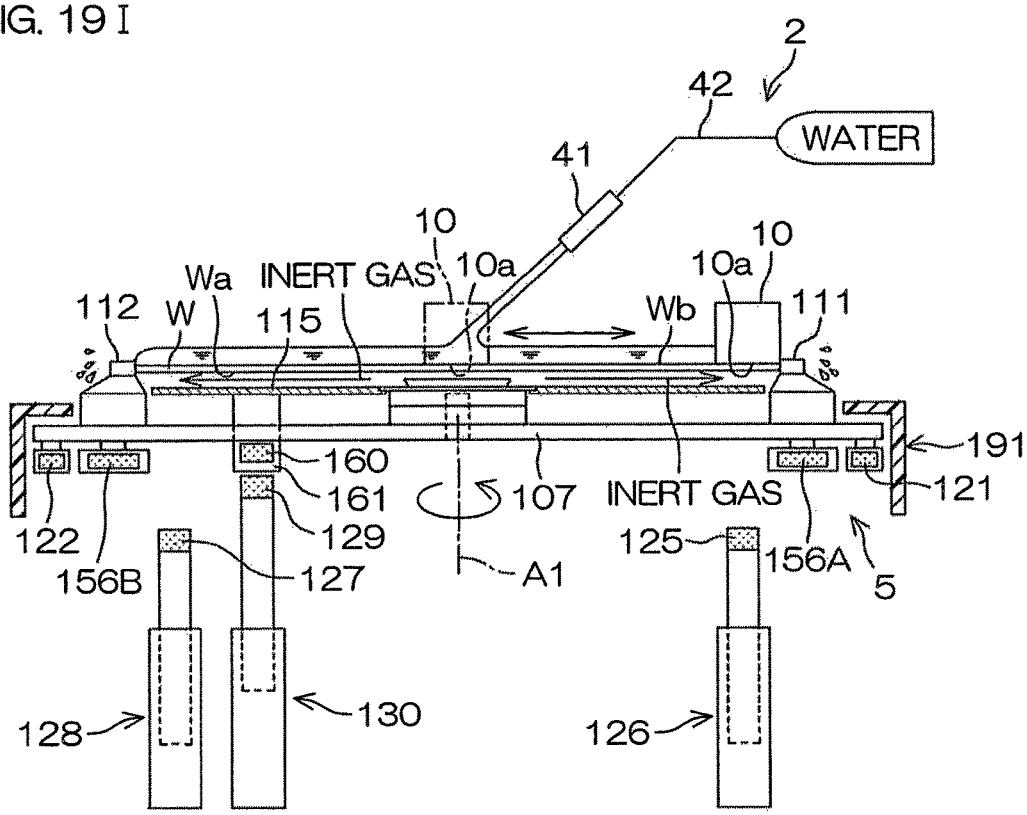
Figure 19:
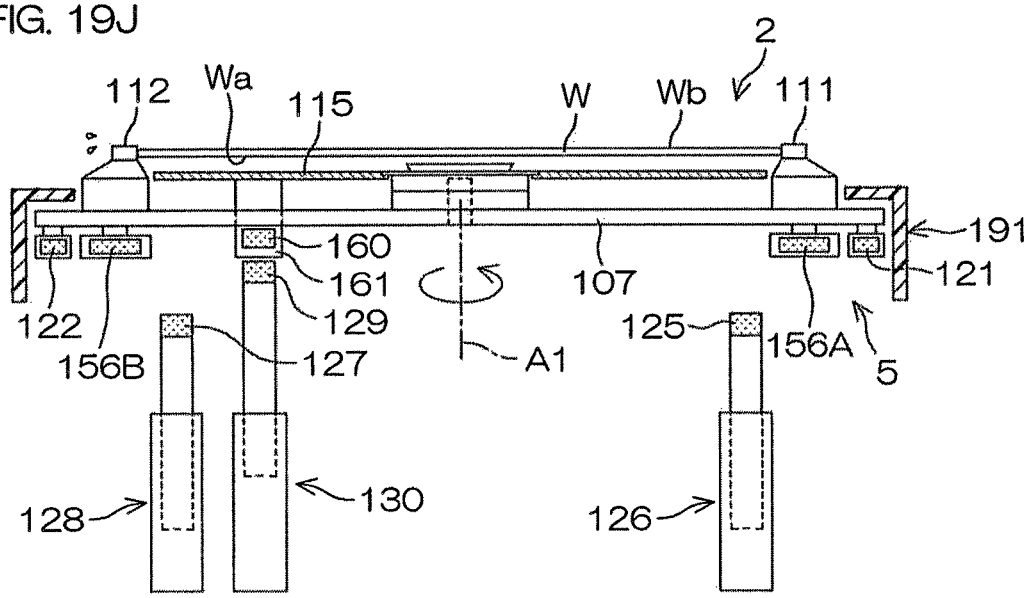
Figure 19K:
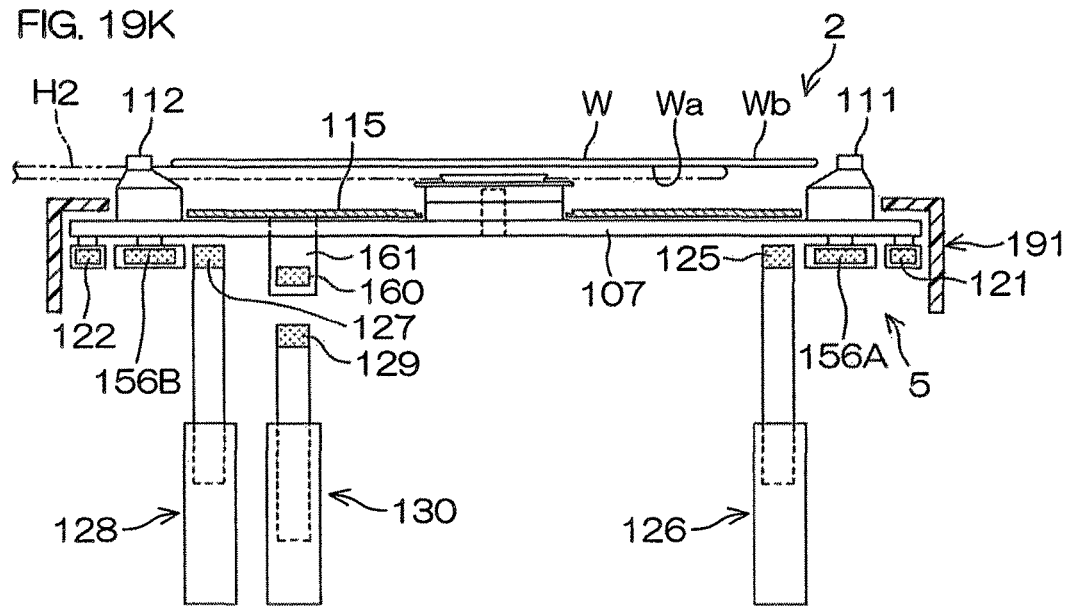

When a prescribed period (of, for example, 3 seconds) elapses from the lowering of the first opening permanent magnets 125, the controller 3 controls the second elevating/lowering unit 128 to elevate the second opening permanent magnets 127, which were at the lower position until then, toward the upper position and hold these at the upper position as shown in FIG. 19H. The state in which the substrate W is contact-supported by the three movable pins 110 included in the first movable pin group 111 is thereby entered (second magnet disposing step).

When a prescribed period (of, for example, 10 seconds) elapses from the elevating of the second opening permanent magnets 127, the controller 3 controls the second elevating/lowering unit 128 to lower the second opening permanent magnets 127 toward the lower position and hold these at the lower position. The state in which the substrate W is contact-supported by the total of six movable pins 110 is thereby entered again.

By thus switching between the state where the substrate W is contact-supported by just the first movable pin group 111 and the state where the substrate W is contact-supported by just the second movable pin group 112, the contact-support positions of the movable pins 110 at the peripheral edge portion of the substrate W in the rotating state can be changed in the rinsing step (S7).

The flowing around of the water at the predetermined support positions (six locations in the circumferential direction) of the movable pins 110 at the substrate W shall now be examined. In the state where a movable pin 110 is positioned at the hold position, the water supplied to the upper surface of the substrate W interferes with the upper shaft portion 152 in contact with the peripheral end surface of the substrate Was shown in FIG. 20A. Therefore, in the state where the movable pins 110 are positioned at the hold position at the predetermined support positions (six locations in the circumferential direction), the water supplied to the upper surface of the substrate W cannot be made to flow around to the peripheral edge region of the lower surface of the substrate W via the peripheral end surface of the substrate W.

On the other hand, in the state where the movable pin 110 is positioned at the open position, the prescribed gap is formed with respect to the peripheral end surface of the substrate W as shown in FIG. 20B. Via this gap, the water supplied to the upper surface of the substrate W can be made to flow around to the peripheral edge region of the lower surface of the substrate W via the peripheral end surface of the substrate W. The FOM attached to the peripheral end surface of the substrate W and the peripheral edge region of the lower surface of the substrate W can thereby be rinsed off.

Although in the above description of the rinsing step (S7), a case where the supporting of the substrate W by just the first movable pin group 111 and the supporting of the substrate W by just the second movable pin group 112 are performed once each was described, the supporting by one of either of the movable pin groups 111 and 112 may be performed a plurality of times in the rinsing step (S7).

When a prescribed period elapses from the start of discharge of water, the controller 3 controls the arm driving unit 48 to execute scrub cleaning of the rear surface Wb of the substrate W by the cleaning brush 10 as shown in FIG. 19F (S8: brush cleaning step, processing liquid supplying step). Scrub cleaning by the cleaning brush 10 while supplying water is thereby performed on the rear surface Wb of the substrate W. Specifically, the controller 3 controls the arm driving unit 48 to swing the swinging arm 47 around the swinging axis A2 to dispose the cleaning brush 10 from the home position to above the substrate W and lowers the cleaning brush 10 to press the cleaning surface 10a of the cleaning brush 10 against the rear surface Wb of the substrate W. The controller 3 then controls the arm driving unit 48 to move (scan) the pressing position of the cleaning brush 10 between the central portion of the substrate W and the peripheral edge portion of the substrate W as shown in FIG. 19I. The pressing position of the cleaning brush 10 is thereby made to scan the entirety of the rear surface Wb of the substrate W and the entirety of the rear surface Wb of the substrate W is scrubbed by the cleaning brush 10. In the brush cleaning step (S8), the foreign matter peeled in the FOM supplying step (S6) is scrubbed off by the scrubbing by the cleaning brush 10. The foreign matter scrubbed off by the cleaning brush 10 is then rinsed off by the water. The peeled foreign matter can thereby be removed from the rear surface Wb of the substrate W.

After the reciprocating movement of the cleaning brush 10 has been performed the prescribed number of times (for example, four times), the controller 3 controls the arm driving unit 48 to return the cleaning brush 10 from above the spin chuck 5 to the home position. The brush cleaning step (S8) is thereby ended. Also, the controller 3 maintains the water valve 43 in the state in which it is kept open. Water, which is the rinse liquid, is thereby supplied to the rear surface Wb of the substrate W and the foreign matter scrubbed off by the cleaning brush 10 is expelled off the substrate W (see FIG. 19I, S9: final rinsing step, processing liquid supplying step).

Although the case was described where the supporting of the substrate W by just the first movable pin group 111 and the supporting of the substrate W by just the second movable pin group 112, which were described in regard to the rinsing step (S7), are performed once each, it suffices that such supporting be performed at least in one step among the rinsing step (S7), the brush cleaning step (S8), and the final rinsing step (S9). Obviously, it may be performed in all three steps and may be performed in two steps among the steps.

When a prescribed period elapses from the start of supplying of water, the controller 3 closes the water valve 43 to stop the discharge of water from the water nozzle 41. Also, the controller 3 closes the inert gas valve 173 to stop the discharge of inert gas from the inert gas supply pipe 170. Also, the controller 3 controls the first elevating/lowering unit 126 to lower the first opening permanent magnets 125 to the lower position. Subsequently, the substrate W is clamped by the six movable pins 110 and the substrate W is thereby held firmly.

Next, a spin drying step (step S10) of drying the substrate W is performed. Specifically, the controller 3 controls the rotation driving unit 17 to accelerate the substrate W to a drying rotation speed (of, for example, several thousand rpm) greater than the rotation speed from the FOM supplying step (S6) to the final rinsing step (S9) and rotate the substrate W at the drying rotation speed as shown in FIG. 19J. A large centrifugal force is thereby applied to the liquid on the substrate W and the liquid attached to the substrate W is spun off to the periphery of the substrate W. The liquid is thereby removed from the substrate W and the substrate W dries. In this process, the substrate W is gripped by the six movable pins 110 and the substrate W can thus be rotated at high speed while holding the substrate W firmly.

When a prescribed period elapses from the start of high speed rotation of the substrate W, the controller 3 controls the rotation driving unit 17 to stop the rotation of the substrate W by the spin chuck 5 (step S11).

Thereafter, the controller 3 controls the third elevating/lowering unit 130 to lower the second levitating magnet 129 to the lower position (step S12). The distance between the second levitating magnet 129 and the first levitating magnets 160 is thereby increased and the magnetic repulsive force therebetween decreases. Accordingly, the protective disk 115 is lowered towards the upper surface of the rotary table 107. Enough space enabling the entry of the hand H2 of the center robot CR is thereby secured between the upper surface of the protective disk 115 and the front surface Wa (lower surface) of the substrate W.

Also, the controller 3 controls the first and second elevating/lowering units 126 and 128 to elevate the first opening permanent magnets 125 and the second opening permanent magnets 127 respectively to the upper position and hold these at the upper position. All of the six movable pins 110 are thereby disposed at the open position and the gripping of the substrate W is thereby released.

Next, the substrate W is carried out from inside the processing chamber 4 (step S13). Specifically, in the state where all nozzles, etc., are retracted from above the spin chuck 5, the controller 3 controls the center robot CR to make the hand H2 enter into the space secured between the protective disk 115 and the front surface Wa (lower surface) of the substrate Was shown in FIG. 19K. The hand H2 then lifts up the substrate W held by the movable pins 110 and thereafter retracts to the side of the spin chuck 5. The cleaning-processed substrate W is thereby carried out of the processing chamber 4.

The controller 3 transfers the cleaning-processed substrate W to the turnover unit TU by means of the hand H2 of the center robot CR. The controller 3 then turns over the transferred substrate W by means of the turnover unit TU (step S14). The front surface Wa of the substrate W is thereby faced upward. Thereafter, the controller 3 takes out the substrate W from the turnover unit TU by means of the hand H1 of the indexer robot IR and houses the cleaning-processed substrate W, in the state where its front surface Wa is faced upward, in a carrier C. The carrier C in which the cleaning-processed substrate W is housed is transferred from the substrate processing apparatus 1 toward a post-processing apparatus, such as an exposure apparatus, etc.

By the above, the substrate W is supported by three movable pins 110 and further, switching between the state where the substrate W is contact-supported by the three movable pins 110 included in the first movable pin group 111 and the state where the substrate W is contact-supported by the three movable pins 110 included in the second movable pin group 112 is performed in parallel to the rotation of the rotary table 107 and the supplying of the processing liquid (S6 to S9 of FIG. 11) in the present preferred embodiment. By means of the two movable pin groups 111 and 112, the holding of the substrate W can be changed, and the positions of the substrate W that are contact-supported by the movable pins 110 can thereby be changed. It is therefore possible to supply the processing liquid (FOM, water) to the entirety of the peripheral edge portion of the substrate W and the peripheral edge portion of the substrate W can thereby be processed satisfactorily using the processing liquid without any unprocessed portions remaining.

Also, the substrate processing apparatus 1 according to the first preferred embodiment of the present invention differs from a substrate processing apparatus disclosed in US2008/0127888 A1 in the following two points.

The first point shall now be explained. In US2008/0127888 A1, each magnet has a magnetic pole direction aligned with an up/down direction. Also, the magnets, first pins, and second pins are coupled via a cam mechanism. That is, the arrangement for performing opening/closing driving of the first pins and second pins is extremely complex.

In contrast, with the first preferred embodiment, the first driving permanent magnets 156A and the second driving permanent magnets 156B have magnetic pole directions with respect to a direction orthogonal to an axis aligned with the rotational axis A1. Also, the first driving permanent magnets 156A and the second driving permanent magnets 156B are fixed to the support shafts 155 of the movable pins 110. The arrangement for performing opening/closing driving of the movable pins 110 can thus be realized with a simple arrangement.

The second point shall now be explained. In US2008/0127888 A1, each magnet has an annular shape. The magnets must thus be provided in a double annular shape and therefore the substrate processing apparatus 1 may become large in a radial direction. In contrast, with the first preferred embodiment, the first driving permanent magnets 156A and the second driving permanent magnets 156B are disposed alternately in the circumferential direction. The substrate processing apparatus 1 can thus be made compact in a radial direction.

Figure 21:
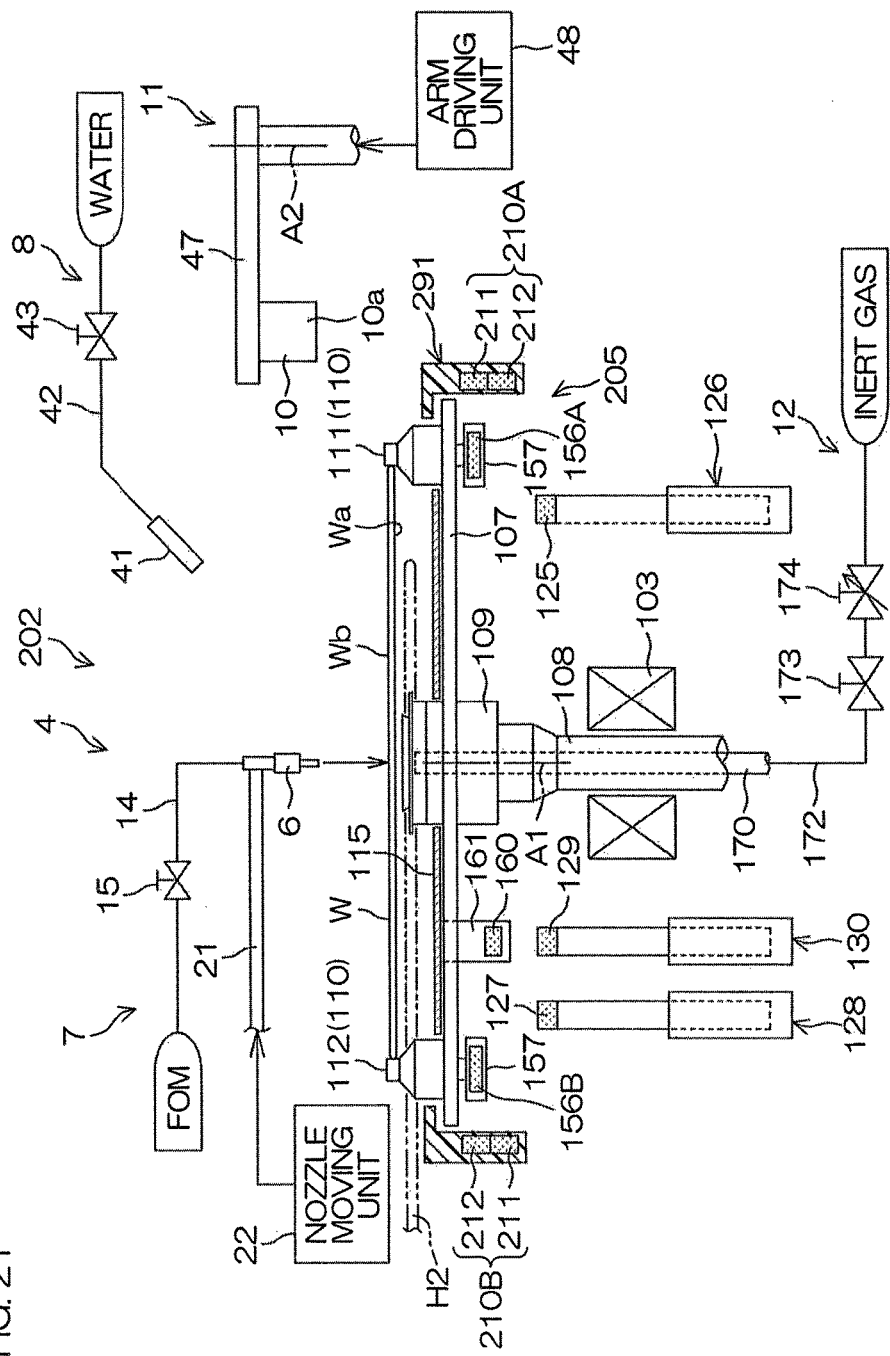
FIG. 21 is an illustrative sectional view for describing an arrangement example of a processing unit according to a second preferred embodiment of the present invention.
Figure 22:
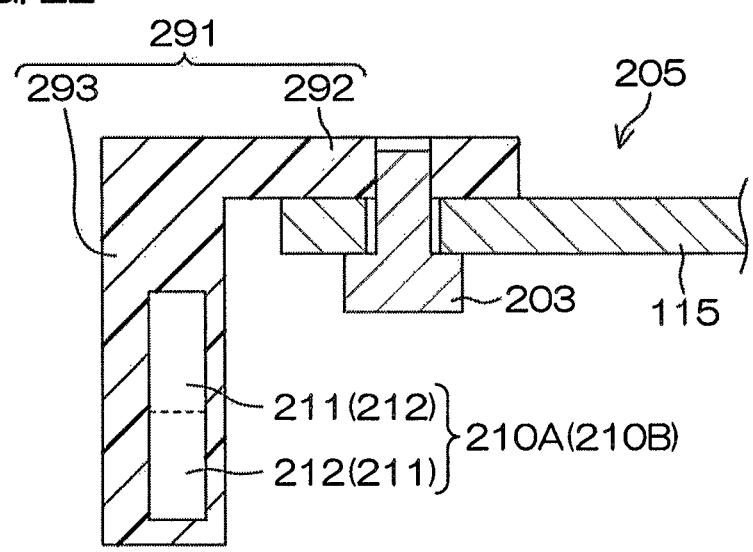
FIG. 22 is a sectional view for describing an arrangement example of a circular annular cover of a spin chuck included in the processing unit.
Figure 23:
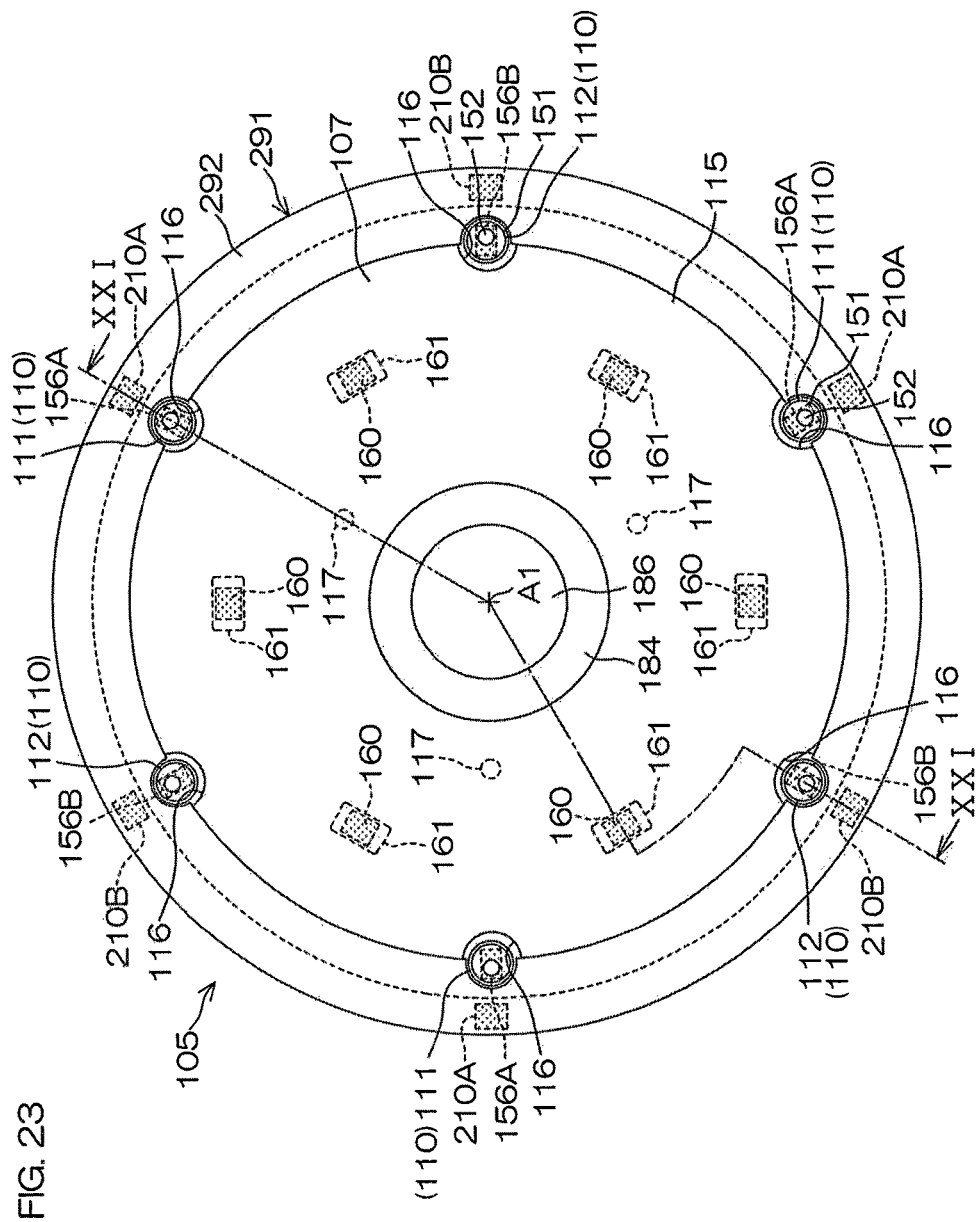
FIG. 23 is a plan view for describing a more specific arrangement of the spin chuck.

FIG. 21 is an illustrative sectional view for describing an arrangement example of a processing unit 202 according to a second preferred embodiment of the present invention. FIG. 22 is a sectional view for describing an arrangement example of a circular annular cover 291 of a spin chuck 205 included in the processing unit 202. FIG. 23 is a plan view for describing a more specific arrangement of the spin chuck 205. FIG. 21 is a view taken along section line XXI-XXI of FIG. 23.

With the second preferred embodiment, portions corresponding to respective portions indicated in the first preferred embodiment shall be provided with the same reference symbols as in the case of FIG. 1 to FIG. 20C and description thereof shall be omitted.

The processing unit 202 according to the second preferred embodiment includes a spin chuck 205 as a substrate holding/rotating device. The spin chuck 205 according to the second preferred embodiment differs from the spin chuck 5 according to the first preferred embodiment in the point that, as urging magnets (first and second urging magnets), open/close switching permanent magnets 210A and 210B are provided so as to be capable of being elevated and lowered together with the protective disk 115. Also, in accordance with the elevating and lowering operations of the protective disk 115 by the third elevating/lowering unit 130, the open/close switching permanent magnets 210A and 210B are elevated and lowered thereby. Further, the open/close switching permanent magnets 210A and 210B are magnets that are not arranged to urge the movable pins 110 to one or the other of the hold position and the open position but are magnets arranged to perform switching between a state of urging to the hold position and a state of urging to the open position. That is, an arrangement is adopted where switching between opening and closing of the movable pins 110 can be performed by elevating and lowering the protective disk 115 by means of the third elevating/lowering unit 130.

More specifically, the circular annular cover 291 is fixed to the protective disk 115 and the open/close switching permanent magnets 210A and 210B are embedded in the circular annular cover 291.

The circular annular cover 291 of circular annular shape protects the peripheral edge portion of the upper surface of the protective disk 115 and the peripheral end of the protective disk 115. The circular annular cover 291 of circular annular shape is mounted, via a fixing unit 203 that includes a fastening member, such as a bolt, etc., to an outer peripheral portion of the protective disk 115. It is made the peripheral edge portion of the upper surface of the protective disk 115 and the peripheral end of the protective disk 115. The circular annular cover 291 includes a circular annular plate portion 292 protruding in horizontal directions and outward in radial directions from a peripheral edge portion of its upper surface, and a circular cylindrical portion 293 extending downward from a peripheral end of the circular annular plate portion 292. An outer periphery of the circular annular plate portion 292 is disposed further outward than a peripheral end of the rotary table 107. The circular annular plate portion 292 and the circular cylindrical portion 293 are formed integrally using, for example, a resin material having chemical resistance. Notches 294 (see FIG. 23), arranged to avoid the movable pins 110, are formed at positions of an inner periphery of the circular annular plate portion 292 corresponding to the movable pins 110. The notches 294 are formed so as to border the movable pins 110 with fixed intervals being secured from the outer peripheral surfaces of the movable pins 110. The circular annular plate portion 292 and the circular cylindrical portion 293 are formed integrally using, for example, a resin material having chemical resistance.

The circular annular plate portion 292 of the circular annular cover 291 has, on its upper surface, a constricting portion 290 (same as the constricting portion 190 of FIG. 20C) that constricts the flow passage of the inert gas at the peripheral edge portion of the substrate W held by the movable pins 110. By the constricting portion 290, the flow speed of the inert gas flow blowing outward from the space between the circular annular cover 291 and the lower surface of the substrate W is made high, thereby enabling reliable avoidance or suppression of entry of the processing liquid (chemical liquid or rinse liquid) on the upper surface of the substrate W further inward than the peripheral edge portion of the lower surface of the substrate W.

The same number of open/close switching permanent magnets 210A and 210B as the number of movable pins 110 (six, in the present preferred embodiment) are embedded in the circular cylindrical portion 293. The plurality of open/close switching permanent magnets 210A and 210B are disposed at intervals in the circumferential direction. Each of the open/close switching permanent magnets 210A and 210B has a rod shape and is embedded in the circular cylindrical portion 293 in a state of extending in the up/down direction. The open/close switching permanent magnets include the first open/close switching permanent magnets (first urging magnets) 210A and the second open/close switching permanent magnets (second urging magnets) 210B that are made opposite in polarity in the up/down direction with respect to the first open/close switching permanent magnets 210A. The first open/close switching permanent magnets 210A are permanent magnets arranged to drive the movable pins 110 included in the first movable pin group 111, and the second open/close switching permanent magnets 210B are permanent magnets arranged to drive the movable pins 110 included in the second movable pin group 112. That is, the plurality of open/close switching permanent magnets 210A and 210B are disposed at equal intervals. Also, the first open/close switching permanent magnets 210A and the second open/close switching permanent magnets 210B are disposed alternately in the circumferential direction. In the present preferred embodiment, each of the first open/close switching permanent magnets 210A has an N pole portion 211, exhibiting N polarity, formed at an upper end side and an S pole portion 212, exhibiting S polarity, formed at a lower end side.

FIGS. 24A and 24B are schematic views of states of a movable pin 110, included in the first movable pin group 111, in accordance with elevating/lowering operations of the protective disk 115. FIGS. 25A and 25B are schematic views of states of a movable pin 110, included in the second movable pin group 112, in accordance with the elevating/lowering operations of the protective disk 115. FIGS. 24A and 25A show states in which the protective disk 115 is at the approach position (that is, the upper position), and FIGS. 24B and 25B show states in which the protective disk 115 is at the lower position.

As shown in FIGS. 24A and 24B, each first open/close switching permanent magnet 210A is disposed so that the N pole portion 211 at the upper end side approaches a first driving permanent magnet 156A in the state where the protective disk 115 is at the approach position and the S pole portion 212 at the lower end side approaches the first driving permanent magnet 156A in the state where the protective disk 115 is at the lower position.

As shown in FIGS. 25A and 25B, each second open/close switching permanent magnet 210B is disposed so that the S pole portion 212 at the upper end side approaches a second driving permanent magnet 156B in the state where the protective disk 115 is at the approach position and the N pole portion 211 at the lower end side approaches the second driving permanent magnet 156B in the state where the protective disk 115 is at the lower position.

As mentioned above in regard to the first preferred embodiment, when the second levitating magnet 129 is at the upper position (see FIG. 19B, FIG. 24B, and FIG. 25B), the protective disk 115 is held at the approach position, where it approaches the lower surface of the substrate W, by the action of the repulsive magnetic force generated between the second levitating magnet 129 and the first levitating magnets 160. On the other hand, when the second levitating magnet 129 is at the lower position (see FIG. 19A, FIG. 24A, and FIG. 25A) separated downward from the upper position, the repulsive magnetic force between the second levitating magnet 129 and the first levitating magnets 160 is small and therefore the protective disk 115 is maintained by its own weight at the lower position close to the upper surface of the rotary table 107.

In the state where the protective disk 115 is at the lower position, the N pole portion 211 at the upper end side of each first open/close switching permanent magnet 210A approaches a first driving permanent magnet 156A as shown in FIG. 24A. In this state, just the magnetic force from the N pole portion 211 within the first open/close switching permanent magnet 210A acts on the first driving permanent magnet 156A and the magnetic force from the S pole portion 212 does not act on the first driving permanent magnet 156A. Therefore, upon receiving the magnetic force from the first open/close switching permanent magnet 210A, the first driving permanent magnet 156A is disposed in an orientation such that the N pole faces inward in a radial direction of the rotary table 107 and the S pole faces outward in the radial direction of the rotary table 107 as shown in FIG. 24A. In this state, the upper shaft portion 152 of each movable pin 110, included in the first movable pin group 111, is positioned at the open position that is far apart from the rotational axis A1 (see FIG. 21).

Also in the present state (state in which the protective disk 115 is at the lower position), the S pole portion 212 at the upper end side of each second open/close switching permanent magnet 210B approaches a second driving permanent magnet 156B as shown in FIG. 25A. In this state, just the magnetic force from the S pole portion 212 within the second open/close switching permanent magnet 210B acts on the second driving permanent magnet 156B and the magnetic force from the N pole portion 211 does not act on the second driving permanent magnet 156B. Therefore, upon receiving the magnetic force from the second open/close switching permanent magnet 210B, the second driving permanent magnet 156B is disposed in an orientation such that the S pole faces inward in a radial direction of the rotary table 107 and the N pole faces outward in the radial direction of the rotary table 107 as shown in FIG. 25A. In this state, the upper shaft portion 152 of each movable pin 110, included in the second movable pin group 112, is positioned at the open position that is far apart from the rotational axis A1 (see FIG. 21).

From the state shown in FIG. 24A and FIG. 25A, the second levitating magnet 129 (see FIG. 21) is elevated to levitate the protective disk 115. In accordance with the levitation of the protective disk 115, the first and second open/close switching permanent magnets 210A and 210B are also elevated.

In the state where the protective disk 115 is disposed at the approach position, the S pole portion 212 at the lower end side of each first open/close switching permanent magnet 210A approaches a first driving permanent magnet 156A as shown in FIG. 24B. In this state, just the magnetic force from the S pole portion 212 within the first open/close switching permanent magnet 210A acts on the first driving permanent magnet 156A and the magnetic force from the N pole portion 211 does not act on the first driving permanent magnet 156A. Therefore, upon receiving the magnetic force from the first open/close switching permanent magnet 210A, the first driving permanent magnet 156A is disposed in an orientation such that the S pole faces inward in a radial direction of the rotary table 107 and the N pole faces outward in the radial direction of the rotary table 107 as shown in FIG. 24B. In this state, the upper shaft portion 152 of each movable pin 110, included in the first movable pin group 111, moves to the hold position closer to the rotational axis A1 than the open position. Consequently, the movable pins 110 included in the first movable pin group 111 are urged to the hold position.

Also in the present state (state in which the protective disk 115 is disposed at the approach position), the N pole portion 211 at the lower end side of each second open/close switching permanent magnet 2103 approaches a second driving permanent magnet 156B as shown in FIG. 25B. In this state, just the magnetic force from the N pole portion 211 within the second open/close switching permanent magnet 210B acts on the second driving permanent magnet 156B and the magnetic force from the S pole portion 212 does not act on the second driving permanent magnet 156B. Therefore, upon receiving the magnetic force from the second open/close switching permanent magnet 210B, the second driving permanent magnet 156B is disposed in an orientation such that the N pole faces inward in a radial direction of the rotary table 107 and the S pole faces outward in the radial direction of the rotary table 107 as shown in FIG. 25B. In this state, the upper shaft portion 152 of each movable pin 110, included in the second movable pin group 112, moves to the hold position closer to the rotational axis A1 than the open position. Consequently, the movable pins 110 included in the second movable pin group 112 are urged to the hold position.

Figure 26:
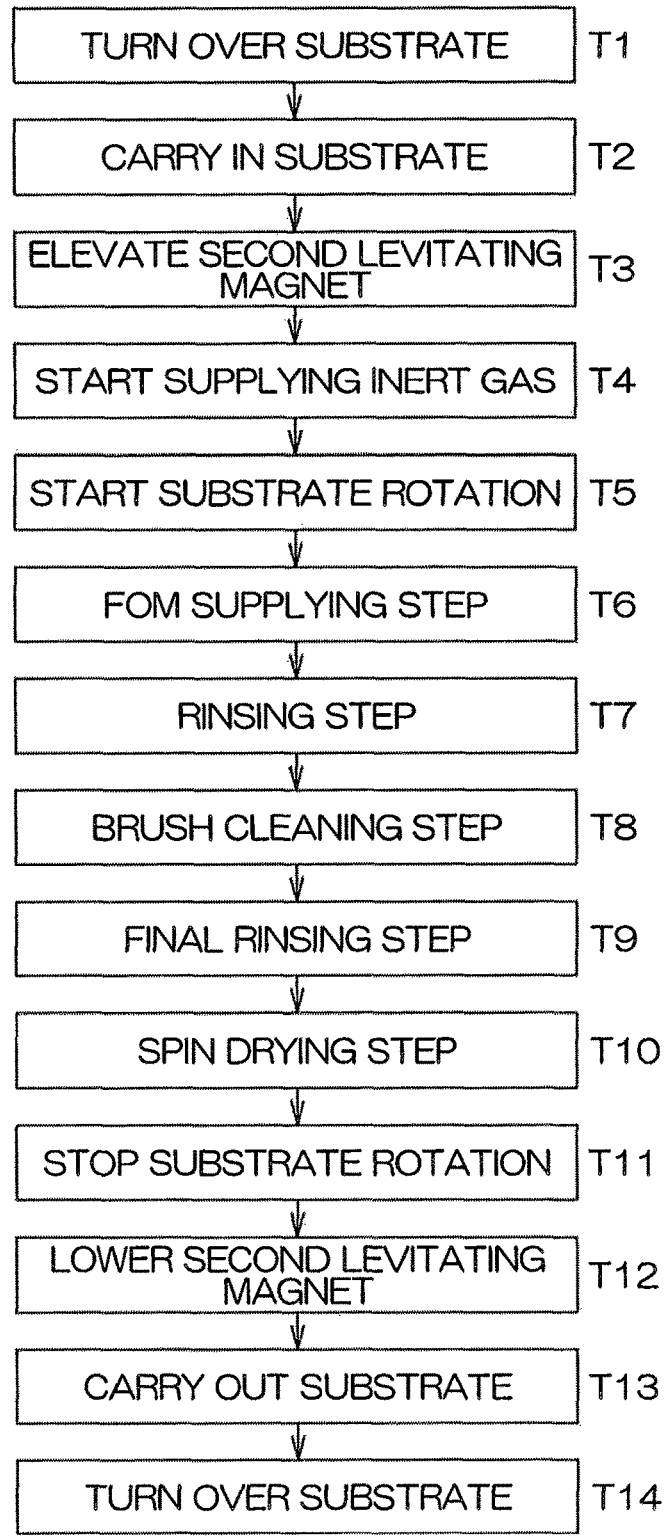
FIG. 26 is a flow diagram for describing an example of a processing liquid processing executed by the substrate processing apparatus.

Processing equivalent to the processing liquid processing (for example, the cleaning processing) illustrated in FIG. 17 and FIG. 18 is executed in the processing unit 202 according to the second preferred embodiment as well. FIG. 26 is a flow diagram for describing an example of a cleaning processing as a processing liquid processing executed by the processing unit 202.

The processing liquid processing shall now be described with reference to FIG. 21, FIG. 23, FIGS. 24A and 24B, FIGS. 25A and 24B, and FIG. 26. Also, FIGS. 27A to 27K shall be referenced as appropriate.

The processing unit 202 cleans a rear surface Wb (one major surface, non-device-forming surface) at the opposite side of a front surface Wa (other major surface, device forming surface) of a circular uncleaned substrate, such as a silicon substrate, etc.

After being turned over by the turnover unit TU (T1: Turn over substrate), the substrate W is carried, by the hand H2 of the center robot CR, into the processing unit 2 in the state where the rear surface Wb is faced upward (step T2). The processes of steps T1 and T2 are processes respectively equivalent to those of steps S1 and S2 shown in FIG. 17 and description thereof shall thus be omitted.

In the state prior to the carrying-in of the substrate W, the second levitating magnet 129 is disposed at the lower position and because the second levitating magnet 129 is therefore separated largely and below from the rotary table 107, the repulsive magnetic force acting between the second levitating magnet 129 and the first levitating magnets 160 is small. Therefore the protective disk 115 is positioned at the lower position of being close to the upper surface of the rotary table 107. A sufficient space enabling the entry of the hand H2 of the center robot CR is thus secured between the height of substrate holding by the movable pins 110 and the upper surface of the protective disk 115.

Also, due to the protective disk 115 being positioned at the lower position, the N pole portions 211 at the upper end sides of the first open/close switching permanent magnets 210A approach the first driving permanent magnets 156A and the S pole portions 212 at the upper end sides of the second open/close switching permanent magnets 210B approach the second driving permanent magnets 156B. In this state, both the three movable pins 110 included in the first movable pin group 111 and the three movable pins 110 included in the second movable pin group 112, that is, all of the six movable pins 110 are disposed at the open position.

Figure 27A:
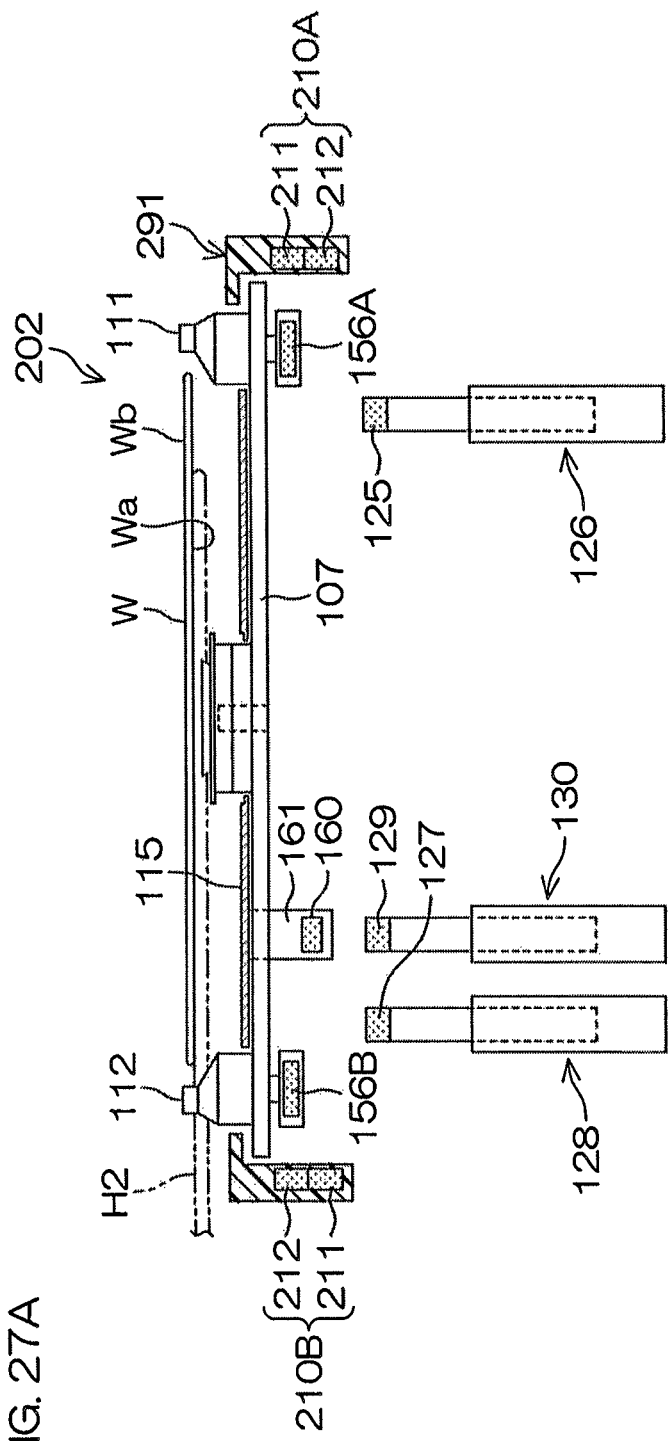

The hand H2 of the center robot CR transfers the substrate W to above the spin chuck 5 in a state of holding the substrate W at a position higher than the upper ends of the movable pins 110. Thereafter, the hand H2 of the center robot CR is lowered toward the upper surface of the rotary table 107 as shown in FIG. 27A. The substrate W is thereby handed over to the six movable pins 110 at the open position. Thereafter, the hand H2 of the center robot CR passes between the movable pins 110 and retracts to the side of the spin chuck 5.

The controller 3 controls the third elevating/lowering unit 130 to elevate the second levitating magnet 129 toward the upper position as shown in FIG. 273. The distance between the levitating magnets 129 and 160 is reduced and the repulsive magnetic force acting therebetween increases accordingly. By the repulsive magnetic force, the protective disk 115 is levitated from the upper surface of the rotary table 107 toward the substrate W. When the first opening permanent magnets 125 reach the upper position, the protective disk 115 reaches the approach position of approaching the front surface Wa (lower surface) of the substrate W across a minute interval and the flange 120 formed at the lower end of the guide shaft 117 contacts the linear bearing 118. The protective disk 115 is thereby held at the approach position.

In accordance with the elevating of the protective disk 115 from the lower position to the approach position, the N pole portions 211 at the upper end sides of the first open/close switching permanent magnets 210A separate from the first driving permanent magnets 156A, and instead the S pole portions 212 at the lower end sides of the first open/close switching permanent magnets 210A approach the first driving permanent magnets 156A. Also in accordance with the elevating of the protective disk 115 from the lower position to the approach position, the S pole portions 212 at the upper end sides of the second open/close switching permanent magnets 210B separate from the second driving permanent magnets 156B, and instead the N pole portions 211 at the lower end sides of the second open/close switching permanent magnets 210B approach the second driving permanent magnets 156B. All movable pins 110 are thereby driven from the open position to the hold position and held at the hold position. The substrate W is thereby gripped by the six movable pins 110 and the substrate W is held by the spin chuck 5 in the state where its front surface Wa is faced downward and its rear surface Wb is faced upward.

Figure 27B:
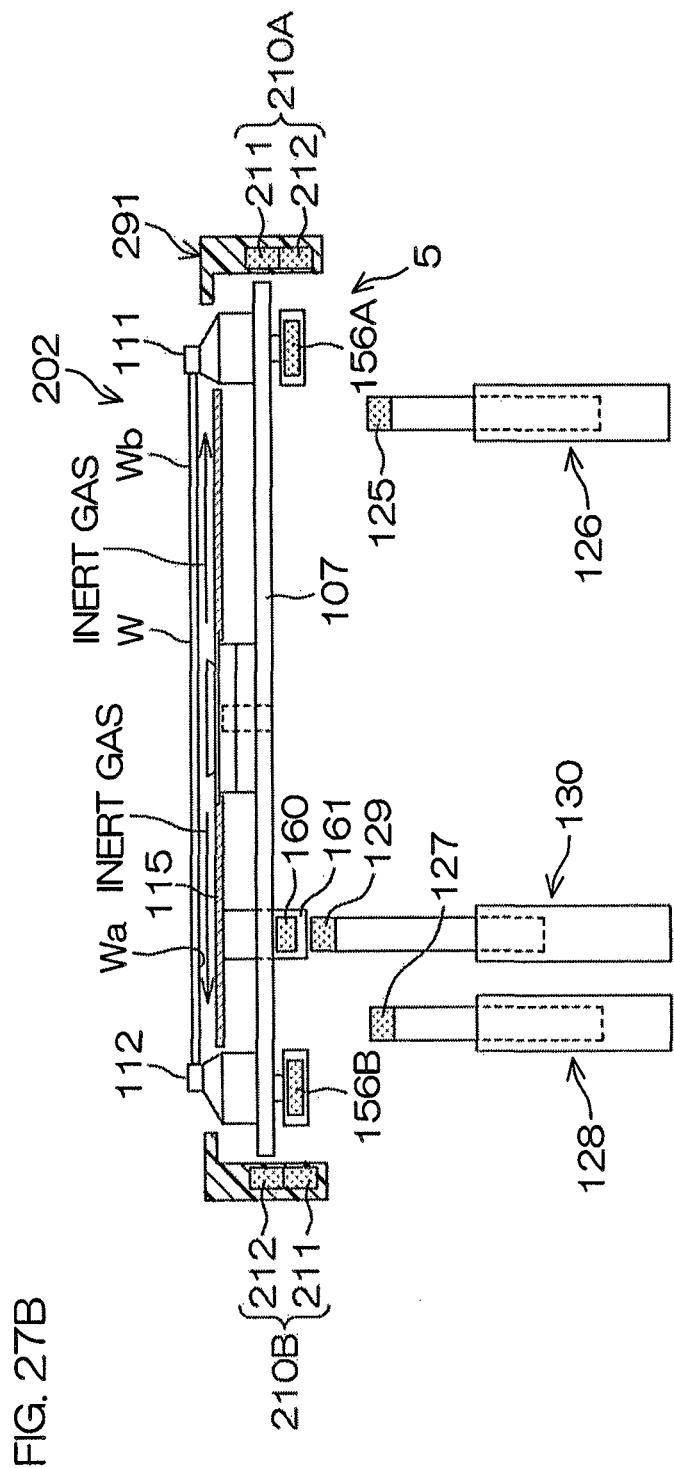
Figure 27C:
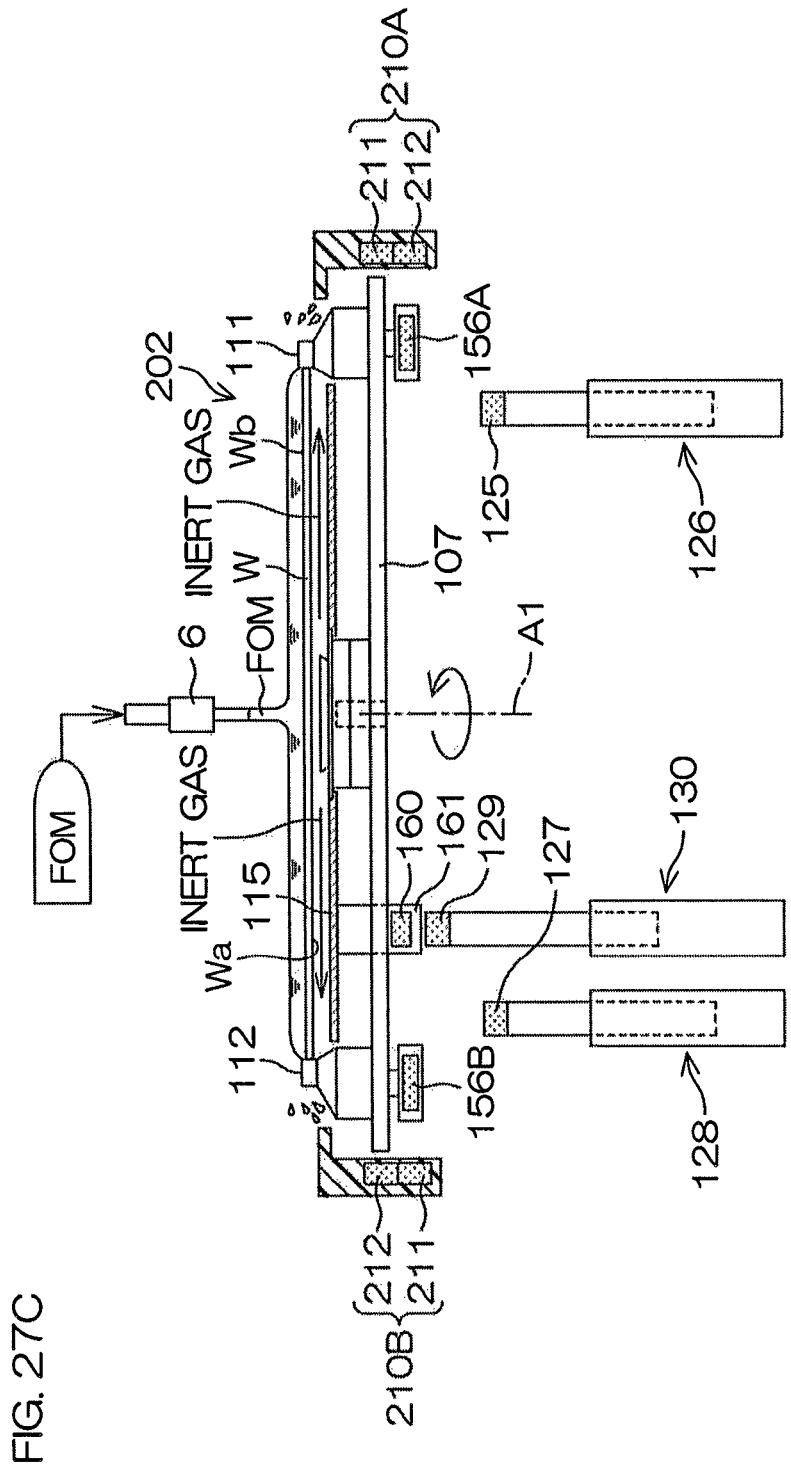

Next, the controller 3 opens the inert gas valve 173 to start supplying the inert gas as shown in FIG. 27B (T4: Start supplying inert gas). Thereafter, the controller 3 controls the rotation driving unit 103 to start the rotation of the rotary table 107 (rotary table rotating step) and the substrate W is thereby rotated around the rotational axis A1 as shown in FIG. 27C (step T5). The processes of steps T4 and T5 are processes respectively equivalent to those of steps S4 and S5 shown in FIG. 17 and description thereof shall thus be omitted.

After the rotation speed of the substrate W has reached the liquid processing speed, the controller 3 performs an FOM supplying step of supplying the FOM to the rear surface Wb of the substrate W (processing liquid supplying step, step T6). Step T6 has the point in common with step S6 shown in FIG. 17 that the supporting of the substrate W by just the first movable pin group 111 and the supporting of the substrate W by just the second movable pin group 112 are performed once or a plurality of times each while supplying the FOM to the rear surface Wb of the substrate W.

Figure 27D:
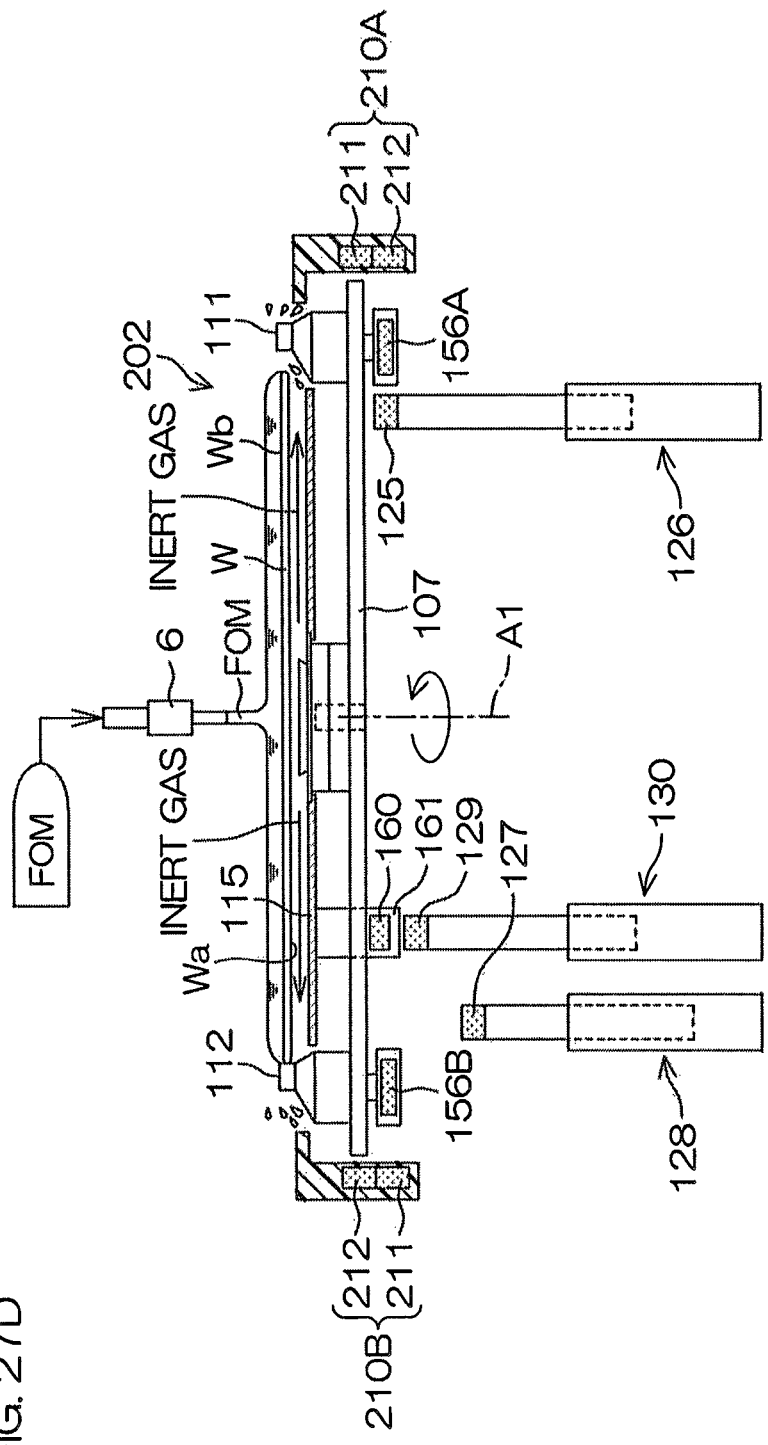
Figure 27E:
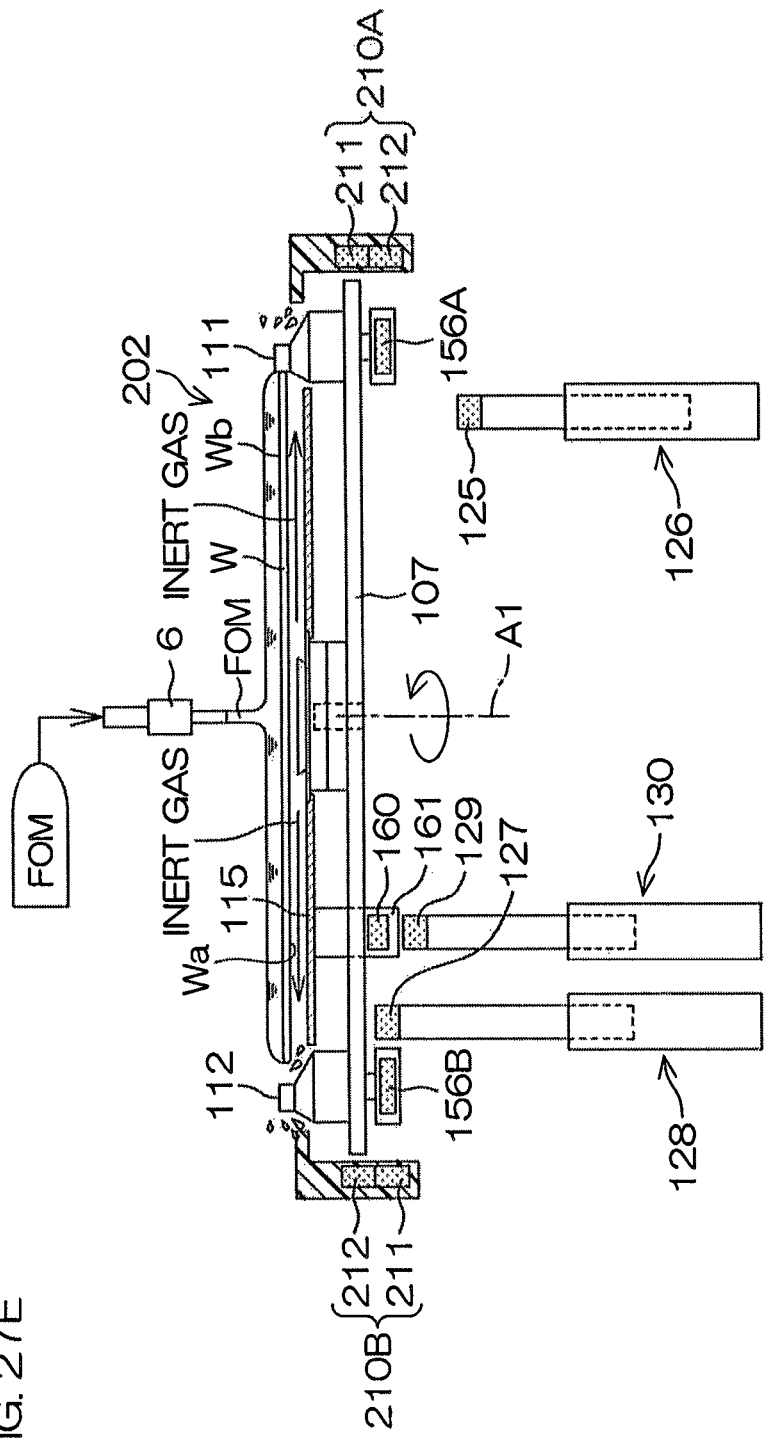
Figure 27G:
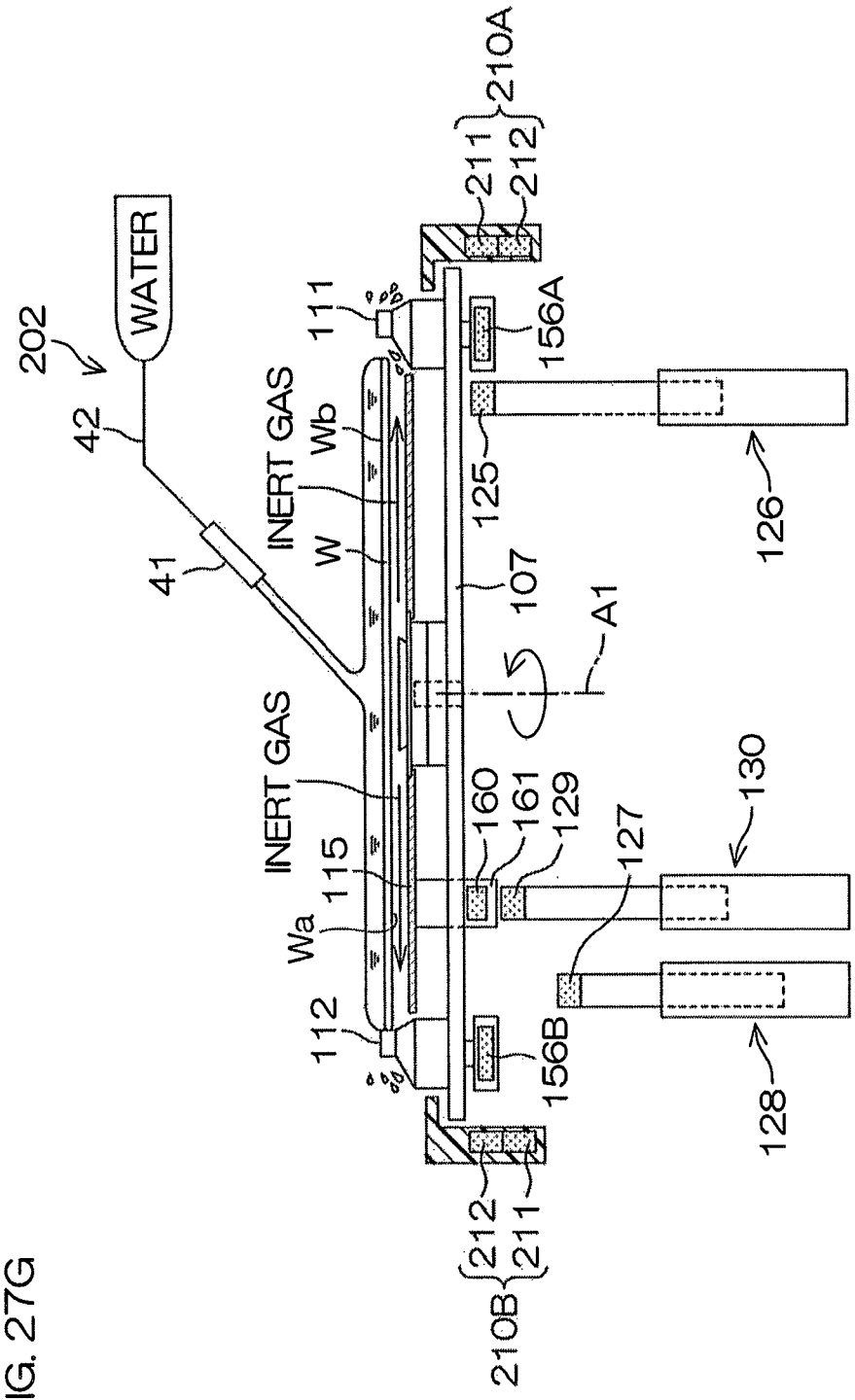
Figure 27H:
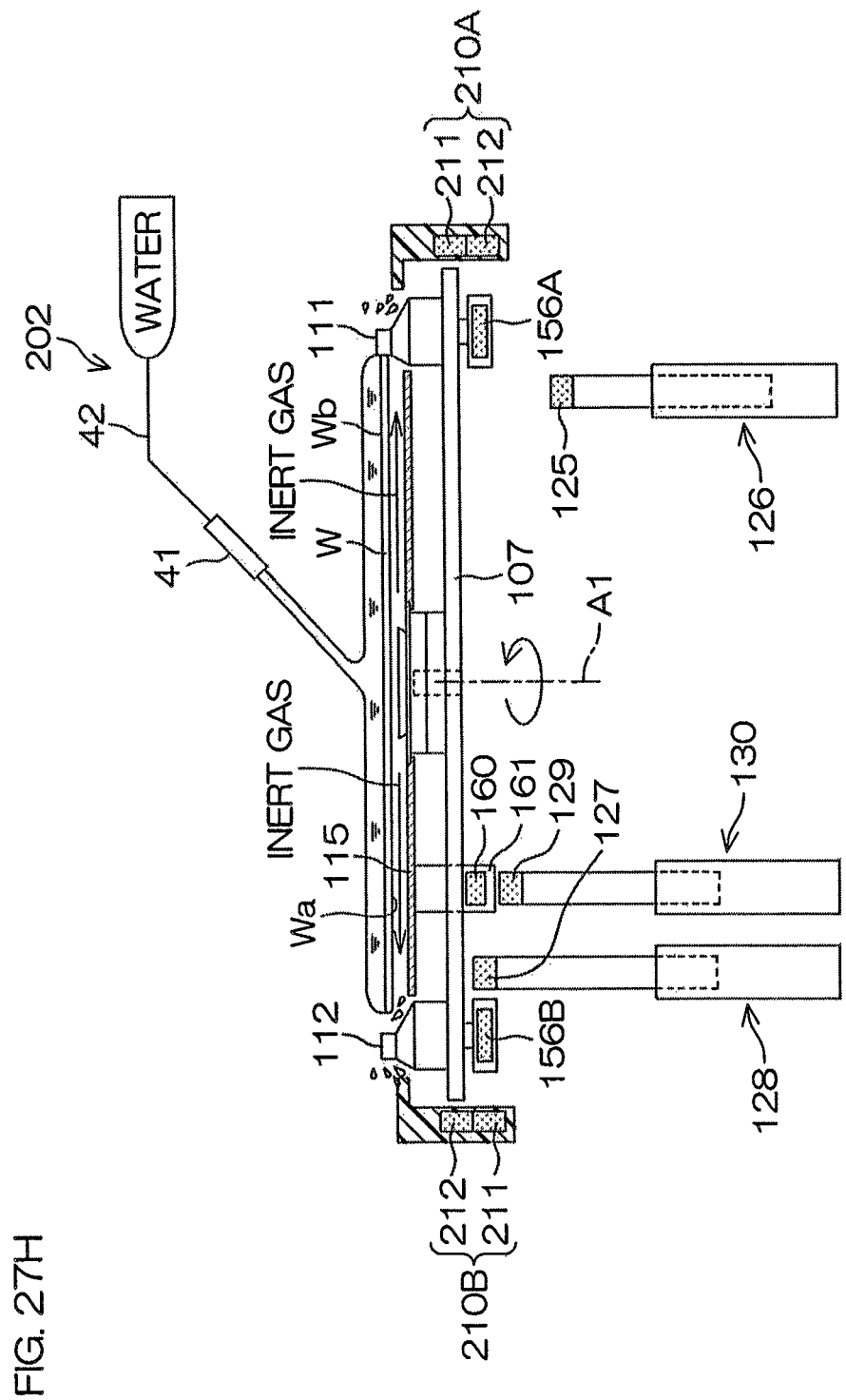
Figure 27I:
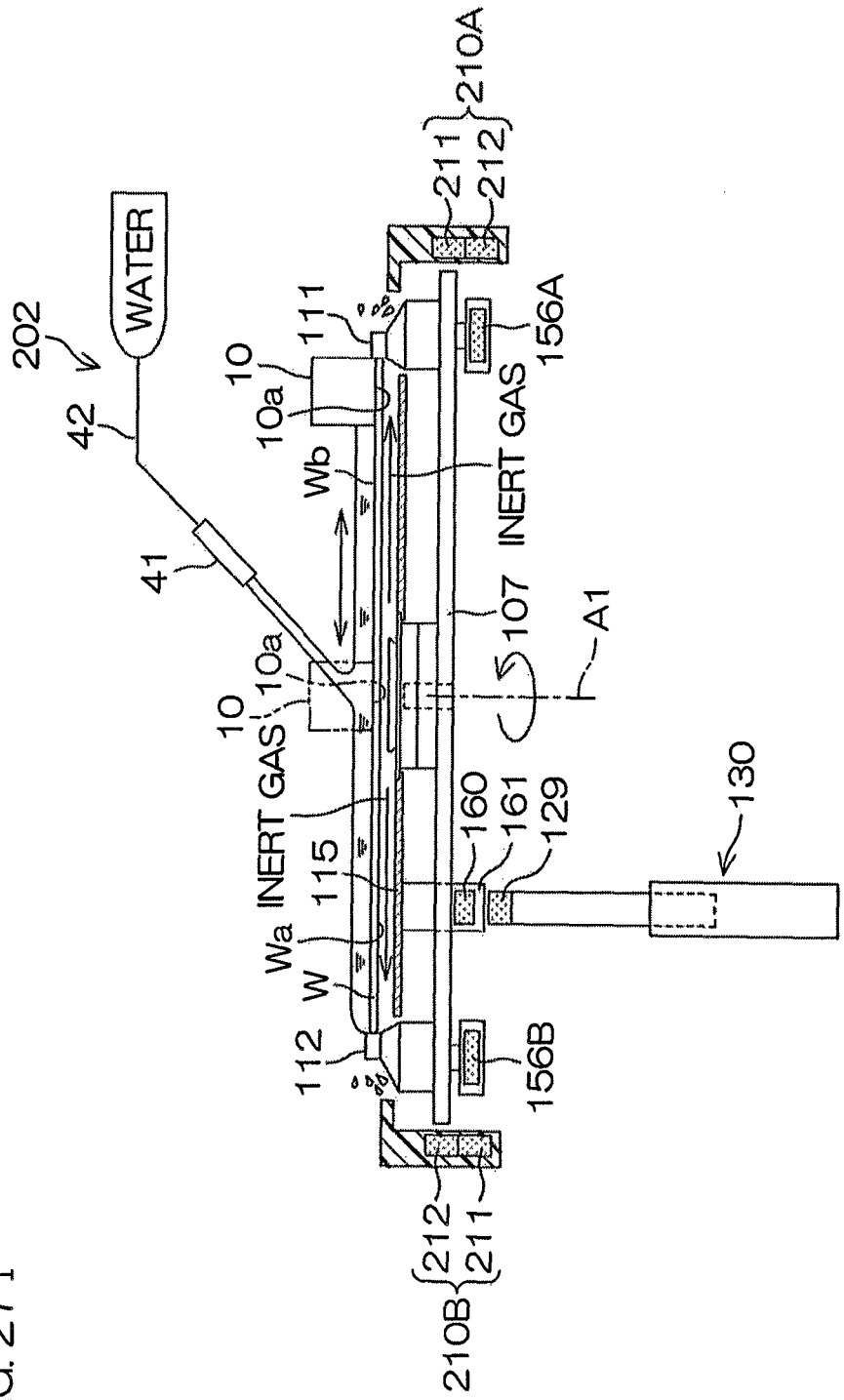

As shown in FIGS. 27C to 27E, the FOM supplying step (T6) is a process equivalent to the FOM supplying step (S6) according to the first preferred embodiment. In a portion of the period of the FOM supplying step (T6), the substrate W is supported, not by six movable pins 110, but by three movable pins 110. Further, switching is performed between the state where the substrate W is contact-supported by the three movable pins 110 included in the first movable pin group 111 and the state where the substrate W is contact-supported by the three movable pins 110 included in the second movable pin group 112.

Specifically, when the substrate W is to be contact-supported by the three movable pins 110 included in the second movable pin group 112, the controller 3 controls the first elevating/lowering unit 126 to elevate the first opening permanent magnets 125, which were at the lower position until then, toward the upper position and dispose these at the upper position as shown in FIG. 27D. In accordance with the elevating of the first opening permanent magnets 125, the upper surfaces of the first opening permanent magnets 125 approach the first driving permanent magnets 156A. An attractive magnetic force is thereby generated at the first driving permanent magnets 156A and an attractive force is generated between the first driving permanent magnets 156A and the first opening permanent magnets 125. In the state where the first opening permanent magnets 125 are disposed at the upper position, the magnitude of the attractive magnetic force acting on the first driving permanent magnets 156A greatly surpasses the attractive force from the S pole portions 212 at the lower end sides of the first open/close switching permanent magnets 210A, and the upper shaft portions 152 thereby move from the hold position that has approached the rotational axis A1 to the open position of being separated from the rotational axis A1 (see FIG. 2). The three movable pins 110 included in the first movable pin group 111 are thereby disposed at the open position from the hold position up to then. Consequently, a state is entered in which the substrate W is contact-supported by the three movable pins 110 included in the second movable pin group 112 (first magnet disposing step).

Also, when the substrate W is to be contact-supported by the three movable pins 110 included in the first movable pin group 111, the controller 3 controls the second elevating/lowering unit 128 to elevate the second opening permanent magnets 127, which were at the lower position until then, toward the upper position and dispose these at the upper position as shown in FIG. 27E. In accordance with the elevating of the second opening permanent magnets 127, the upper surfaces of the second opening permanent magnets 127 approach the second driving permanent magnets 156B. An attractive magnetic force is thereby generated at the second driving permanent magnets 156B and an attractive force is generated between the second driving permanent magnets 156B and the second opening permanent magnets 127. In the state where the second opening permanent magnets 127 are disposed at the upper position, the magnitude of the attractive magnetic force acting on the second driving permanent magnets 156B greatly surpasses the attractive force from the N pole portions 211 at the lower end sides of the second open/close switching permanent magnets 210B, and the upper shaft portions 152 thereby move from the hold position that has approached the rotational axis A1 to the open position of being separated from the rotational axis A1 (see FIG. 2). The three movable pins 110 included in the second movable pin group 112 are thereby disposed at the open position from the hold position up to then. Consequently, a state is entered in which the substrate W is contact-supported by the three movable pins 110 included in the first movable pin group 111 (second magnet disposing step).

When a prescribed period elapses from the start of discharge of FOM, the FOM supplying step (T6) ends. Specifically, the controller 3 closes the chemical liquid valve 15 to stop the discharge of the FOM from the chemical liquid nozzle 6. Also, the controller 3 moves the chemical liquid nozzle 6 from the central position to the home position. The chemical liquid nozzle 6 is thereby retracted from above the substrate W.

Following the end of the FOM supplying step (T6), the supplying of water, which is the rinse liquid, to the rear surface Wb of the substrate W (T7: rinsing step, processing liquid supplying step) is started.

As shown in FIGS. 27F to 27I, a rinsing step (T7), a brush cleaning step (T8), and a final rinsing step (T9) are processes respectively equivalent to the rinsing step (S7), the brush cleaning step (S8), and the final rinsing step (S9) according to the first preferred embodiment. In a portion of the period of the rinsing step (T7), the substrate W is supported, not by six movable pins 110, but by three movable pins 110. Further, switching is performed between the state where the substrate W is contact-supported by the three movable pins 110 included in the first movable pin group 111 and the state where the substrate W is contact-supported by the three movable pins 110 included in the second movable pin group 112.

Specifically, when the substrate W is to be contact-supported by the three movable pins 110 included in the second movable pin group 112, the controller 3 controls the first elevating/lowering unit 126 to elevate the first opening permanent magnets 125, which were at the lower position until then, toward the upper position and dispose these at the upper position as shown in FIG. 27D. In accordance with the elevating of the first opening permanent magnets 125, the upper surfaces of the first opening permanent magnets 125 approach the first driving permanent magnets 156A. An attractive magnetic force is thereby generated at the first driving permanent magnets 156A and an attractive force is generated between the first driving permanent magnets 156A and the first opening permanent magnets 125. In the state where the first opening permanent magnets 125 are disposed at the upper position, the magnitude of the attractive magnetic force acting on the first driving permanent magnets 156A greatly surpasses the attractive force from the S pole portions 212 at the lower end sides of the first open/close switching permanent magnets 210A, and the upper shaft portions 152 thereby move from the hold position of being closer to the rotational axis A1 to the open position of being separated from the rotational axis A1 (see FIG. 2). The three movable pins 110 included in the first movable pin group 111 are thereby disposed at the open position from the hold position up to then. Consequently, a state is entered in which the substrate W is contact-supported by the three movable pins 110 included in the second movable pin group 112 (first magnet disposing step).

Also, when the substrate W is to be contact-supported by the three movable pins 110 included in the first movable pin group 111, the controller 3 controls the second elevating/lowering unit 128 to elevate the second opening permanent magnets 127, which were at the lower position until then, toward the upper position and dispose these at the upper position as shown in FIG. 27E. In accordance with the elevating of the second opening permanent magnets 127, the upper surfaces of the second opening permanent magnets 127 approach the second driving permanent magnets 156B. An attractive magnetic force is thereby generated at the second driving permanent magnets 156B and an attractive force is generated between the second driving permanent magnets 156B and the second opening permanent magnets 127. In the state where the second opening permanent magnets 127 are disposed at the upper position, the magnitude of the attractive magnetic force acting on the second driving permanent magnets 156B greatly surpasses the attractive force from the N pole portions 211 at the lower end sides of the second open/close switching permanent magnets 210B, and the upper shaft portions 152 thereby move from the hold position of being closer to the rotational axis A1 to the open position of being separated from the rotational axis A1 (see FIG. 2). The three movable pins 110 included in the second movable pin group 112 are thereby disposed at the open position from the hold position up to then. Consequently, a state is entered in which the substrate W is contact-supported by the three movable pins 110 included in the first movable pin group 111 (second magnet disposing step).

Figure 27J:
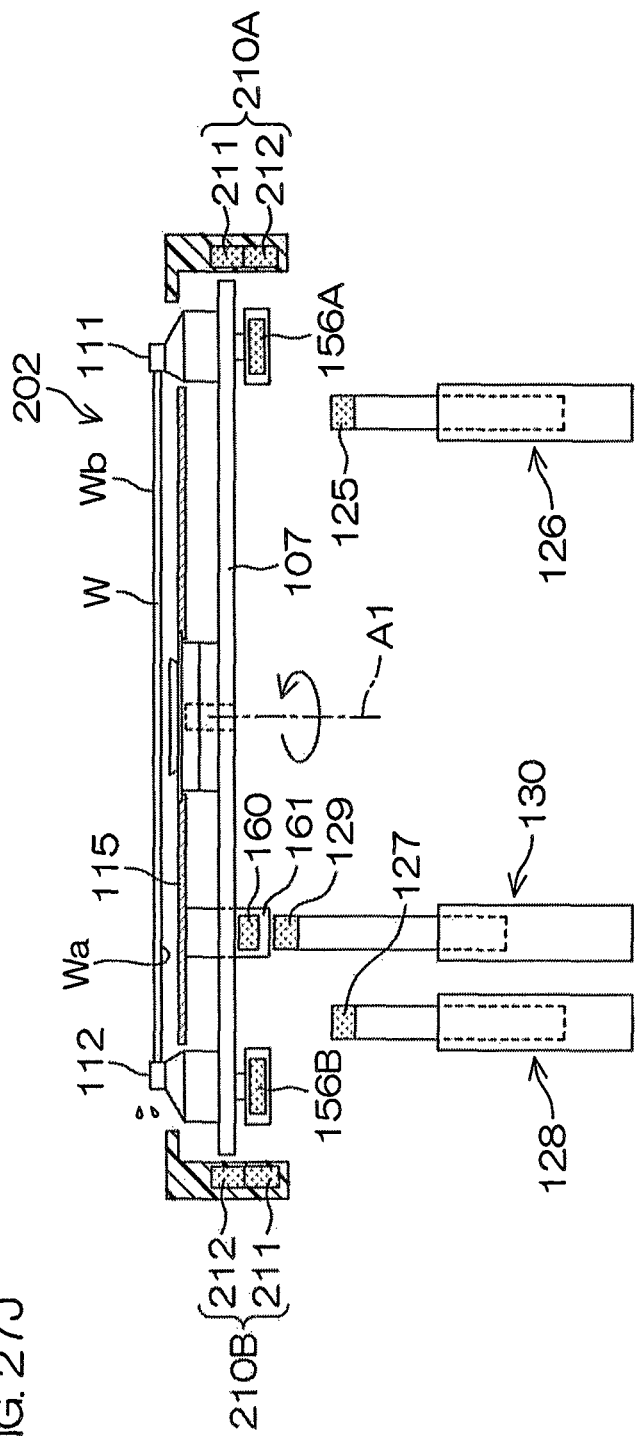

When a prescribed period elapses from the start of discharge of rinse liquid, a spin drying step (step T10) of drying the substrate W is performed next. Specifically, the controller 3 controls the rotation driving unit 17 to accelerate the substrate W to a drying rotation speed (of, for example, several thousand rpm) greater than the rotation speed from the FOM supplying step (T6) to the final rinsing step (T9) and rotate the substrate W at the drying rotation speed as shown in FIG. 27J. A large centrifugal force is thereby applied to the liquid on the substrate W and the liquid attached to the substrate W is spun off to the periphery of the substrate W. The liquid is thereby removed from the substrate W and the substrate W dries. In this process, the substrate W is gripped by the six movable pins 110 and the substrate W can thus be rotated at high speed while holding the substrate W firmly. In the present preferred embodiment, the spin drying step (T10) is executed with the protective disk 115 being kept disposed at the approach position.

When a prescribed period elapses from the start of high speed rotation of the substrate W, the controller 3 controls the rotation driving unit 17 to stop the rotation of the substrate W by the spin chuck 5 (step T11).

The controller 3 then controls the third elevating/lowering unit 130 to lower the second levitating magnet 129 to the lower position (step T12). The distance between the second levitating magnet 129 and the first levitating magnets 160 is thereby increased and the magnetic repulsive force therebetween decreases. Accordingly, the protective disk 115 is lowered towards the upper surface of the rotary table 107. Enough space enabling the entry of the hand H2 of the center robot CR is thereby secured between the upper surface of the protective disk 115 and the front surface Wa (lower surface) of the substrate W.

Also, in accordance with the lowering of the protective disk 115 from the approach position to the lower position, the S pole portions 212 at the lower end sides of the first open/close switching permanent magnets 210A separate from the first driving permanent magnets 156A, and instead the N pole portions 211 at the upper end sides of the first open/close switching permanent magnets 210A approach the first driving permanent magnets 156A. Also, in accordance with the lowering of the protective disk 115 from the approach position to the lower position, the N pole portions 211 at the lower end sides of the second open/close switching permanent magnets 210B separate from the second driving permanent magnets 156B, and instead the S pole portions 212 at the upper end sides of the second open/close switching permanent magnets 210B approach the second driving permanent magnets 156B. All movable pins 110 are thereby driven from the hold position to the open position and held at the open position. The gripping of the substrate W is thereby released.

Next, the substrate W is carried out from inside the processing chamber 4 (see FIG. 27K, step T13) and the substrate W that has been carried out is turned over by the turnover unit TU (step T14). The processes of the steps T13 and T14 are processes respectively equivalent to those of steps S13 and S14 shown in FIG. 17 and description shall thus be omitted. Thereafter, the cleaning-processed substrate W, in the state where its front surface Wa is faced upward, is housed in a carrier C and transferred from the substrate processing apparatus 1 toward a post-processing apparatus, such as an exposure apparatus, etc.

By the above, the following actions and effects are exhibited by the second preferred embodiment in addition to the actions and effects described in relation to the first preferred embodiment.

That is, the first and second open/close switching permanent magnets 210A and 210B are provided so as to be capable of being elevated and lowered together with the protective disk 115. The open/close switching permanent magnets 210A and 210B are thus elevated and lowered in accordance with the operations of elevating and lowering the protective disk 115 by the third elevating/lowering unit 130. There is thus no need to separately provide an elevating/lowering unit arranged to drive the first and second open/close switching permanent magnets 210A and 210B and simplification of device arrangement and cost reduction can thereby be achieved.

Also, it suffices that the movable pins 110 be at the hold position just during the rotation processing (step T5 to step T11) and do not need to be at the hold position at all times. Also, during the rotation processing (step T5 to step T11), the protective disk 115 is at the approach position. That is, it is necessary for the movable pins 110 to be at the hold position just when the protective disk 115 is at the approach position, and the movable pins 110 may be at the open position when the protective disk 115 is at the lower position. Therefore, in the present preferred embodiment, all movable pins 110 are held at the hold position by the action of the open/close switching permanent magnets 210A and 210B when the protective disk 115 is at the approach position, and all movable pins 110 are held at the open position by the action of the open/close switching permanent magnets 210A and 210B when the protective disk 115 is at the lower position. The movable pins 110 can thereby be opened and closed satisfactorily without compromising the function of the protective disk 115.

Also, by up/down movement of one open/close switching permanent magnet 210A or 210B (a first open/close switching permanent magnet 210A or a second open/close switching permanent magnet 210B), not just the opening operation of the corresponding movable pin 110 but the closing operation of the movable pin 110 is also performed. The number of magnets for opening and closing a pin can thus be reduced in comparison to a case of individually providing a pin opening magnet and a pin closing magnet.

Also in the processing liquid processing example of the second preferred embodiment, the supporting of the substrate W by just the first movable pin group 111 and the supporting of the substrate W by just the second movable pin group 112 are performed once or a plurality of times each while supplying the chemical liquid (FOM) to the substrate W in the FOM supplying step (T6) and the rinsing step (T7). However, such changing of holding of the substrate does not have to be performed in the second preferred embodiment.

As described above, with the present second preferred embodiment, switching between opening and closing the movable pins 110 can be performed by elevating and lowering the protective disk 115 by means of the third elevating/lowering unit 130. Therefore, if changing of holding of the substrate W by the two movable pin groups 111 and 112 is not performed in the substrate processing, the arrangement of the opening permanent magnets 125 and 127 and the closing permanent magnets 121 and 122 may be abolished. Obviously in this case, the arrangement of the first and second elevating/lowering units 126 and 128 is also abolished.

That is, both elevating/lowering operations of the protective disk 115 and opening/closing operations of the movable pins 110 can be performed with just a single elevating/lowering unit (the third elevating/lowering unit 130) and the number of parts can thereby be reduced to achieve cost reduction of the substrate processing apparatus 1.

Also with the present second preferred embodiment, the first and second open/close switching permanent magnets 210A and 210B that are made mutually opposite in magnetic pole direction with respect to the up/down direction are provided because the magnetic pole directions of the first driving permanent magnets 156A and the magnetic pole directions of the second driving permanent magnets 156 differ mutually with respect to the direction orthogonal to the rotational axis. However, in the second preferred embodiment, the magnetic pole directions of the first driving permanent magnets 156A and the magnetic pole directions of the second driving permanent magnets 156B may be matched with respect to the direction orthogonal to the rotational axis, and in this case, the first and second open/close switching permanent magnets 210A and 210B may also be matched with respect to the up/down direction.

Also in the second preferred embodiment, the magnets provided to be capable of being elevated and lowered integrally with the protective disk 115 do not have to be the open/close switching permanent magnets 210A and 210B arranged to switch between opening and closing the movable pins 110 but suffices to be that which performs one of either of the opening operation and the closing operation of the movable pins 110.

Although two preferred embodiments of the present invention have been described above, the invention of the present application may be implemented in yet other modes.

For example, in each of the first and second preferred embodiments, the first opening permanent magnet 125 and the second opening permanent magnet 127 may respectively be arranged in a double circular annular shape coaxial to the rotational axis A1 in plan view. In this case, one of either of the first and second elevated/lowered permanent magnets is disposed to surround an outer periphery of the other. Also in this case, each of the first and second elevated/lowered permanent magnet may be arranged in a shape that is intermittent in the circumferential direction.

Also, although with each of the first and second preferred embodiments, it was described that the magnetic pole directions of the first and second opening permanent magnets 125 and 127 are aligned with the up/down direction, the magnetic pole direction of each first opening permanent magnet 125 may be a direction orthogonal to the rotational axis A3 of a movable pin 110.

Also, although with each of the first and second preferred embodiments, it was described that the driving permanent magnets 156A and 156B are driven by the attractive magnetic force generated between the first opening permanent magnets 125 and the first driving permanent magnets 156A and the attractive magnetic force generated between the second opening permanent magnets 127 and the second driving permanent magnets 156B, arrangements may be made to drive the driving permanent magnets 156A and 156B by a repulsive magnetic force generated between the first opening permanent magnets 125 and the first driving permanent magnets 156A and/or a repulsive magnetic force generated between the second opening permanent magnets 127 and the second driving permanent magnets 156B.

Also, although with each of the first and second preferred embodiments, the first and second closing permanent magnets 121 and 122 were arranged as urging units that urge the driving permanent magnets 156A and 156B to the hold position, springs or other elastic pressing units that urge the driving permanent magnets 156A and 156B to the hold position may be provided in place of the first and second closing permanent magnets 121 and 122.

Also, although with each of the first and second preferred embodiments, the number of movable pins 110 is set to six, the number may six or more. In this case, if the number of movable pins 110 is an even number, the number of movable pins 110 included in the first movable pin group 111 and the number of movable pins 110 included in the second movable pin group 112 can be made the same number as each other and this is desirable from the standpoint of layout. For example, if the number of movable pins 110 is set to eight, the number of movable pins included in each of the movable pin groups 111 and 112 is four and in this case, the number of first opening permanent magnets 125 is also four and of the same number as the number of movable pins 110.

Also, although with each of the first and second preferred embodiments, it was described that the opening permanent magnets 125 and 127 are the elevated/lowered magnets arranged to be capable of being elevated and lowered with respect to the rotary table 107 and the closing permanent magnets 121 and 122 are the urging magnets arranged to be incapable of being elevated and lowered with respect to the rotary table 107, an arrangement that is opposite this may be adopted instead. An elevated/lowered magnet arranged to be capable of being elevated and lowered with respect to the rotary table 107 may be used as a magnet for closing, and an urging magnet arranged to be incapable of being elevated and lowered with respect to the rotary table 107 may be used as a magnet for opening.

For example, although it was described that the processing object surface is the rear surface (non-device-forming surface) Wb of the substrate W, the front surface (device forming surface) Wa of the substrate W may be the processing object surface instead. In this case, the turnover unit TU may be abolished.

Also, with each of the first and second preferred embodiments, the series of processing liquid processing is not restricted to the removal of foreign matter and may instead be for the purpose of removing metal or removing an impurity embedded in a film. Also, the series of processing liquid processing may be an etching processing instead of a cleaning processing.

Also, although with each of the first and second preferred embodiments, FOM is used as the chemical liquid supplied to the substrate W, the chemical liquid is, for example, a liquid that includes at least one of sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH: tetramethylammonium hydroxide, etc.), an organic solvent (for example, IPA: isopropyl alcohol, etc.) a surfactant, and a corrosion inhibitor.

More preferably as the chemical liquid supplied to the substrate W, DHF (dilute hydrofluoric acid), BHF (buffered hydrofluoric acid), SC1 (a liquid containing $NH_4OH$ and $H_2O_2$), FPM (a liquid containing HF and $H_2O_2$), etc., may be used. That is, in place of the FOM supplying step (S6, T6), a chemical liquid supplying step of supplying a chemical liquid including at least one of the chemical liquids given above to the processing object surface of the substrate W may be executed, and as the chemical liquid used in the chemical liquid supplying step, DHF, BHF, SC1, FPM, etc., may be used. In a case where any of these liquids is used as the chemical liquid, the processing object surface of the substrate W is not required to be bare silicon and the processing object surface of the substrate W may include an oxide film (for example, a silicon oxide film) and/or a nitride film (for example, a silicon nitride film).

Also, with each of the first and second preferred embodiments, the brush cleaning step (S8, T8) may be abolished from each of the processing liquid processing described above. In this case, there is no need to perform the final rinsing step (S9, T9) and therefore the final rinsing step (S9, T9) may also be abolished together.

Also, although it was described that the processing object surface is the upper surface of the substrate W, the lower surface of the substrate W may be the processing object surface instead. In this case, the processing liquid is supplied to the lower surface of the substrate W and by allowing flowing around from the lower surface of the substrate W to the upper surface of the substrate W at the substrate support positions at the peripheral edge portion of the substrate W, the peripheral edge portion of the substrate W can be processed using the processing liquid satisfactorily without any unprocessed portions remaining.

Also, although the case where the substrate processing apparatus 1 is an apparatus that processes disk-shaped semiconductor substrates was described, the substrate processing apparatus 1 may be an apparatus that processes substrates of polygonal shape, such as glass substrates for liquid crystal displays, etc.

While preferred embodiments of the present invention have been described in detail above, these are merely specific examples, used to clarify the technical contents of the present invention, and the present invention should not be interpreted as being limited to these specific examples, and the scope of the present invention shall be limited only by the appended claims.

The present application corresponds to each of Japanese Patent Application No. 2015-192155 filed on Sep. 29, 2015 in the Japan Patent Office and Japanese Patent Application No. 2016-30154 filed on Feb. 19, 2016 in the Japan Patent Office, and the entire disclosures of these applications are incorporated herein by reference.

The invention claimed is:
1. A substrate holding/rotating device comprising:
a rotary table;
a rotation driving unit that rotates the rotary table around a rotational axis aligned with a vertical direction; and
a plurality of movable pins that supports a substrate horizontally, each of the movable pins having a support portion movable between an open position that is far apart from the rotational axis and a hold position that has approached the rotational axis, the plurality of movable pins being arranged to rotate around the rotational axis together with the rotary table,
the plurality of movable pins including a first movable pin group including at least three movable pins, and a second movable pin group including at least three movable pins other than the movable pins belonging to the first movable pin group,
the substrate holding/rotating device further comprising:
an urging unit that urges the support portion of each of the movable pins to one of the open position and the hold position;
first driving magnets, mounted in correspondence to the respective movable pins of the first movable pin group, having magnetic pole directions orthogonal to the rotational axis and mutually equal with respect to the rotational axis;
second driving magnets, mounted in correspondence to the respective movable pins of the second movable pin group, having magnetic pole directions orthogonal to the rotational axis and opposite those of the first driving magnets with respect to the rotational axis;
a first moving magnet, arranged in a non-rotating state, having a magnetic pole direction such as to apply a repulsive force or an attractive force to the first driving magnets along directions orthogonal to the rotational axis, and, by the repulsive force or the attractive force, urging the support portions of the first movable pin group to the other of the open position and the hold position;
a second moving magnet, arranged in a non-rotating state, having a magnetic pole direction such as to apply a repulsive force or an attractive force to the second driving magnets along directions orthogonal to the rotational axis, and, by the repulsive force or the attractive force, urging the support portions of the second movable pin group to the other of the open position and the hold position;
a first relative movement unit that makes the first moving magnet and the rotary table move relatively between a first position, at which the first moving magnet applies the repulsive force or the attractive force to the first driving magnets, and a second position, at which the first moving magnet does not apply the repulsive force or the attractive force to the first driving magnets; and
a second relative movement unit that makes the second moving magnet and the rotary table move relatively between a third position, at which the second moving magnet applies the repulsive force or the attractive force to the second driving magnets, and a fourth position, at which the second moving magnet does not apply the repulsive force or the attractive force to the second driving magnets, independently of the relative movement of the first moving magnet and the rotary table.

2. The substrate holding/rotating device according to claim 1, wherein each of the first and second moving magnets forms, in a state where the first or second moving magnet is at the first or third position and the rotary table is in the rotating state, a magnetic field generation region of circular annular shape, which is coaxial to the rotational axis and through which the respective movable pins, rotating in accordance with the rotation of the rotary table, can pass.

3. The substrate holding/rotating device according to claim 2, wherein pluralities of mutually the same number of the first and second moving magnets respectively are provided, and the first moving magnets and the second moving magnets are disposed alternately with respect to a circumferential direction of the rotary table so as to form a circular annular shape coaxial to the rotational axis as a whole in plan view.

4. The substrate holding/rotating device according to claim 3, wherein the first movable pin group and the second movable pin group respectively include mutually the same number of the movable pins, the movable pins of the first movable pin group and the movable pins of the second movable pin group are disposed alternately with respect to the circumferential direction of the rotary table such that the plurality of movable pins included in each of the movable pin group are disposed at equal intervals, and the first and second moving magnets are respectively disposed to be of the same number as the number of the movable pins included in the respective first and second movable pin groups and at equal intervals in the circumferential direction of the rotary table.

5. The substrate holding/rotating device according to claim 2, wherein the first moving magnet and the second moving magnet are disposed in a double circular annular shape in plan view that is coaxial to the rotational axis.

6. The substrate holding/rotating device according to claim 1, wherein the urging unit includes
a first urging magnet that urges the support portions of the first movable pin group to the one of the open position and the hold position by applying a repulsive force or an attractive force to the first driving magnet, and
a second urging magnet that urges the support portions of the second movable pin group to the one of the open position and the hold position by applying a repulsive force or an attractive force to the second driving magnet.

7. The substrate holding/rotating device according to claim 6, wherein the first and second urging magnets are arranged to be incapable of relative movement with respect to the rotary table.

8. The substrate holding/rotating device according to claim 6, further comprising: a protective disk mounted to the rotary table so as to rotate around the rotational axis together with the rotary table, the protective disk being disposed between the rotary table and a position of substrate holding by the plurality of movable pins such that the protective disk is capable of relative up/down movement with respect to the rotary table between a lower position and an approach position approaching a lower surface of the substrate held higher than the lower position by the movable pins,
wherein the first and second urging magnets are arranged to be moved up and down together with the protective disk.

9. The substrate holding/rotating device according to claim 1, wherein the one of the open position and the hold position is the hold position and
the other of the open position and the hold position is the open position.

10. The substrate holding/rotating device according to claim 1, further comprising:
a protective disk mounted to the rotary table so as to rotate around the rotational axis together with the rotary table, the protective disk being disposed between the rotary table and a position of substrate holding by the plurality of movable pins such that the protective disk is capable of relative up/down movement with respect to the rotary table between a lower position and an approach position approaching a lower surface of the substrate held higher than the lower position by the movable pins;
a first levitating magnet mounted to the protective disk;
a second levitating magnet, arranged in a non-rotating state, applying a repulsive force to the first levitating magnet; and
a third relative movement unit which makes the second levitating magnet and the rotary table move relatively to change a distance between the first levitating magnet and the second levitating magnet independently of the relative movement of the first moving magnet and the rotary table and the relative movement of the second moving magnet and the rotary table.

11. A substrate processing apparatus comprising:
the substrate holding/rotating device according to claim 1; and
a processing liquid supplying unit that supplies a processing liquid to a major surface of a substrate held by the substrate holding/rotating device.

12. The substrate processing apparatus according to claim 11, further comprising: a controller that is programmed to control the rotation driving unit, the processing liquid supplying unit, the first relative movement unit, and the second relative movement unit;
wherein the controller is programmed to execute
a rotary table rotating step of making the rotary table rotate around the rotational axis,
a processing liquid supplying step of supplying the processing liquid to the substrate rotating in accordance with the rotation of the rotary table,
a first magnet disposing step of disposing the relative position of the first moving magnet and the rotary table at the first position and disposing the relative position of the second moving magnet and the rotary table at the fourth position concurrently with the rotary table rotating step and the processing liquid supplying step, and
a second magnet disposing step of disposing the relative position of the second moving magnet and the rotary table at the third position and disposing the relative position of the first moving magnet and the rotary table at the second position, during non-execution of the first magnet disposing step, concurrently with the rotary table rotating step and the processing liquid supplying step.

13. The substrate holding/rotating device according to claim 1, wherein the magnetic pole direction of the second moving magnet is opposite the magnetic pole direction of the first moving magnet with respect to the rotational axis.

14. A substrate holding/rotating device comprising:
a rotary table;
a rotation driving unit that rotates the rotary table around a rotational axis aligned with a vertical direction; and
a plurality of movable pins that supports a substrate horizontally, each of the movable pins having a support portion movable between an open position that is far apart from the rotational axis and a hold position that has approached the rotational axis, the plurality of movable pins being arranged to rotate around the rotational axis together with the rotary table,
the plurality of movable pins including a first movable pin group including at least three movable pins, and a second movable pin group including at least three movable pins other than the movable pins belonging to the first movable pin group, the substrate holding/rotating device further comprising:

an urging unit that urges the support portion of each of the movable pins to one of the open position and the hold position;

first driving magnets, mounted in correspondence to the respective movable pins of the first movable pin group, having magnetic pole directions orthogonal to the rotational axis and mutually equal with respect to the rotational axis;

second driving magnets, mounted in correspondence to the respective movable pins of the second movable pin group, having magnetic pole directions orthogonal to the rotational axis and opposite those of the first driving magnets with respect to the rotational axis;

a first moving magnet, arranged in a non-rotating state, having a magnetic pole direction such as to apply a repulsive force or an attractive force to the first driving magnets along directions orthogonal to the rotational axis, and, by the repulsive force or the attractive force, urging the support portions of the first movable pin group to the other of the open position and the hold position;

a second moving magnet, arranged in a non-rotating state, having a magnetic pole direction such as to apply a repulsive force or an attractive force to the second driving magnets along directions orthogonal to the rotational axis, and, by the repulsive force or the attractive force, urging the support portions of the second movable pin group to the other of the open position and the hold position;

a first relative movement unit that makes the first moving magnet and the rotary table move relatively between a first position, at which the first moving magnet applies the repulsive force or the attractive force to the first driving magnets, and a second position, at which the first moving magnet does not apply the repulsive force or the attractive force to the first driving magnets; and a second relative movement unit that makes the second moving magnet and the rotary table move relatively between a third position, at which the second moving magnet applies the repulsive force or the attractive force to the second driving magnets, and a fourth position, at which the second moving magnet does not apply the repulsive force or the attractive force to the second driving magnets, independently of the relative movement of the first moving magnet and the rotary table wherein the relative movement of the first moving magnet and the rotary table between the first position and the second position causes the first driving magnet to rotate by a magnetic force of the first moving magnet, and the relative movement of the second moving magnet and the rotary table between the third position and the fourth position causes the second driving magnet to rotate by a magnetic force of the second moving magnet.

15. The substrate holding/rotating device according to claim 14, wherein each of the first and second moving magnets forms, in a state where the first or second moving magnet is at the first or third position and the rotary table is in the rotating state, a magnetic field generation region of circular annular shape, which is coaxial to the rotational axis and through which the respective movable pins, rotating in accordance with the rotation of the rotary table, can pass.

16. The substrate holding/rotating device according to claim 14, wherein pluralities of mutually the same number of the first and second moving magnets respectively are provided, and the first moving magnets and the second moving magnets are disposed alternately with respect to a circumferential direction of the rotary table so as to form a circular annular shape coaxial to the rotational axis as a whole in plan view.

17. The substrate holding/rotating device according to claim 14, wherein the first moving magnet and the second moving magnet are disposed in a double circular annular shape in plan view that is coaxial to the rotational axis.

* * * * *